(12) United States Patent
Okamoto et al.

(10) Patent No.: US 9,912,897 B2
(45) Date of Patent: Mar. 6, 2018

(54) IMAGING DEVICE AND ELECTRONIC DEVICE

(71) Applicant: Semiconductor Energy Laboratory Co., Ltd., Atsugi-shi, Kanagawa-ken (JP)

(72) Inventors: Yuki Okamoto, Kanagawa (JP); Seiichi Yoneda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/149,289

(22) Filed: May 9, 2016

(65) Prior Publication Data
US 2016/0337607 A1    Nov. 17, 2016

(30) Foreign Application Priority Data

May 11, 2015    (JP) ................. 2015-096202

(51) Int. Cl.
*H04N 5/378* (2011.01)
*H04N 5/3745* (2011.01)
(Continued)

(52) U.S. Cl.
CPC ......... *H04N 5/378* (2013.01); *H01L 27/1464* (2013.01); *H01L 27/14623* (2013.01);
(Continued)

(58) Field of Classification Search
CPC .... H04N 5/378; H04N 5/3765; H04N 5/3742; H04N 5/37455; H04N 5/37457;
(Continued)

(56) References Cited

U.S. PATENT DOCUMENTS

2001/0033336 A1\* 10/2001 Kameshima ......... H04N 3/1512
348/300
2007/0072439 A1    3/2007 Akimoto et al.
(Continued)

FOREIGN PATENT DOCUMENTS

JP        11-118729 A    4/1999
JP        2007-096055 A    4/2007
(Continued)

OTHER PUBLICATIONS

Funatsu.R et al., "133Mpixel 60fps CMOS Image Sensor with 32-Column Shared High-Speed Column-Parallel SAR ADCs", ISSCC 2015 (Digest of Technical Papers, IEEE International Solid-State Circuits Conference), Feb. 23, 2015, pp. 112-113.

*Primary Examiner* — Mekonnen Dagnew
(74) *Attorney, Agent, or Firm* — Fish & Richardson P.C.

(57) ABSTRACT

An imaging device in which signals can be read out accurately at high speed is provided. The imaging device includes a plurality of pixels arranged in a matrix, an A/D converter circuit, and a selector circuit. The pixels are electrically connected to an input terminal of the A/D converter circuit. An output terminal of the A/D converter circuit is electrically connected to one of a source and a drain of a transistor. The other of the source and the drain of the transistor is electrically connected to an input terminal of the selector circuit. The transistor includes an oxide semiconductor in an active layer. Other embodiments are described and claimed.

19 Claims, 56 Drawing Sheets

(51) Int. Cl.
    *H04N 5/374*    (2011.01)
    *H04N 5/376*    (2011.01)
    *H01L 29/786*   (2006.01)
    *H01L 29/24*     (2006.01)
    *H01L 31/0272*  (2006.01)
    *H01L 31/032*   (2006.01)
    *H01L 27/146*   (2006.01)
    *H01L 27/12*    (2006.01)

(52) U.S. Cl.
    CPC .. *H01L 27/14632* (2013.01); *H01L 27/14634* (2013.01); *H01L 27/14645* (2013.01); *H01L 27/14696* (2013.01); *H01L 29/24* (2013.01); *H01L 29/7869* (2013.01); *H01L 31/0272* (2013.01); *H01L 31/0322* (2013.01); *H04N 5/3742* (2013.01); *H04N 5/3765* (2013.01); *H04N 5/37455* (2013.01); *H04N 5/37457* (2013.01); *H01L 27/1225* (2013.01); *H01L 27/1255* (2013.01); *H01L 27/14621* (2013.01); *H01L 27/14627* (2013.01)

(58) Field of Classification Search
    CPC ........... H01L 27/1464; H01L 27/14634; H01L 27/14632; H01L 27/14696; H01L 27/14645; H01L 27/14623; H01L 29/24; H01L 29/7869
    See application file for complete search history.

(56) References Cited

U.S. PATENT DOCUMENTS

| | | |
|---|---|---|
| 2011/0108836 A1 | 5/2011 | Koyama et al. |
| 2013/0015326 A1* | 1/2013 | Tamura ............ H01L 27/14612 250/208.1 |
| 2013/1022258 | 8/2013 | Aoki et al. |

FOREIGN PATENT DOCUMENTS

| | | |
|---|---|---|
| JP | 2007-123861 A | 5/2007 |
| JP | 2011-119711 A | 6/2011 |

* cited by examiner

FIG. 36A1
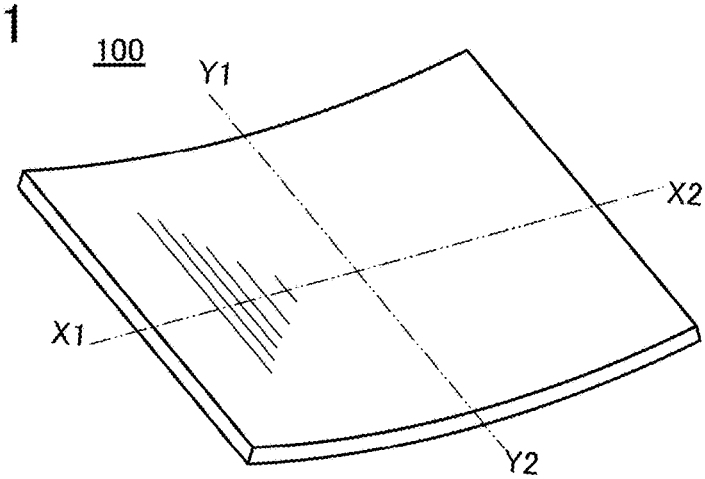
FIG. 36A2
FIG. 36A3
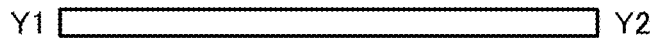
FIG. 36B1
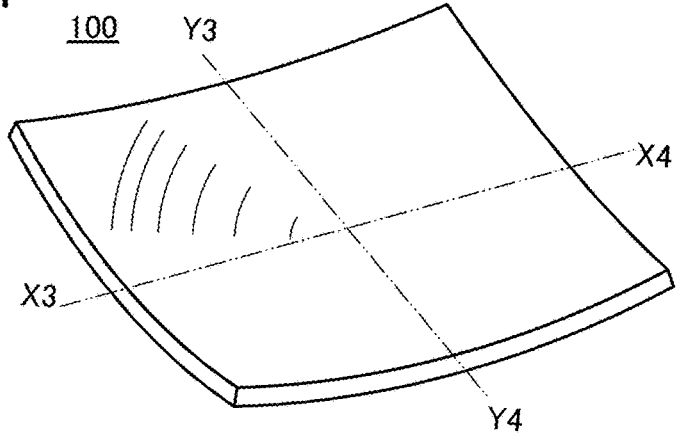
FIG. 36B2
FIG. 36B3
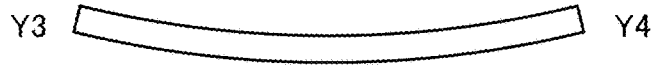

IMAGING DEVICE AND ELECTRONIC DEVICE

BACKGROUND OF THE INVENTION

1. Field of the Invention

One embodiment of the present invention relates to an imaging device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

2. Description of the Related Art

As a semiconductor material applicable to a transistor, an oxide semiconductor has been attracting attention. For example, a technique for forming a transistor using zinc oxide or an In—Ga—Zn-based oxide semiconductor as an oxide semiconductor is disclosed (see Patent Documents 1 and 2).

Patent Document 3 discloses an imaging device in which a transistor including an oxide semiconductor is used in part of a pixel circuit.

Non-Patent Document 1 discloses a technique relating to a complementary metal oxide semiconductor (CMOS) image sensor with one hundred and thirty-three million pixels corresponding to 8K4K imaging.

REFERENCES

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2011-119711

Non-Patent Document

[Non-Patent Document 1] R. Funatsu, et al., 133 *Mpixel* 60 *fps CMOS Image Sensor with* 32-*Column Shared High-Speed Column Parallel SAR ADCs*, IEEE ISSCC Dig. Tech. Papers, 2015

SUMMARY OF THE INVENTION

In an imaging device with pixels arranged in a matrix, the volume of data processed in one frame period is increased with an increase in the number of pixels. That is, the length of time for reading imaging data in the pixels per row is shortened.

Since the length of time for reading imaging data is shortened, a row driver, a column driver, an A/D converter circuit, and the like in the imaging device need to operate at high speed. Furthermore, the qualities of signals need to be maintained without collision between the signals sequentially output from the A/D converter circuit.

In view of the above, an object of one embodiment of the present invention is to provide an imaging device in which signals can be read out accurately at high speed. Another object is to provide an imaging device in which collision between signals sequentially output from an A/D converter circuit can be prevented. Another object is to provide an imaging device with low power consumption. Another object is to provide an imaging device with high resolution. Another object is to provide a highly integrated imaging device. Another object is to provide an imaging device capable of imaging under a low illuminance condition. Another object is to provide an imaging device with a wide dynamic range. Another object is to provide an imaging device that can be used in a wide temperature range. Another object is to provide an imaging device with a high aperture ratio. Another object is to provide an imaging device with high reliability. Another object is to provide a novel imaging device or the like. Another object is to provide a novel semiconductor device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to an imaging device in which a signal output from an A/D converter circuit is read out through a selector circuit.

Another embodiment of the present invention is an imaging device including a plurality of pixels arranged in a matrix, an A/D converter circuit, and a selector circuit. The pixels are electrically connected to an input terminal of the A/D converter circuit. An output terminal of the A/D converter circuit is electrically connected to one of a source and a drain of a transistor. The other of the source and the drain of the transistor is electrically connected to an input terminal of the selector circuit. The transistor includes an oxide semiconductor in an active layer.

The output terminal of the A/D converter circuit may be electrically connected to an input terminal of a buffer circuit. An output terminal of the buffer circuit may be electrically connected to the one of the source and the drain of the transistor.

Another embodiment of the present invention is an imaging device including a plurality of pixels arranged in a matrix, a first A/D converter circuit, a second A/D converter circuit, and a selector circuit. The pixels arranged in odd-numbered columns are electrically connected to an input terminal of the first A/D converter circuit. The pixels arranged in even-numbered columns are electrically connected to an input terminal of the second A/D converter circuit. An output terminal of the first A/D converter circuit is electrically connected to one of a source and a drain of a first transistor. An output terminal of the second A/D converter circuit is electrically connected to one of a source and a drain of a second transistor. The other of the source and the drain of the first transistor is electrically connected to a first input terminal of the selector circuit. The other of the source and the drain of the second transistor is electrically connected to a second input terminal of the selector circuit. The first transistor and the second transistor each include an oxide semiconductor in an active layer.

The oxide semiconductor preferably contains In, Zn, and M (M is Al, Ti, Ga, Sn, Y, Zr, La, Ce, Nd, or Hf).

The output terminal of the first A/D converter circuit may be electrically connected to an input terminal of a first buffer circuit. An output terminal of the first buffer circuit may be electrically connected to the one of the source and the drain of the first transistor. The output terminal of the second A/D converter circuit may be electrically connected to an input terminal of a second buffer circuit. An output terminal of the second buffer circuit may be electrically connected to the one of the source and the drain of the second transistor.

The selector circuit is configured to alternately output a signal input to the first input terminal and a signal input to the second input terminal.

Each of the plurality of pixels may include a third transistor, a fourth transistor, a fifth transistor, a sixth transistor, a capacitor, and a photoelectric conversion element. One of electrodes of the photoelectric conversion element is electrically connected to one of a source electrode and a drain electrode of the third transistor. The other of the source electrode and the drain electrode of the third transistor is electrically connected to one of a source electrode and a drain electrode of the fourth transistor. The other of the source electrode and the drain electrode of the third transistor is electrically connected to one of electrodes of the capacitor. The other of the source electrode and the drain electrode of the third transistor is electrically connected to a gate electrode of the fifth transistor. One of a source electrode and a drain electrode of the fifth transistor is electrically connected to one of a source electrode and a drain electrode of the sixth transistor.

The third transistor, the fourth transistor, the fifth transistor, and the sixth transistor preferably each include an oxide semiconductor in an active layer. The oxide semiconductor preferably contains In, Zn, and M (M is Al, Ti, Ga, Sn, Y, Zr, La, Ce, Nd, or Hf).

For a photoelectric conversion layer of the photoelectric conversion element, selenium or a compound containing selenium can be used. For example, amorphous selenium or crystalline selenium can be used as selenium.

According to one embodiment of the present invention, an imaging device in which signals can be read out accurately at high speed can be provided. According to one embodiment of the present invention, an imaging device in which collision between signals sequentially output from an A/D converter circuit is prevented can be provided. According to one embodiment of the present invention, an imaging device with low power consumption can be provided. According to one embodiment of the present invention, an imaging device with high resolution can be provided. According to one embodiment of the present invention, a highly integrated imaging device can be provided. According to one embodiment of the present invention, an imaging device capable of imaging under a low illuminance condition can be provided. According to one embodiment of the present invention, an imaging device with a wide dynamic range can be provided. According to one embodiment of the present invention, an imaging device that can be used in a wide temperature range can be provided. According to one embodiment of the present invention, an imaging device with a high aperture ratio can be provided. According to one embodiment of the present invention, an imaging device with high reliability can be provided. According to one embodiment of the present invention, a novel imaging device or the like can be provided. According to one embodiment of the present invention, a method for driving any of the imaging devices can be provided. According to one embodiment of the present invention, a novel semiconductor device or the like can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce the above effects.

BRIEF DESCRIPTION OF THE DRAWINGS

FIGS. 36A1, 36A2, 36A3, 36B1, 36B2, and 36B3 illustrate bent imaging devices.

DETAILED DESCRIPTION OF THE INVENTION

Figure 1:
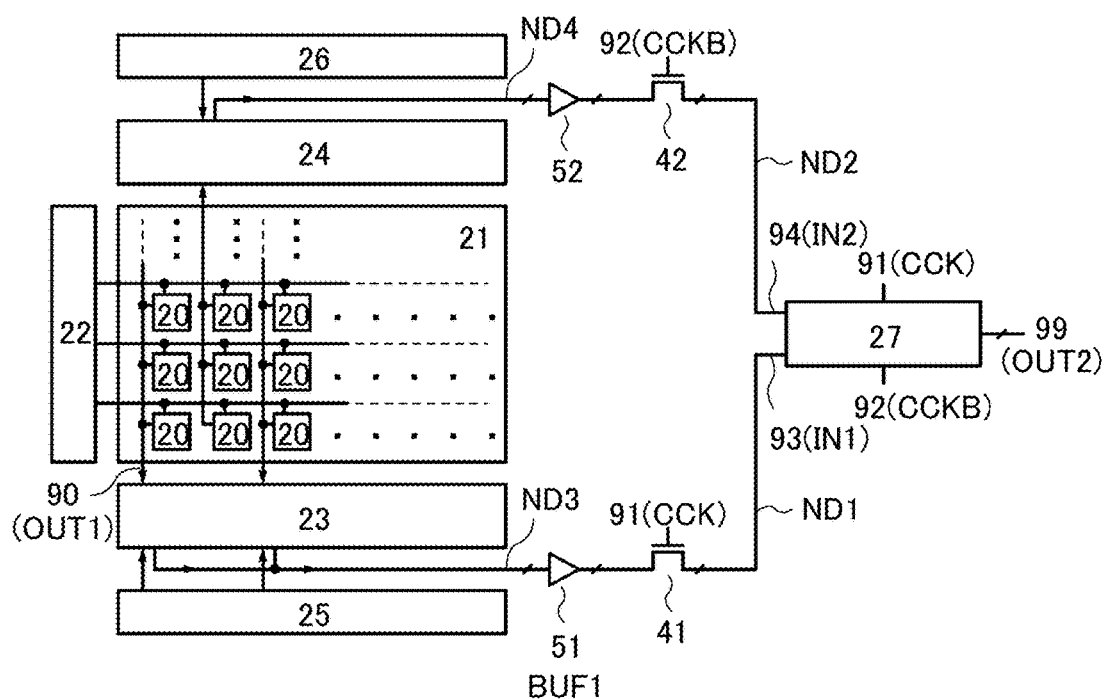
FIG. 1 is a block diagram illustrating an imaging device.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be construed as being limited to the description of the embodiments below. Note that in structures of the invention described below, the same portions or portions having similar functions are denoted by the same reference numerals in different drawings, and description thereof is not repeated in some cases. The same components are denoted by different hatching patterns in different drawings, or the hatching patterns are omitted in some cases.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, in the case where a signal output from X is transmitted to Y even when another circuit is placed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Note that in general, a potential (voltage) is relative and is determined depending on the amount relative to a certain potential. Therefore, even when the expression "ground", "GND", or the like is used, the potential is not necessarily 0 V. For example, the "ground potential" or "GND" may be defined using the lowest potential in a circuit as a reference. Alternatively, the "ground potential" or "GND" may be defined using an intermediate potential in a circuit as a reference. In those cases, a positive potential and a negative potential are set using the potential as a reference.

Embodiment 1

In this embodiment, an imaging device that is one embodiment of the present invention will be described with reference to drawings.

The imaging device of one embodiment of the present invention is capable of reading out an output signal of a pixel at high speed, and has a function of preventing collision between a first output signal and a second output signal which are sequentially read out from pixels in adjacent columns.

FIG. 1 illustrates an imaging device of one embodiment of the present invention. The imaging device includes a pixel array 21 including pixels 20 in a matrix, a circuit 22 (row driver) for driving the pixels 20, circuits 23 and 24 (A/D converter circuits) for converting analog signals output from the pixels 20 into digital signals, circuits 25 and 26 (column drivers) for selecting and reading data converted by the circuits 23 and 24, buffer circuits 51 and 52, transistors 41 and 42, and a selector circuit 27.

The connection between the above components will be described. In the pixel array 21, the pixels 20 in odd-numbered columns are electrically connected to the circuit 23 through wirings 90 (OUT1) in the odd-numbered columns, and the pixels 20 in even-numbered columns are electrically connected to the circuit 24 through the wirings 90 (OUT1) in the even-numbered columns. The circuit 25 is electrically connected to the circuit 23, and the circuit 26 is electrically connected to the circuit 24.

An output terminal of the circuit 23 is electrically connected to an input terminal of the buffer circuit 51, and an output terminal of the circuit 24 is electrically connected to an input terminal of the buffer circuit 52. Here, the buffer circuits 51 and 52 each have a function of amplifying a signal input thereto.

An output terminal of the buffer circuit 51 is electrically connected to one of a source electrode and a drain electrode of the transistor 41. An output terminal of the buffer circuit 52 is electrically connected to one of a source electrode and a drain electrode of the transistor 42.

The other of the source electrode and the drain electrode of the transistor 41 is electrically connected to a first input terminal of the selector circuit 27 through a wiring 93 (IN1). The other of the source electrode and the drain electrode of the transistor 42 is electrically connected to a second input terminal of the selector circuit 27 through a wiring 94 (IN2). Here, the transistors 41 and 42 each have a function of controlling conduction and non-conduction between wirings connected thereto.

Note that the number of the buffer circuits 51, that of the buffer circuits 52, that of the transistors 41, that of the transistors 42, and that of the selector circuits 27 each correspond to the number of output buses of each of the circuit 23 and 24. For example, in the case where a 12-bit A/D converter circuit is used as each of the circuits 23 and 24, 12 buffer circuits 51, 12 buffer circuits 52, 12 transistors 41, 12 transistors 42, and 12 selector circuits 27 are provided.

A wiring 91 (CCK) is electrically connected to a gate electrode of the transistor 41 and a first control signal input terminal of the selector circuit 27. A wiring 92 (CCKB) is electrically connected to a gate electrode of the transistor 42 and a second control signal input terminal of the selector circuit 27.

To the wiring 91 (CCK), a clock signal [CCK] input to shift register circuits (SR) in the circuits 25 and 26 is input. To the wiring 92 (CCKB), a clock signal [CCKB] input to the shift register circuits (SR) in the circuits 25 and 26 is input. In response to the clock signal [CCK] and the clock signal [CCKB], the selector circuit 27 can output, to a wiring 99 (OUT2), signals which are input through the wiring 93 (IN1) and the wiring 94 (IN2).

In the above configuration, the buffer circuits 51 and 52 are not necessarily provided. The wiring 93 (IN1), the wiring 94 (IN2), a wiring connecting the circuit 23 and the buffer circuit 51, and a wiring connecting the circuit 24 and the buffer circuit 52 are referred to as a node ND1, a node ND2, a node ND3, and a node ND4, respectively.

The transistors 41 and 42 are preferably transistors with low off-state current. In the case where the transistors 41 and 42 are off, voltages of the nodes ND1 and ND2 are held for a long time. Therefore, reliable data can be read out. As the transistor with low off-state current, a transistor including an oxide semiconductor in its active layer (hereinafter referred to as OS transistor) can be used, for example.

Figure 2:
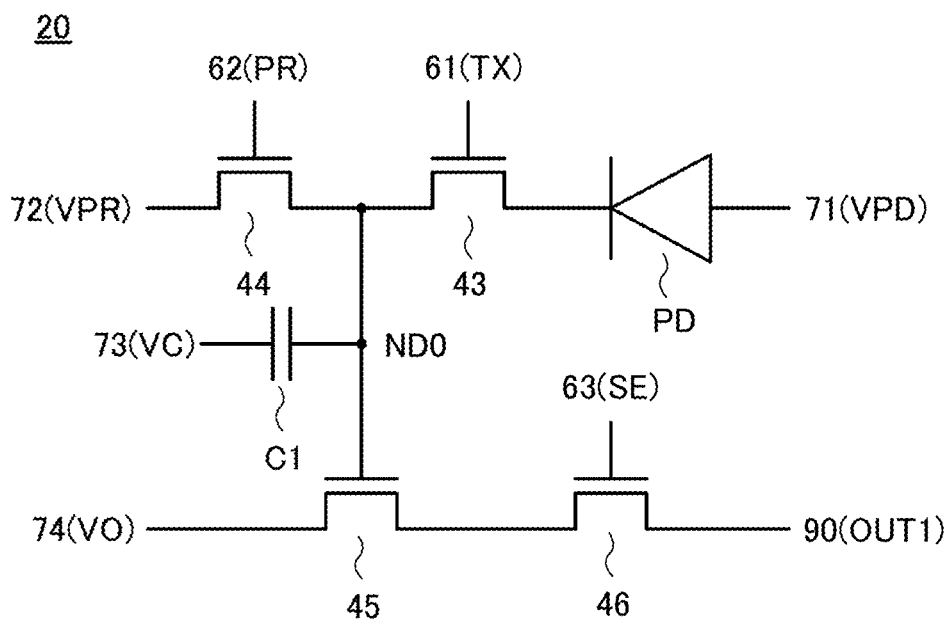
FIG. 2 is a circuit diagram illustrating a pixel.

The pixel 20 can have a circuit configuration illustrated in FIG. 2. In the pixel 20, one electrode of a photoelectric conversion element PD is electrically connected to one of a source electrode and a drain electrode of a transistor 43. The other of the source electrode and the drain electrode of the transistor 43 is electrically connected to one of a source electrode and a drain electrode of a transistor 44. The other of the source electrode and the drain electrode of the transistor 43 is electrically connected to one electrode of a capacitor C1. The other of the source electrode and the drain electrode of the transistor 43 is electrically connected to a gate electrode of a transistor 45. One of a source electrode and a drain electrode of the transistor 45 is electrically connected to one of a source electrode and a drain electrode of a transistor 46. The circuit configuration of the pixel 20 illustrated in FIG. 2 is just an example, and another circuit configuration may alternatively be employed as long as output current can be controlled according to light intensity.

The other electrode of the photoelectric conversion element PD is electrically connected to a wiring 71 (VPD). The other of the source electrode and the drain electrode of the transistor 44 is electrically connected to a wiring 72 (VPR). The other electrode of the capacitor C1 is electrically connected to a wiring 73 (VC). The other of the source electrode and the drain electrode of the transistor 45 is electrically connected to a wiring 74 (VO). The other of the source electrode and the drain electrode of the transistor 46 is electrically connected to the wiring 90 (OUT1).

Here, the wiring 71 (VPD), the wiring 72 (VPR), the wiring 73 (VC), and the wiring 74 (VO) can function as power supply lines. For example, the wiring 71 (VPD) and the wiring 73 (VC) can function as low potential power supply lines, and the wiring 72 (VPR) and the wiring 74 (VO) can function as high potential power supply lines.

A gate electrode of the transistor 43 is electrically connected to a wiring 61 (TX). A gate electrode of the transistor 44 is electrically connected to a wiring 62 (PR). A gate electrode of the transistor 46 is electrically connected to a wiring 63 (SE).

Here, the wiring 61 (TX), the wiring 62 (PR), and the wiring 63 (SE) can each function as a signal line that controls the on/off state of the transistor.

The transistor 43 functions as a transfer transistor for controlling the potential of a node ND0 in response to the output of the photoelectric conversion element PD. The transistor 44 functions as a reset transistor for initializing the potential of the node ND0. The transistor 45 functions as an amplifying transistor for outputting a signal corresponding to the potential of the node ND0. The transistor 46 functions as a selection transistor for selecting the pixel 20. Note that some or all of the transistors 43 to 46 are preferably OS transistors.

Note that the above structure of the pixel 20 is just an example, and some of the circuits, some of the transistors, some of the capacitors, some of the wirings, or the like might not be included. Alternatively, a circuit, a transistor, a capacitor, a wiring, or the like that is not included in the above structure might be included. Alternatively, connection between some wirings might be different from the above connection. A reading circuit including a current source transistor may be connected to the wiring 90 (OUT1) in order to output an appropriate signal potential to the wiring 90 (OUT1).

An operation example of the pixel 20 is as follows. Note that the wiring 72 (VPR) and the wiring 74 (VO) are each set at the high potential, and the wiring 71 (VPD) and the wiring 73 (VC) are each set at the low potential. In the description of the potentials, "H" level means a high potential, and "L" level means a low potential.

First, the potential of the wiring 62 (PR) is set at "H" level, so that the transistor 44 is turned on and the node ND0 has the potential of the wiring 72 (VPR) (i.e., reset operation).

Next, the transistor 44 is turned off, and the potential of the wiring 61 (TX) is set at "H" level to turn on the transistor 43, so that charges are released from the node ND0 through the photoelectric conversion element PD (i.e., accumulation operation). The higher the illuminance of light with which the photoelectric conversion element PD is irradiated is, the larger the amount of photocurrent flowing through the photoelectric conversion element PD becomes and the lower the potential of the node ND0 becomes.

Next, the transistor 43 is turned off, and the potential of the wiring 63 (SE) is set at "H" level to turn on the transistor 46, so that a current flowing through the transistor 45 depending on the potential of the node ND0 is output to the wiring 90 (OUT1) through the transistor 46 (i.e., reading operation).

The circuit 22 has a function of selecting a specific row in the pixel array 21. The circuit 22 includes a shift register circuit (SR), a NAND circuit, a NOR circuit, a buffer circuit (BUF), or the like.

The circuits 23 and 24 each have a function of converting an analog signal output from the pixel 20 to the wiring 90 (OUT1) into a digital signal. In this embodiment, the number of output buses of each of the circuits 23 and 24 is 12. Therefore, 12 buffer circuits 51, 12 buffer circuits 52, 12 transistors 41, 12 transistors 42, and 12 selector circuits are provided. Note that the number of output buses of each of the circuits 23 and 24 is not limited to 12.

Input terminals of the circuit 23 are electrically connected to the wirings 90 (OUT1) to which the pixels 20 in the odd-numbered columns are connected. Input terminals of the circuit 24 are electrically connected to the wirings 90 (OUT1) to which the pixels 20 in the even-numbered columns are connected. The converted digital signals are output from output terminals of the circuits 23 and 24.

The circuits 25 and 26 each have a function of sequentially selecting columns outputting the above digital signals. Note that the circuit 25 is electrically connected to the circuit 23, and the circuit 26 is electrically connected to the circuit 24.

That is, analog signals output from the pixels 20 in a row selected by the circuit 22 are converted into digital signals by the circuits 23 and 24, and the digital signals are sequentially output column by column by the circuits 25 and 26.

Figure 3:
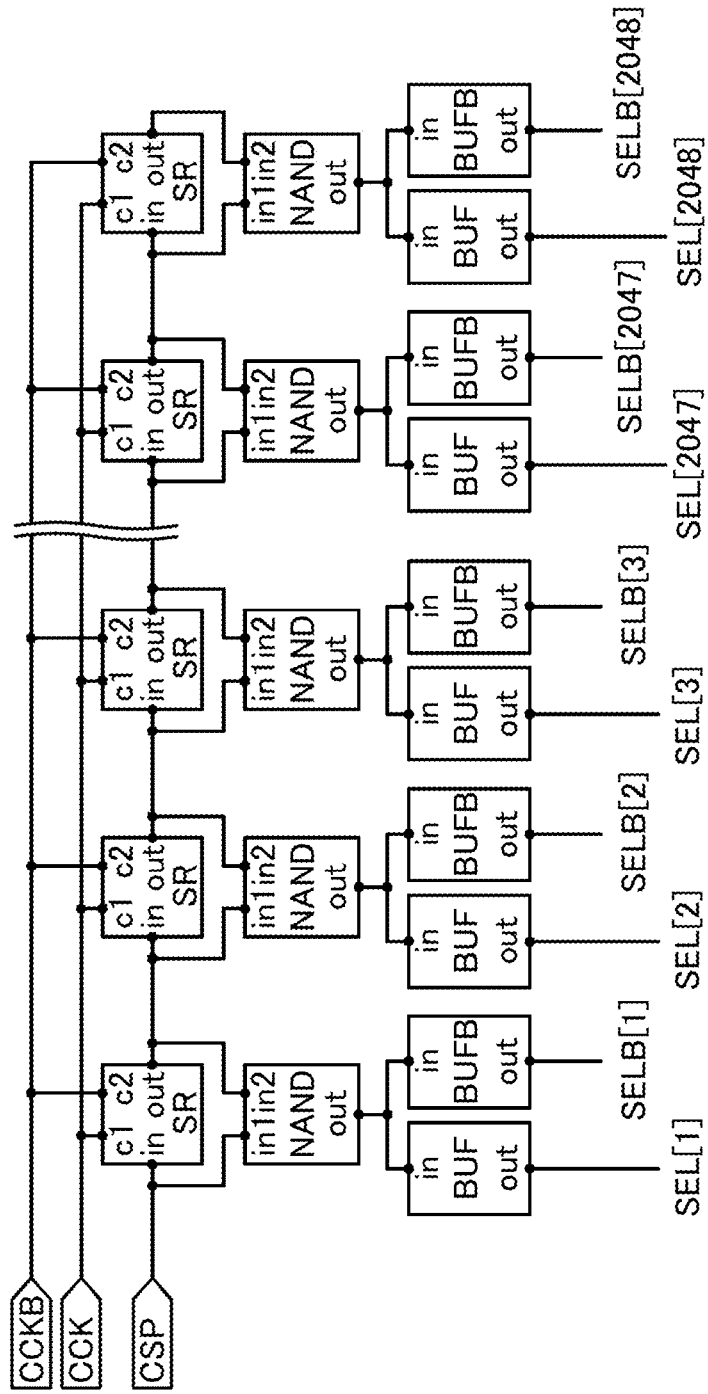
FIG. 3 is a block diagram illustrating column drivers.

FIG. 3 is a block diagram of each of the circuits 25 and 26. The circuits 25 and 26 each include a shift register circuit (SR), a NAND circuit, and buffer circuits (BUF and BUFB).

Figure 4:
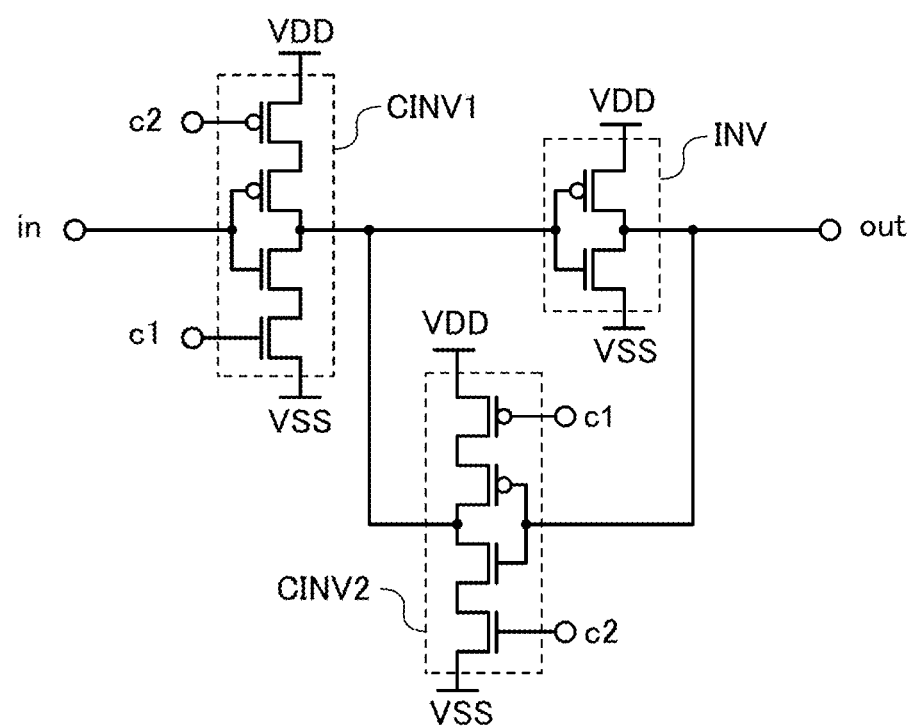
FIG. 4 is a circuit diagram illustrating a shift register circuit.

For example, the shift register circuit (SR) can have a configuration illustrated in FIG. 4. The shift register circuit (SR) includes a clocked inverter circuit (CINV1), a clocked inverter circuit (CINV2), and an inverter circuit (INV), for example.

The clocked inverter circuit (CINV1) and the clocked inverter circuit (CINV2) each have a function of outputting an inverted signal of an input signal in synchronization with a clock signal. The inverter circuit (INV) has a function of outputting an inverted signal of an input signal. Therefore, a signal output from an output terminal (out) in synchronization with a clock signal is the same as a signal input from an input terminal (in). Note that the clocked inverter circuit (CINV2) and the inverter circuit (INV) each form a flip-flop circuit, and have a function of holding data of the shift register circuit (SR).

Figure 5A:
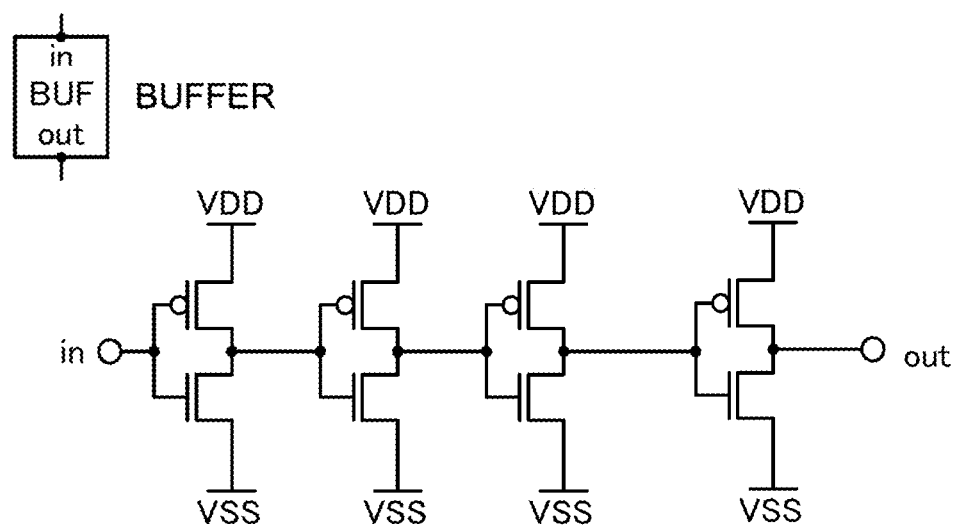
FIGS. 5A and 5B are circuit diagrams each illustrating a buffer circuit.
Figure 5B:
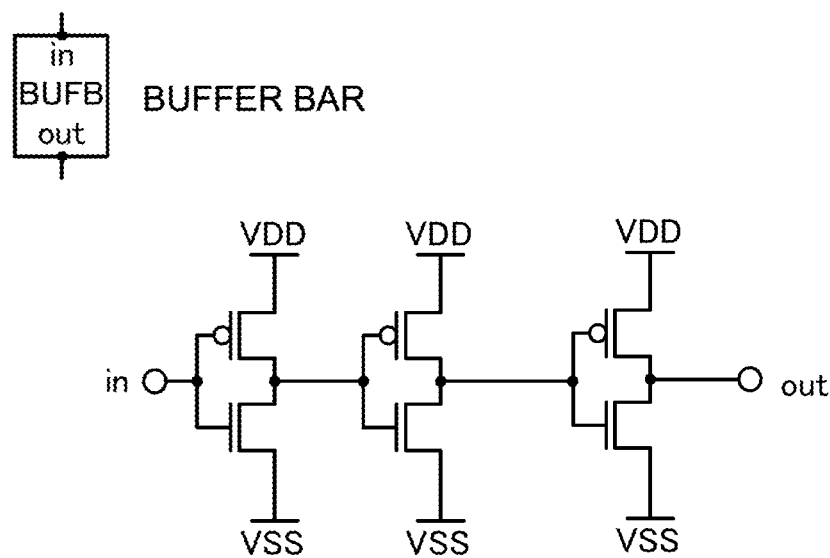

The buffer circuits (BUF and BUFB) can have configurations illustrated in FIGS. 5A and 5B, respectively. In FIG. 4 and FIGS. 5A and 5B, VDD and VSS denote power supply lines, the power supply potentials of which might be different from those of power supply lines connected to the row driver (the circuit 22) including the shift register circuit (SR) and the buffer circuit (BUF) in a similar manner.

The shift register circuit (SR) has a function of transmitting a start pulse signal [CSP] in synchronization with a clock signal [CCK] and a clock signal [CCKB]. Note that the clock signal [CCKB] is the inverted signal of the clock signal [CCK]. One shift register circuit (SR) supplies selection signals [SEL] and selection signals [SELB] for one column. Note that the selection signal [SELB] is the inverted signal of the selection signal [SEL]. The selection signal [SEL] and the selection signal [SELB] are supplied to the circuit 23 or the circuit 24.

The NAND circuit outputs a potential signal with "L" level when the potentials of the input terminal (in) and the output terminal (out) of the corresponding shift register circuit (SR) are set at "H" level, and outputs a potential signal with "H" level when they are set at "L" level. That is, when the potentials of the input terminal (in) and the output terminal (out) of the shift register circuit (SR) are set at "L" level, the potential of the corresponding signal line (SEL) is set at "H" level. Here, the buffer circuits (BUF and BUFB) have a function of increasing current supply capability. Furthermore, the buffer circuit (BUFB) has a function of outputting the inverted signal of a signal output from the buffer circuit (BUF).

Figure 6:
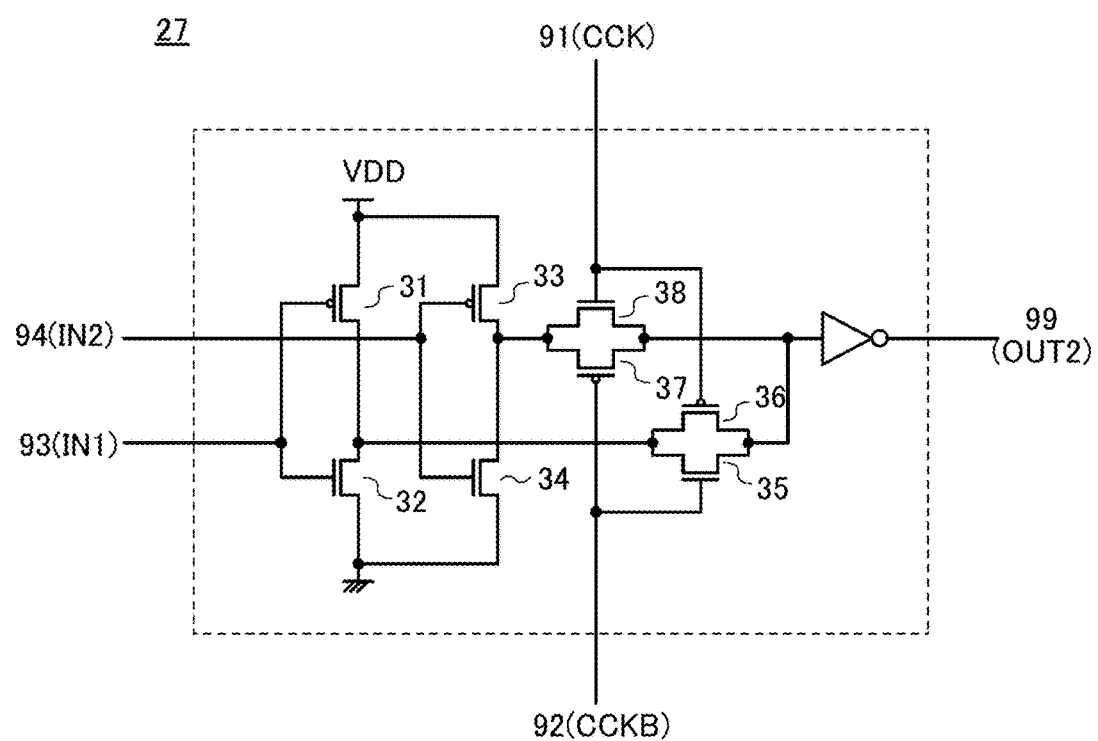
FIG. 6 is a circuit diagram illustrating a selector circuit.

As the selector circuit 27, a multiplexer circuit having a configuration illustrated in FIG. 6 can be used, for example. The multiplexer circuit illustrated in FIG. 6 includes a transistor 31, a transistor 32, a transistor 33, a transistor 34, a transistor 35, a transistor 36, a transistor 37, a transistor 38, and an inverter circuit. Here, the wiring 91 (CCK) and the wiring 92 (CCKB) are each a signal line for selecting a signal input from the wiring 93 (IN1) or the wiring 94 (IN2). Note that signals supplied from the wiring 91 (CCK) and the wiring 92 (CCKB) are equivalent to clock signals of the circuit 25 and the circuit 26. The wiring 92 (CCKB) is supplied with the inverted signal of a signal with which the wiring 91 (CCK) is supplied.

When a signal with "H" level is supplied from the wiring 91 (CCK) and a signal with "L" level is supplied from the wiring 92 (CCKB), the transistors 35 and 36 are turned off and the transistors 37 and 38 are turned on. Accordingly, a signal input from the wiring 94 (IN2) is output from the wiring 99 (OUT2).

In contrast, when a signal with "L" level is supplied from the wiring 91 (CCK) and a signal with "H" level is supplied from the wiring 92 (CCKB), the transistors 35 and 36 are turned on and the transistors 37 and 38 are turned off. Accordingly, a signal input from the wiring 93 (IN1) is output from the wiring 99 (OUT2).

The above is the description of the structure of the imaging device of one embodiment of the present invention. Here, in order to describe the problem clearly, the structure and operation of a conventional imaging device will be described.

Figure 7:
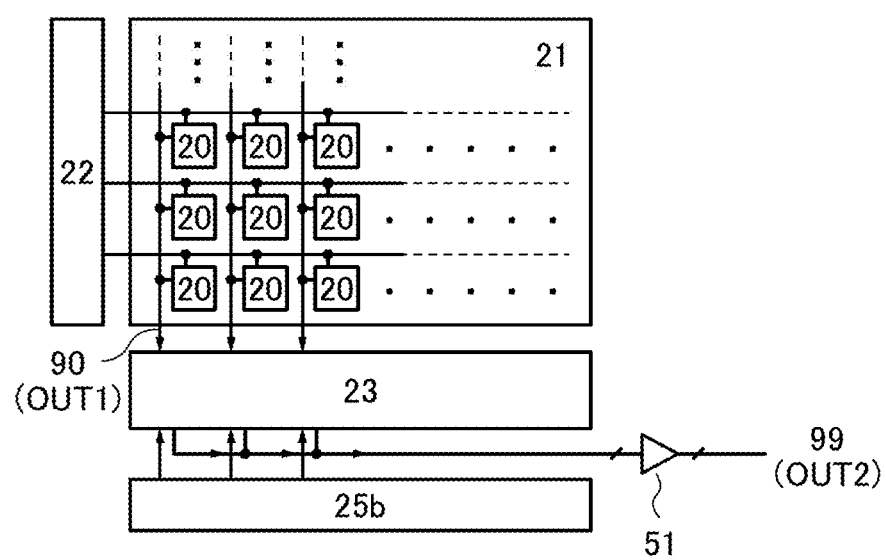
FIG. 7 is a block diagram illustrating an imaging device.

FIG. 7 is an example of a block diagram of a conventional imaging device. Note that the pixels 20, the pixel array 21, the circuit 22 (row driver), the circuit 23 (A/D converter circuit), the buffer circuit 51, the wiring 90 (OUT1), and the wiring 99 (OUT2) are the same as those in the imaging device of one embodiment of the present invention described above, and are denoted by the same reference numerals. The conventional imaging device is different from the imaging device of one embodiment of the present invention in that one A/D converter circuit, one column driver, and one buffer circuit are provided, and the transistors 41 and 42 and the selector circuit 27 are not provided. In addition, the structure of the column driver is different.

Figure 8:
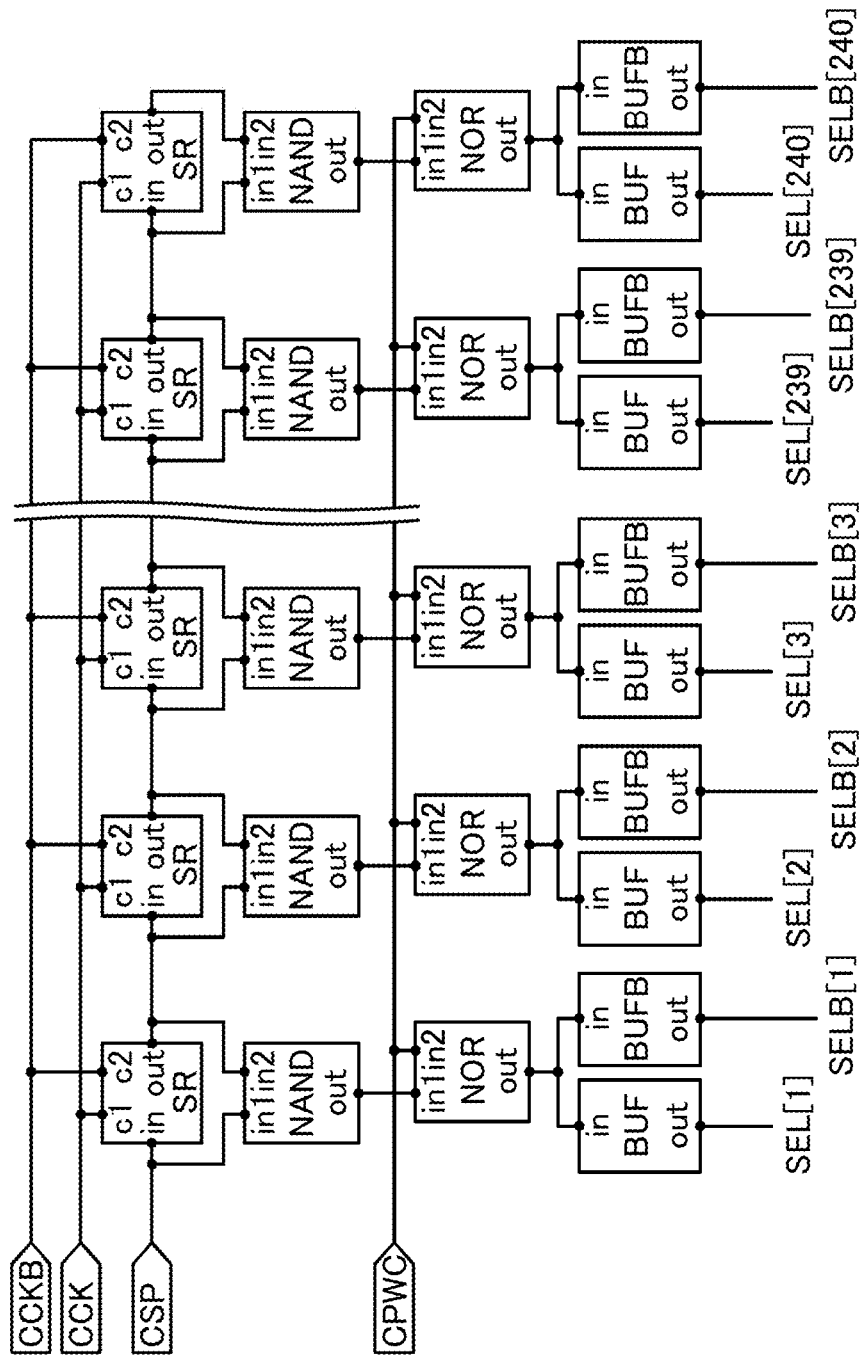
FIG. 8 is a block diagram illustrating a column driver.

FIG. 8 is a block diagram of a circuit 25b serving as a column driver of the conventional imaging device. The circuit 25b includes a shift register circuit (SR), a NAND circuit, a NOR circuit, and buffer circuits (BUF and BUFB).

For the configurations of the shift register circuit (SR) and the buffer circuits (BUF and BUFB) in the circuit 25b, FIG. 4 and FIGS. 5A and 5B can be referred to.

The shift register circuit (SR) has a function of transmitting a start pulse signal [CSP] in synchronization with a clock signal [CCK] and a clock signal [CCKB]. Note that the clock signal [CCKB] is the inverted signal of the clock signal [CCK]. One shift register circuit (SR) supplies selection signals [SEL] and selection signals [SELB] for one column. Note that the selection signal [SELB] is the inverted signal of the selection signal [SEL]. Note that the selection signal [SEL] and the selection signal [SELB] are controlled by a control signal [CPWC].

The NAND circuit outputs a potential signal with "L" level when the potentials of the input terminal (in) and the output terminal (out) of the corresponding shift register circuit (SR) are set at "H" level, and outputs a potential signal with "H" level when they are set at "L" level. The NOR circuit outputs a potential signal with "H" level when the potential of a signal output from the NAND circuit is at "L" level and the potential of the control signal [CPWC] is at "L" level. That is, when the output from the NOR circuit is at "H" level, the potential of the corresponding signal line (SEL) is at "H" level. Note that the pixels 20 are provided in 240 columns; the signal lines in the 1st to 240th columns are referred to as signal lines SEL[1] to SEL[240] and signal lines SELB[1] to SELB[240] respectively.

Figure 9:
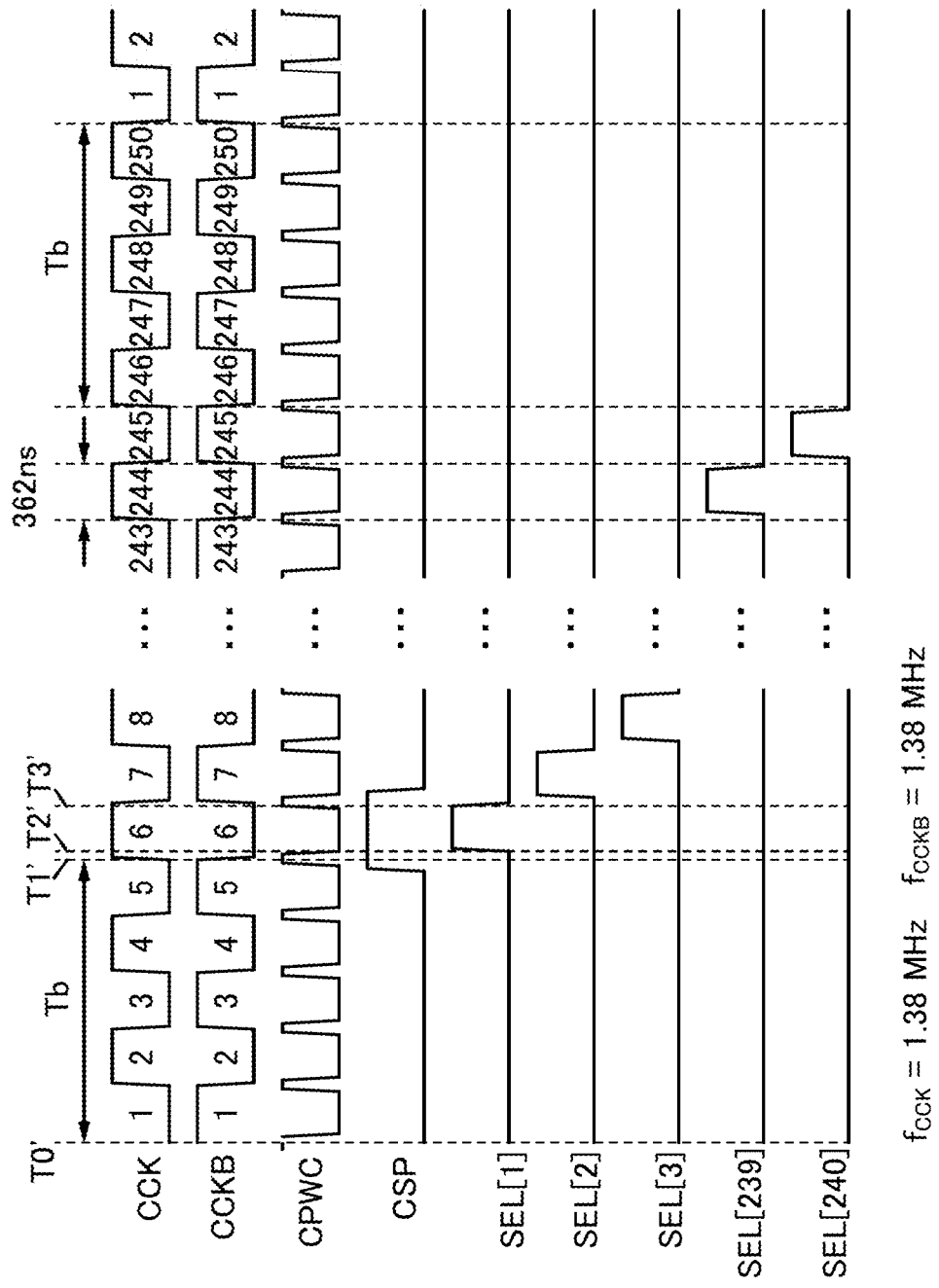
FIG. 9 is a timing chart showing the operation of a column driver.

FIG. 9 is a timing chart showing the operation of the circuit 25b. The frequency of each of the clock signal [CCK] and the clock signal [CCKB] is set at 1.38 MHz on the assumption that the frame frequency is 60 Hz. The operation starts at Time T0', and time passes in the order of T0', T1', and T2'. Note that the circuit 25b outputs selection signals for one column within ½ clock cycle. The length of periods 1 to 250 in FIG. 9 is equal to that of a period in which one row is selected by the circuit 22 (row driver). That is, the length of the periods 1 to 250 is about 181 μsec.

A period from Time T0' to Time T1' is a blank period (Tb). The blank period corresponds to a reset period and an accumulation period in the imaging operation of the pixel 20.

The potential of the start pulse signal [CSP] is set at "H" level just before Time T1', so that the shift register (SR) in the circuit 25b starts operating.

When the potential of the control signal [CPWC] is set at "L" level at Time T2', the potential of the signal line SEL[1] is set at "H" level. That is, output signals in the first column are selected, and imaging data accumulated in the pixels 20 are converted into digital data to be output.

When the potential of the control signal [CPWC] is set at "H" level at Time T3', the potential of the signal line SEL[1] is set at "L" level. That is, output signals in the first column are deselected. In this manner, signals corresponding to imaging data accumulated in the pixels 20 in the 1st to 240th columns are output.

Here, the control signal [CPWC] has a function of preventing collision between output signals. In the case where the control signal [CPWC] is not used, a first signal for selecting a given column is replaced with a second signal for selecting the adjacent column at the timing of changing the clock signal [CCK]. That is, a period during which the first signal falls and a period during which the second signal rises overlap with each other, and thus there is a possibility of collision between an output signal in the column selected by the first signal and an output signal in the column selected by the second signal.

Figure 10:
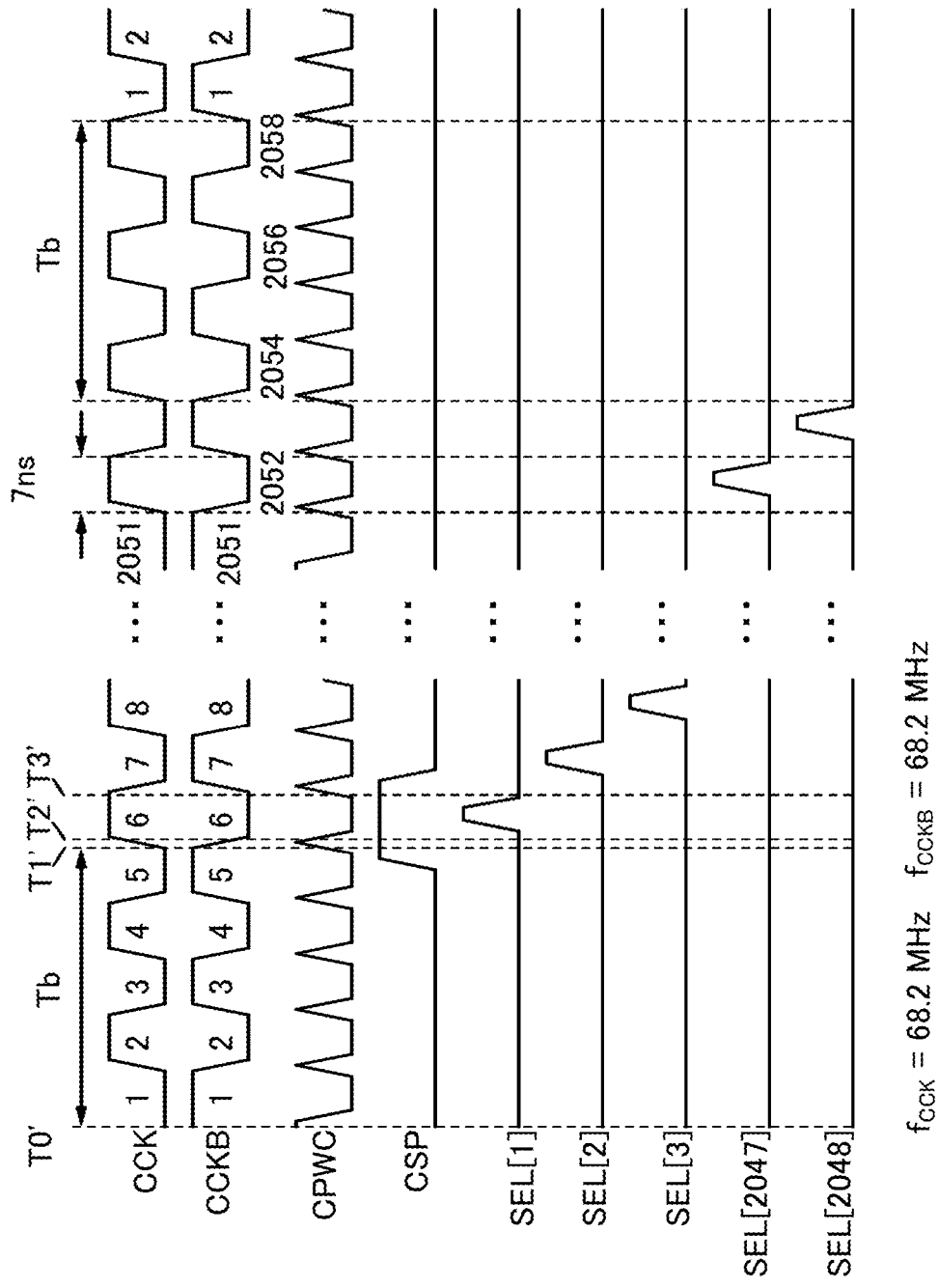
FIG. 10 is a timing chart showing the operation of a column driver.

In the case where the number of pixels is increased, another problem arises. For example, when the circuit 25b or the like has the above structure and the number of pixels in the pixel array 21 is 2K (1080×2048), the circuit 22 and the circuit 25b need to operate at 16.6 kHz and at 68.2 MHz respectively at a frame frequency of 60 Hz. In this case, as shown in FIG. 10, data in each column needs to be read out in 7 ns at a maximum. Actually, the length of time for data reading is further shortened because of a signal delay. In particular, the control signal [CPWC] needs to be changed at shorter intervals than the clock signal [CCK] and thus has difficulty having an ideal waveform because of a signal delay.

Next, the operation of the imaging device of one embodiment of the present invention for solving the problem of the operation of the conventional imaging device will be described.

In the imaging device of one embodiment of the present invention, output signals of the pixels 20 in the odd-numbered columns are transmitted to the circuit 23. Output signals of the pixels 20 in the even-numbered columns are transmitted to the circuit 24. Data in the pixels 20 in the odd-numbered columns are converted into digital data by the circuit 23. The column from which data is read is selected by the circuit 25. The digital data is transmitted to the selector circuit 27 through the buffer circuit 51 and the transistor 41. That is, in this configuration, the total number of output buses of the A/D converter circuits (the circuits 23 and 24) is two. Data in the pixels 20 in the even-numbered columns are converted into digital data by the circuit 24. The column from which data is read is selected by the circuit 26. The digital data is transmitted to the selector circuit 27 through the buffer circuit 52 and the transistor 42.

Figure 11:
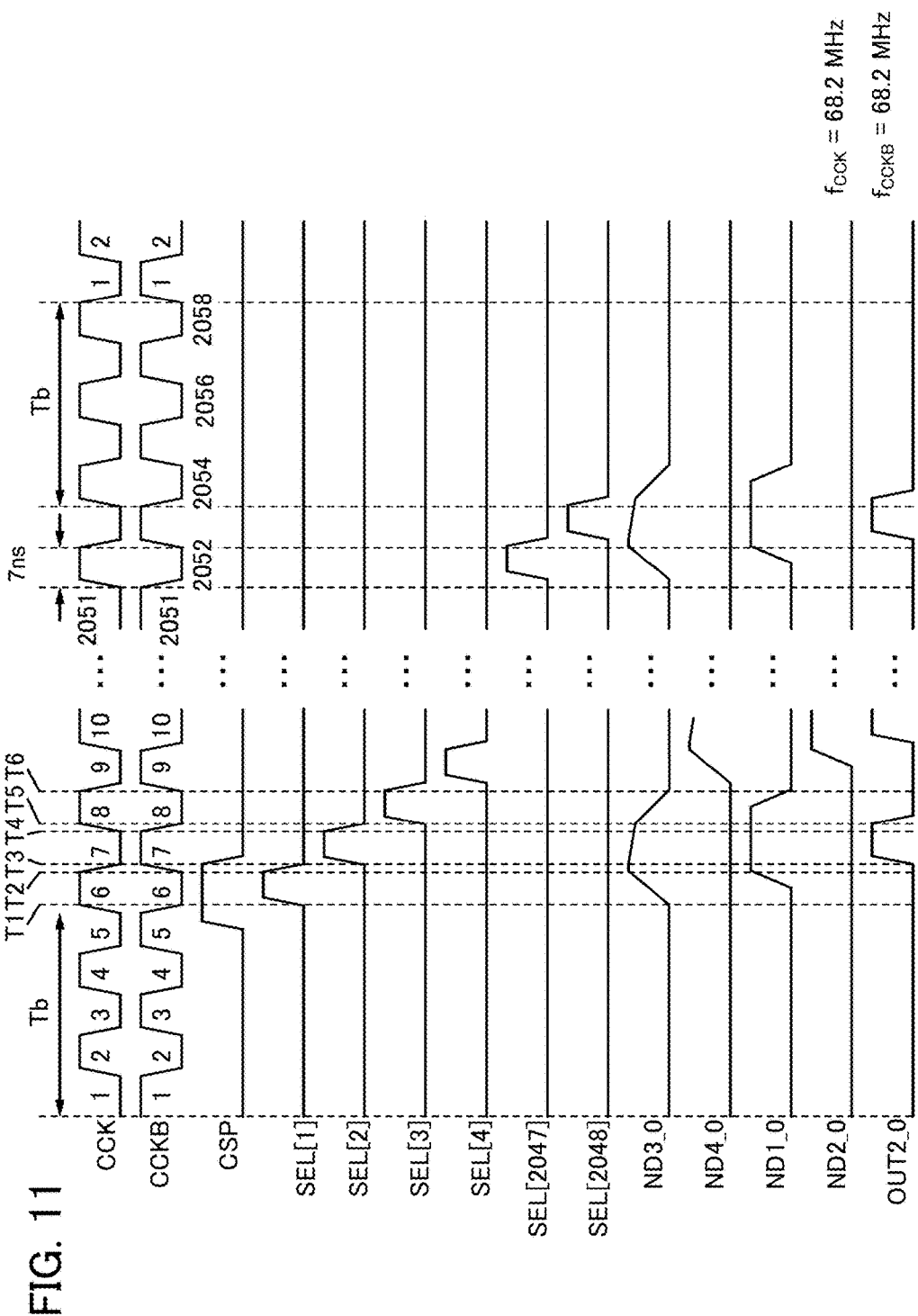
FIG. 11 is a timing chart showing the operation of a column driver.

FIG. 11 is a timing chart showing the operation of the imaging device of one embodiment of the present invention. As for an output signal in this timing chart, only an output of the least significant bit is illustrated. That is, ND1_0, ND2_0, ND3_0, ND4_0, and OUT2_0 denote the least significant bits of the node ND1, the node ND2, the node ND3, the node ND4, and the wiring 99 (OUT2), respectively.

The clock frequency of each of the circuits 25 and 26 is 68.2 MHz on the assumption that the number of pixels in the pixel array 21 is 2K (1080×2048) and the frame frequency is 60 Hz. The operation starts at Time T0, and time passes in the order of T0, T1, and T2. Note that the circuits 25 and 26 each output selection signals for one column within ½ clock cycle. The length of periods 1 to 2058 in FIG. 11 is equal to that of a period in which one row is selected by the circuit 22 (row driver). That is, the length of the periods 1 to 2058 is about 30 μsec.

Note that the pixels 20 are provided in 2048 columns; the signal lines in the 1st to 2048th columns are referred to as signal lines SEL[1] to SEL[2048] and signal lines SELB[1] to SELB[2048] respectively. Note that the signal line SEL and the signal line SELB are each a signal line connected to the circuit 25 or the circuit 26; only the signal line SEL is used in the following description.

A period from Time T0' to Time T1' is a blank period. The potential of the start pulse signal [CSP] is set at "H" level just before Time T1', so that the shift registers (SR) in the circuits 25 and 26 start operating. Since the clock signal [CCK] is set at "H" level, the potential of the signal line SEL[1] is set at "H" level. The potential of the signal line SEL[1] is set at "H" level, and data in the first column is selected; thus, the potential of the node ND3_0 is changed. Since the output of the least significant bit in the first column is set at "H" level here, the potential of the node ND3_0 is changed to "H" level. At this time, the potential of the wiring 91 (CCK) to which the clock signal [CCK] is supplied is set at "H" level; thus, the transistor 41 is turned on, and the potential of the node ND1_0 is set at "H" level.

In a period from Time T2 to Time T3, the potential of the clock signal [CCK] is set at "L" level, and the potential of the clock signal [CCKB] is set at "H" level. Therefore, the potential supplied to the signal line SEL[1] is set at "L" level.

At Time T3, the output signals of the odd-numbered columns are not selected and the transistor 41 is turned off; thus, the node ND3_0 is brought into a floating state. For example, in the case of using a transistor including silicon, the potential of the node ND3_0 is decreased owing to leakage current between a source and a drain (see the node ND3_0 after Time T3). However, the potential of the node ND1_0 is kept because the transistor 41 is off and is a transistor including an oxide semiconductor and thus having significantly low off-state current.

In a period from Time T3 to Time T4, the potential supplied to the signal line SEL[2] is set at "H" level, and data in the second column is selected; thus, the potential of the node ND4_0 is changed. Since the output of the least significant bit in the second column is set at "L" level here, the potential of the node ND4_0 is not changed. At this time, the potential of the wiring 92 (CCKB) to which the clock signal [CCKB] is supplied is set at "H" level; thus, the transistor 42 is turned on, and the potential of the node ND2_0 is set at "L" level.

In the period from Time T3 to Time T4, the potential supplied to the wiring 91 (CCK) is set at "L" level, and the potential supplied to the wiring 92 (CCKB) is set at "H" level; thus, the selector circuit 27 outputs a signal input from the wiring 93 (IN1). That is, data in the first column, which has been held in the node ND1_0, is output to the wiring 99 (OUT2).

In a period from Time T4 to Time T5, the potential of the clock signal [CCK] is set at "H" level, and the potential of the clock signal [CCKB] is set at "L" level. Therefore, the potential supplied to the signal line SEL[2] is set at "L" level.

At Time T5, output signals in the even-numbered columns are not selected, and the node ND4_0 is brought into a floating state. Here, the transistor 42 is off, and the potential of the node ND2_0 is held.

In a period from Time T5 to Time T6, the potential supplied to the signal line SEL[3] is set at "H" level, and data in the third column is selected; thus, the potential of the node ND3_0 is changed. Since the output of the least significant bit in the third column is set at "L" level here, the potential of the node ND3_0 is changed to "L" level. At this time, the potential supplied to the wiring 91 (CCK) is set at "H" level; thus, the transistor 41 is turned on, and the potential of the node ND1_0 is set at "L" level.

In the period from Time T5 to Time T6, the potential supplied to the wiring 91 (CCK) is set at "H" level, and the potential supplied to the wiring 92 (CCKB) is set at "L" level; thus, the selector circuit 27 outputs a signal input from the wiring 94 (IN2). That is, data in the second column, which has been held in the node ND2_0, is output to the wiring 99 (OUT2).

After that, driving similar to the above is performed on the odd-numbered column and the even-numbered column alternately.

As described above, data in a column is output with ½ clock cycle delay after the timing at which the column is selected. In the conventional imaging device, it takes a long time to ensure the potential of an output signal because of a delay due to wiring resistance or the like just after a column is selected by a column driver. That is, the potential of a node at which an output signal is held is not ensured when being output in some cases. In one embodiment of the present invention, data in a column is output to the outside with ½ clock cycle delay after the timing at which the column is selected; thus, the potential of a node (corresponding to the node ND1_0 or the node ND2_0) at which an output signal is held can be easily ensured when being output to the outside. Therefore, output of wrong data due to signal delay can be inhibited.

Figure 12:
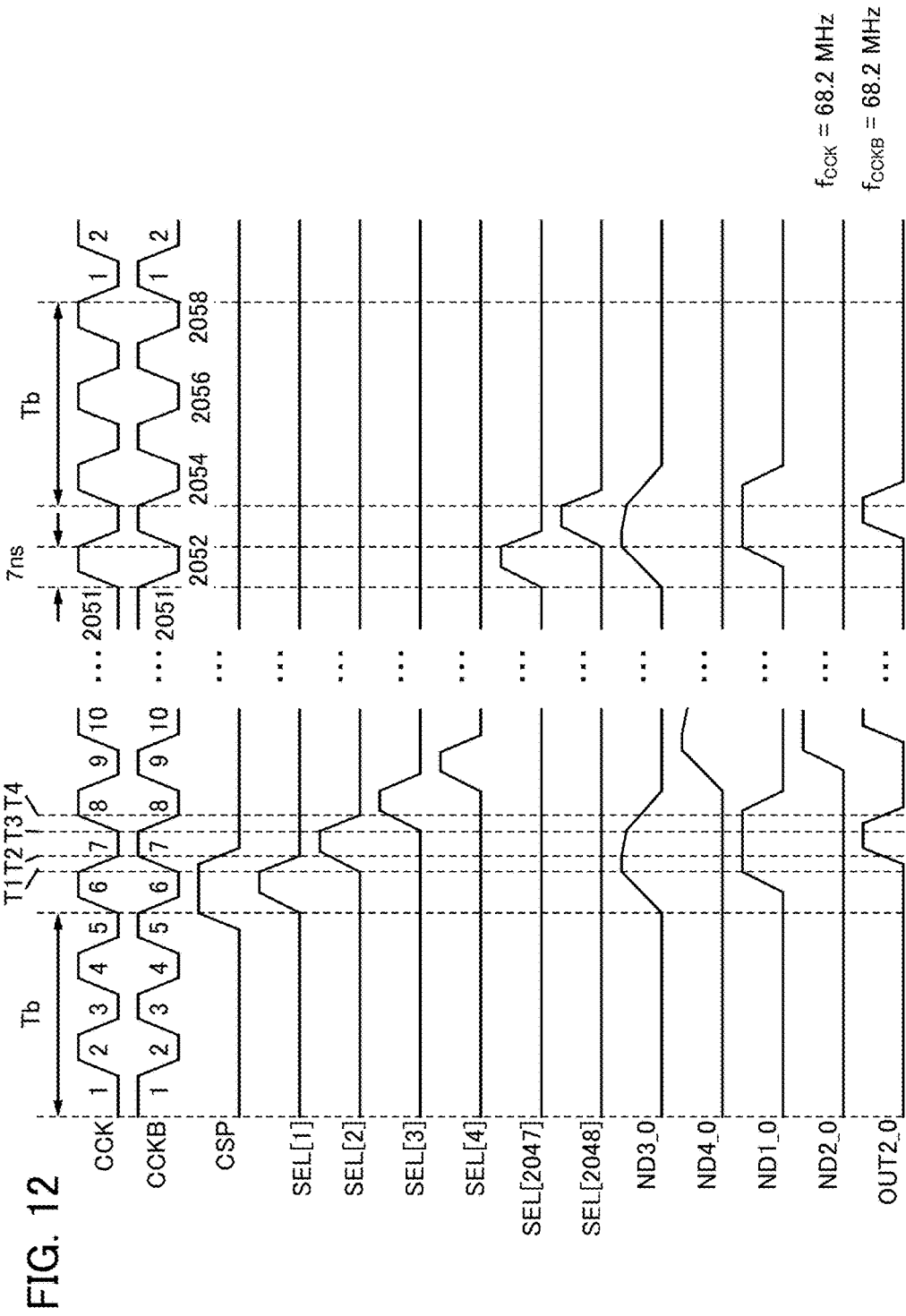
FIG. 12 is a timing chart showing the operation of a column driver.

Even when such a circuit configuration is employed, a period during which the selection signal SEL[1] for selecting the first column falls and a period during which the selection signal SEL[2] for selecting the second column rises might overlap with each other as shown in the timing chart of FIG. 12. In this case, both of the columns might be selected. However, in one embodiment of the present invention, data collision is not caused because data in the odd-numbered columns are held in the node ND1_0 and data in the even-numbered columns are held in the node ND2_0.

The use of the above circuit configuration and driving method of one embodiment of the present invention makes a delay circuit using a control signal [CPWC], a NOR circuit, or the like unnecessary. Furthermore, data collision between adjacent columns can be prevented because pixel data in odd-numbered columns and pixel data in even-numbered columns are read out through different paths. In addition, data can be output to the outside after being ensured; thus, a reading period can be set long.

Figure 13A:
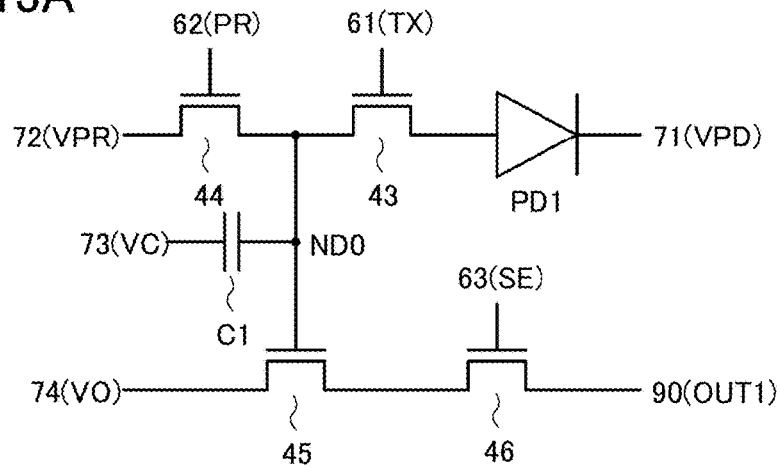
FIGS. 13A to 13C are circuit diagrams each illustrating a pixel.
Figure 13B:
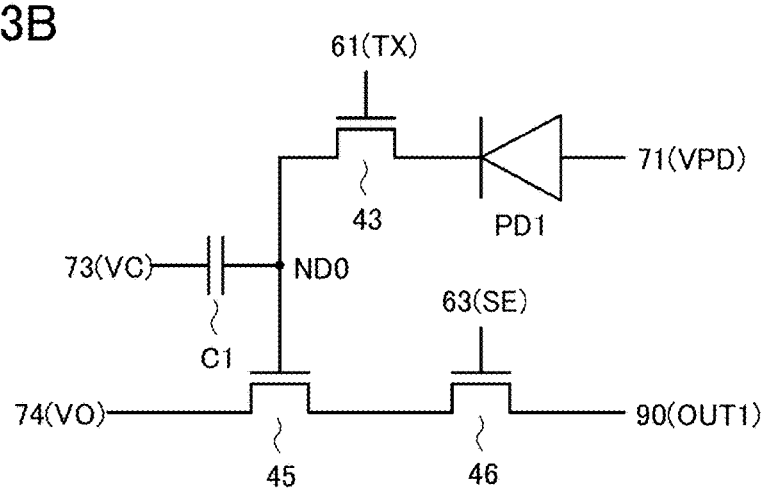
Figure 13C:
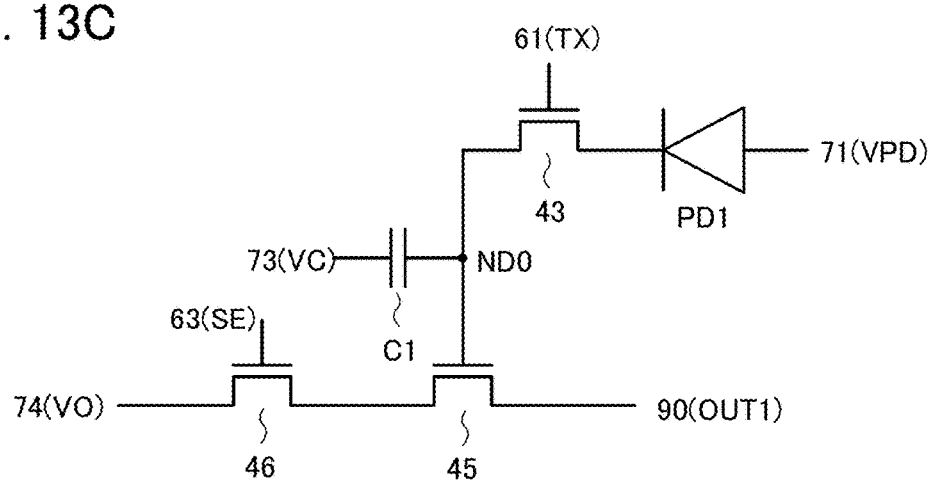

Note that the configuration of the circuit of the pixel 20 is not limited to that illustrated in FIG. 2, and may be any of the ones illustrated in FIGS. 13A to 13C. The connection direction of the photoelectric conversion element PD in FIG. 13A is opposite to that in FIG. 2. In this configuration, operation can be performed in such a manner that the wiring 71 (VPD) is set at a high potential and the wiring 72 (VPR) is set at a low potential. In the configuration of FIG. 13B, the transistor 44 is not provided. In this configuration, the wiring 71 (VPD) is set at a high potential, whereby the potential of the node ND0 can be reset. In the configuration of FIG. 13C, the other of the source electrode and the drain electrode of the transistor 45 is connected to the wiring 90 (OUT).

Figure 14A:
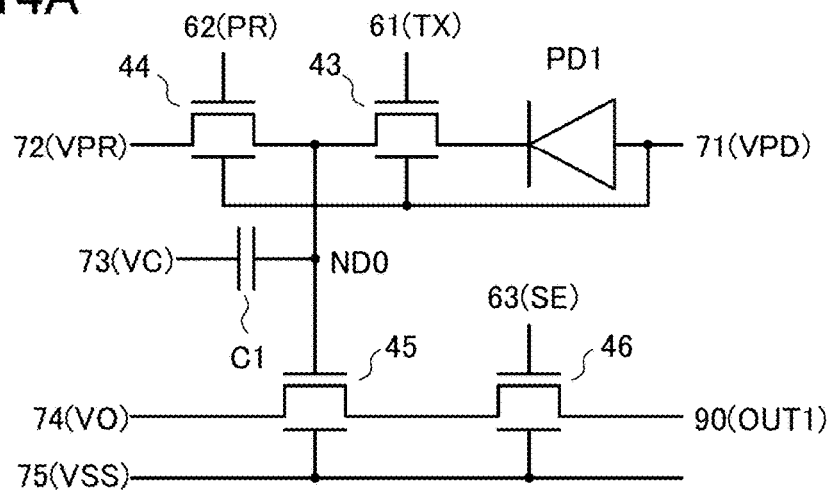
FIGS. 14A to 14C are circuit diagrams each illustrating a pixel.
Figure 14B:
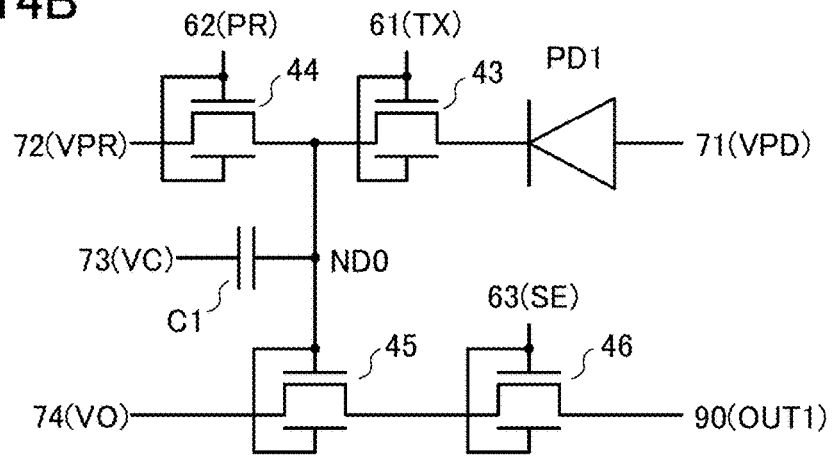
Figure 14C:
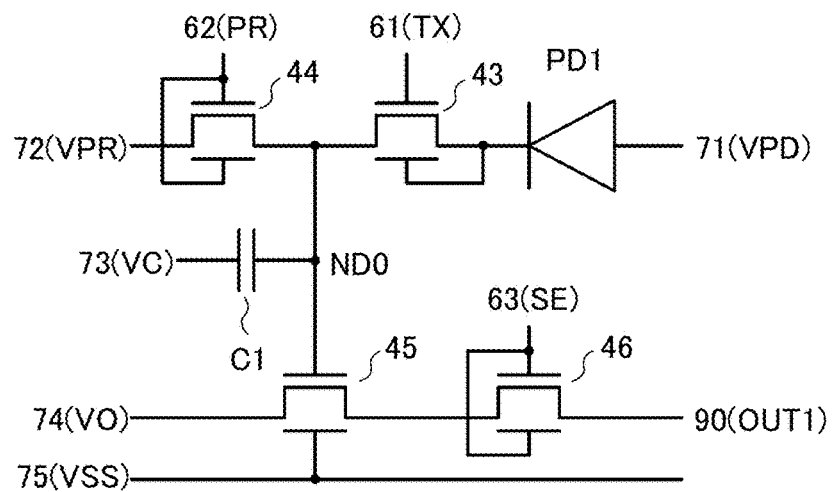

The transistors 43 to 46 in the pixel circuit may each have a back gate as illustrated in FIGS. 14A to 14C. FIG. 14A illustrates a configuration in which a constant potential is applied to the back gates, which enables control of the threshold voltages. The back gates are each connected to the wiring 71 (VPD) or the wiring 75 (VSS) in the example of FIG. 14A, but may be connected to one of them. FIG. 14B illustrates a configuration in which the same potential is applied to the front gate and the back gate, which enables an increase in on-state current and a decrease in off-state current. The configuration of FIG. 14C is obtained by combining the configurations of FIGS. 14A and 14B and the like such that desired transistors can have appropriate electrical characteristics. Note that the configuration of FIG. 14C is just an example, and a transistor without a back gate may be provided. Note that any of the configurations of FIG. 2 and FIGS. 13A to 13C can be combined with any of the configurations of FIGS. 14A to 14C as necessary.

Figure 15:
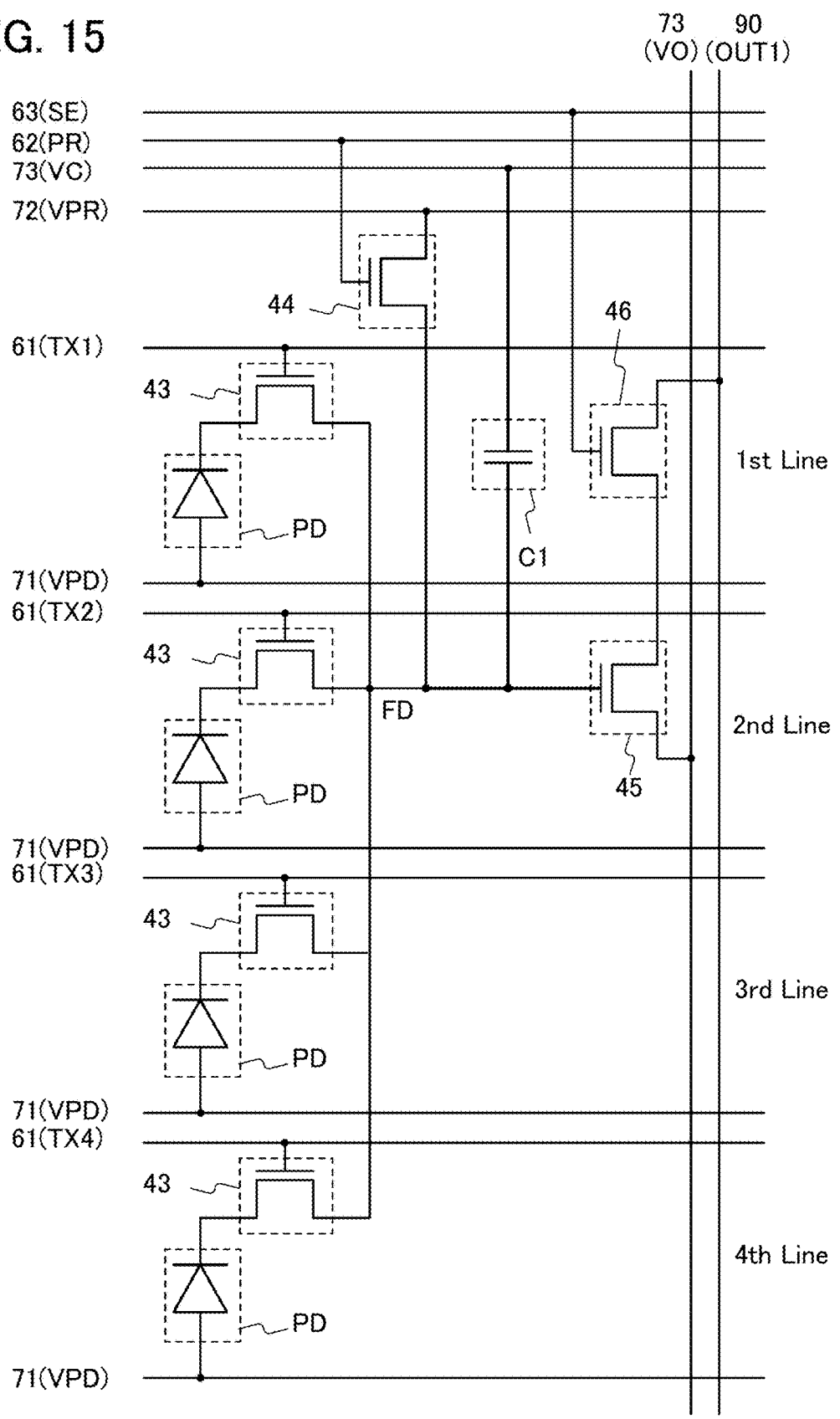
FIG. 15 is a circuit diagram illustrating pixels.

Note that the circuit of the pixel 20 may have a configuration in which the transistors 44 to 46 are shared among a plurality of pixels as illustrated in FIG. 15. FIG. 15 illustrates a configuration in which the transistors 44 to 46 are shared among a plurality of pixels in the perpendicular direction; however, the transistors 44 to 46 may be shared among a plurality of pixels in the horizontal direction or in the horizontal and perpendicular direction. With such a configuration, the number of transistors included in one pixel can be reduced. Furthermore, the other electrode of the capacitor C1 is connected to the wiring 74 (VC) in the example of FIG. 15, but may be connected to the wiring 71 (VPD).

Although FIG. 15 illustrates a configuration in which the transistors 44 to 46 are shared among four pixels, the transistors 44 to 46 may be shared among two pixels, three pixels, or five or more pixels. Note that this configuration can be optionally combined with any of the configurations in FIGS. 13A to 13C and FIGS. 14A to 14C.

Figure 16:
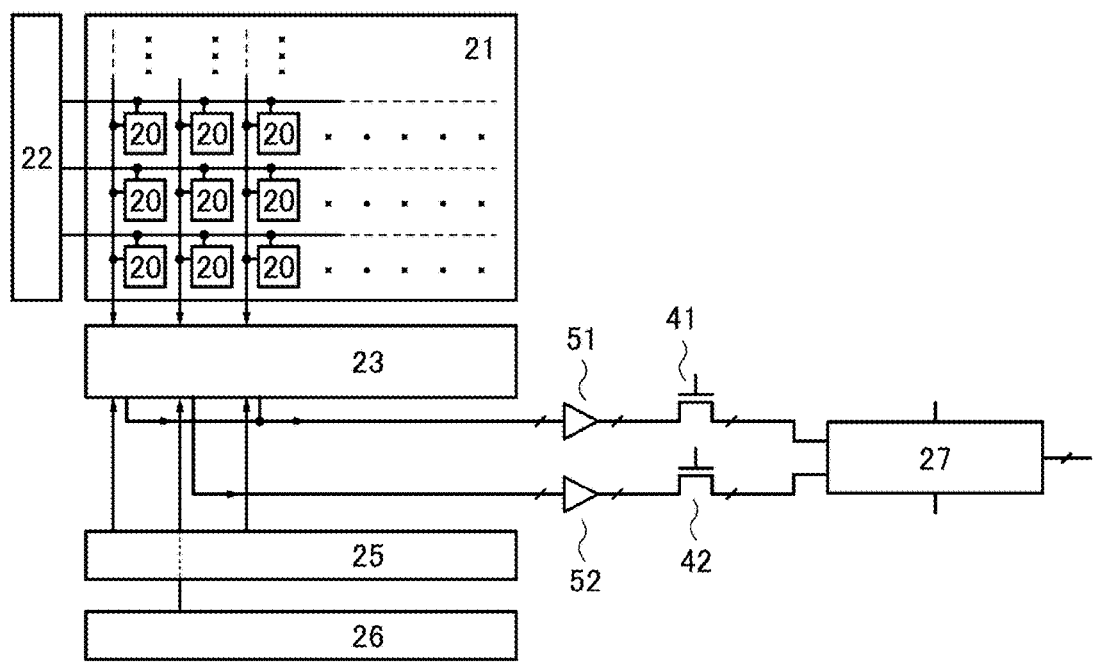
FIG. 16 is a block diagram illustrating an imaging device.
Figure 17:
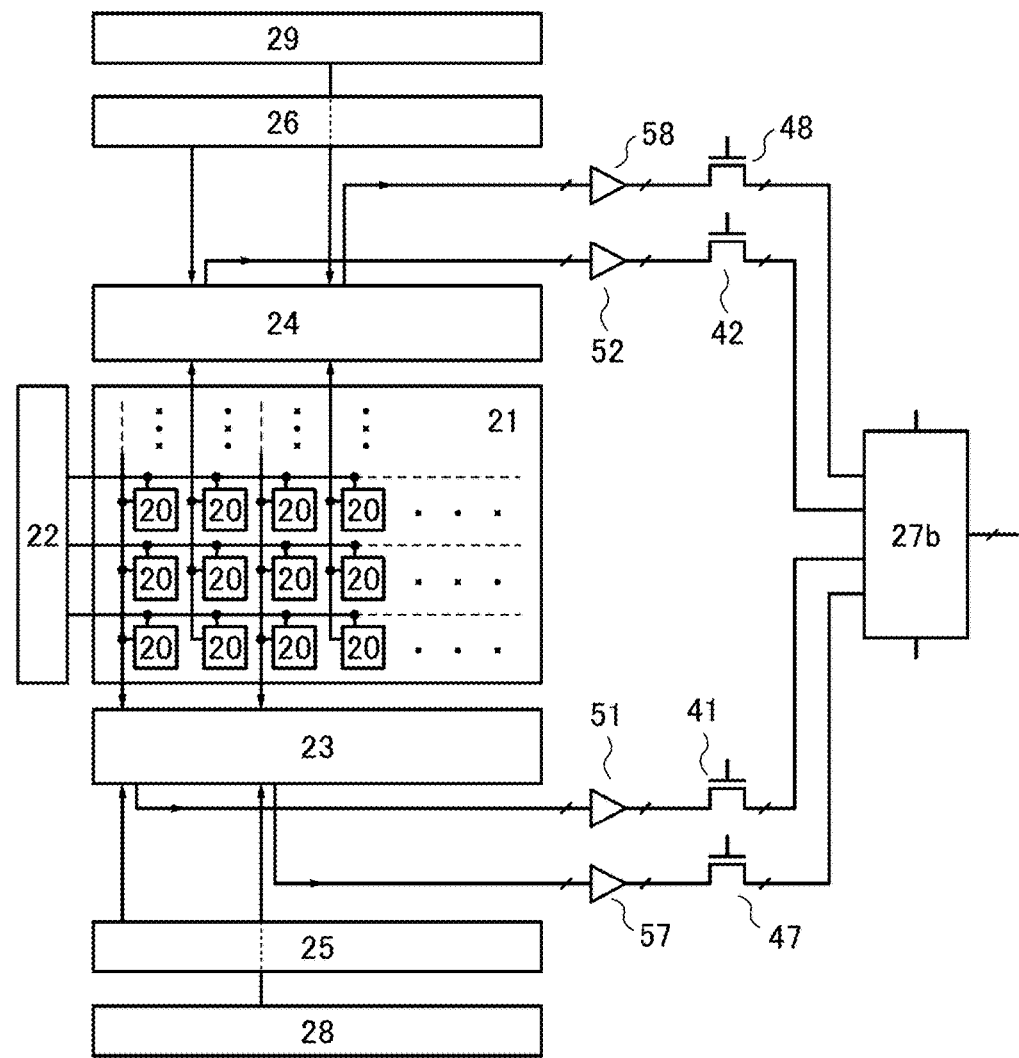
FIG. 17 is a block diagram illustrating an imaging device.
Figure 18:
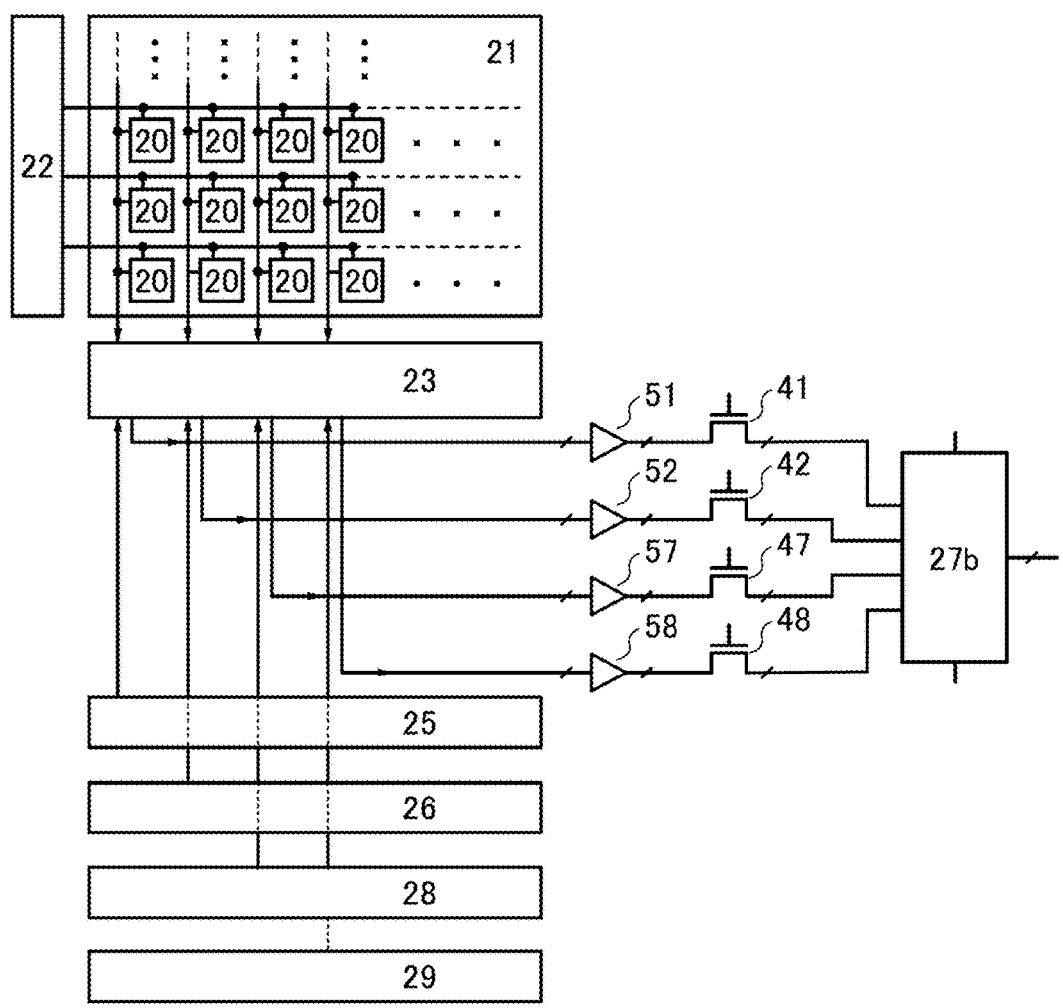
FIG. 18 is a block diagram illustrating an imaging device.

Note that the imaging device of one embodiment of the present invention can also have any of the configurations illustrated in FIG. 16, FIG. 17, and FIG. 18. The imaging device illustrated in FIG. 16 is different from the imaging device illustrated in FIG. 1 in that the circuit 24 is not provided. In the case of this configuration, the circuit 23 doubles as the circuit 24.

The imaging device illustrated in FIG. 17 is different from the imaging device illustrated in FIG. 1 in that the total number of output buses of the A/D converter circuits (the circuits 23 and 24) is four, and circuits 28 and 29 serving as column drivers, transistors 47 and 48, and buffer circuits 57 and 58 are newly provided. In this configuration, data in four columns can be held, which are sequentially read out by a selector circuit 27b. The imaging device illustrated in FIG. 18 is different from the imaging device illustrated in FIG. 17 in that the circuit 24 is not provided. In the case of such a configuration, the circuit 23 doubles as the circuit 24. Note that the transistors 41, 42, 47, and 48 each may have a back gate.

Figure 19A:
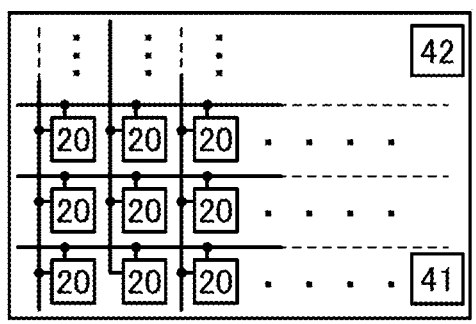
FIGS. 19A to 19C illustrate the structure of an imaging device.

In an imaging device of one embodiment of the present invention, a layered structure of the pixel array 21 and a driver circuit 30 can be employed. In the example of the imaging device illustrated in FIG. 1, the transistors 41 and 42 are preferably provided in the pixel array 21 as well as the pixels 20 as illustrated in the top view of FIG. 19A. In the case where transistors in the pixels 20 are OS transistors, the transistors 41 and 42 can be manufactured through the same steps as the transistors in the pixels 20.

Figure 19B:
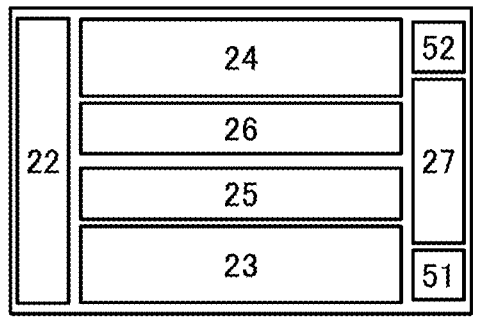

The circuits 22 to 26, the selector circuit 27, and the buffer circuits 51 and 52 are preferably formed using transistors including silicon (hereinafter referred to as Si transistors) in order to achieve both high-speed operation and the structure of a CMOS circuit. For example, the driver circuit 30 having the structure illustrated in the top view of FIG. 19B can be formed, in which the circuits 22 to 26, the selector circuit 27, and the buffer circuits 51 and 52 are provided in a silicon substrate.

Figure 19C:
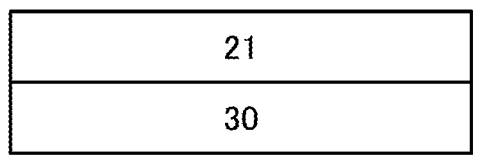

Therefore, a layered structure of the pixel array 21 and the driver circuit 30 illustrated in the front view of FIG. 19C can be formed. With such a structure, transistors suitable for respective elements can be used, and the area of an imaging device can be small. Note that such a layered structure can be employed also for the imaging devices illustrated in FIG. 16, FIG. 17, and FIG. 18.

Figure 20A:
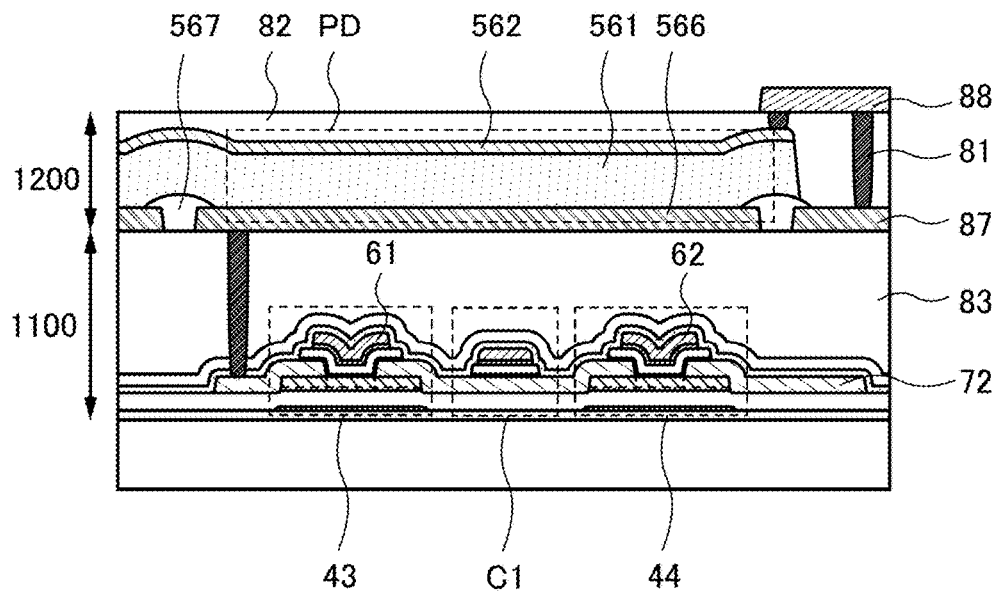
FIGS. 20A to 20C are cross-sectional views each illustrating the structure of an imaging device.

Next, specific structure examples of an imaging device of one embodiment of the present invention are described below with reference to drawings. FIG. 20A illustrates an example of specific connection between the photoelectric conversion element PD, the transistors 43 and 44, and the capacitor C1 which are included in the pixel 20 in FIG. 2. Note that the transistors 45 and 46 are not illustrated in FIG. 20A. The pixel 20 includes a layer 1100 including the transistors 43 to 46 and the capacitor C1 and a layer 1200 including the photoelectric conversion element PD.

Although the wirings, the electrodes, and conductors 81 are illustrated as independent components in cross-sectional views in this embodiment, some of them are provided as one component in some cases when they are electrically connected to each other. In addition, a structure in which a gate electrode, a source electrode, or a drain electrode of the transistor is connected to the wirings through the conductor 81 is only an example, and the gate electrode, the source electrode, and the drain electrode of the transistor might each function as a wiring.

In addition, insulating layers 82 and 83 and the like that function as protective films, interlayer insulating films, or planarization films are provided over the components. For example, an inorganic insulating film such as a silicon oxide film or a silicon oxynitride film can be used as each of the insulating layers 82 and 83 and the like. Alternatively, an organic insulating film such as an acrylic resin film or a polyimide resin film may be used. Top surfaces of the insulating layers 82 and 83 and the like are preferably planarized by chemical mechanical polishing (CMP) or the like as necessary.

In some cases, one or more of the wirings and the like illustrated in the drawing are not provided or a wiring, a transistor, or the like that is not illustrated in the drawing is included in each layer. In addition, a layer that is not illustrated in the drawing might be included. Furthermore, one or more of the layers illustrated in the drawing are not included in some cases.

It is particularly preferable that OS transistors be used for the transistors 41 and 42 which are used for holding output signals of the pixels 20 and the transistors 43 to 46 which are components of the pixel 20.

The period during which charges can be held in the node ND1 and the node ND2 can be extremely long because of low off-state current of the transistors 41 and 42. Therefore, the length of time for data reading to be completed can be long.

Extremely low off-state current of the OS transistor can widen the dynamic range of imaging. In the circuit configuration of the pixel 20 illustrated in FIG. 2, an increase in the intensity of light entering the photoelectric conversion element PD reduces the potential of the node ND0. Since the OS transistor has extremely low off-state current, a current based on a gate potential can be accurately output even when the gate potential is extremely low. Thus, it is possible to widen the detection range of illuminance, i.e., the dynamic range.

A period during which charge can be held in the node ND0 can be extremely long owing to the low off-state current of the transistors 43 and 44. Therefore, a global shutter system in which accumulation operation is performed in all the pixels at the same time can be used without a complicated circuit structure and operation method.

In general, in an imaging device where pixels are arranged in a matrix, a rolling shutter system is employed in which imaging operation 12, retention operation 13, and read operation 14 are performed row by row as illustrated in FIG.

21A. In the case of employing the rolling shutter system, simultaneousness of imaging is lost. Therefore, when an object moves, an image is distorted.

Figure 21A:
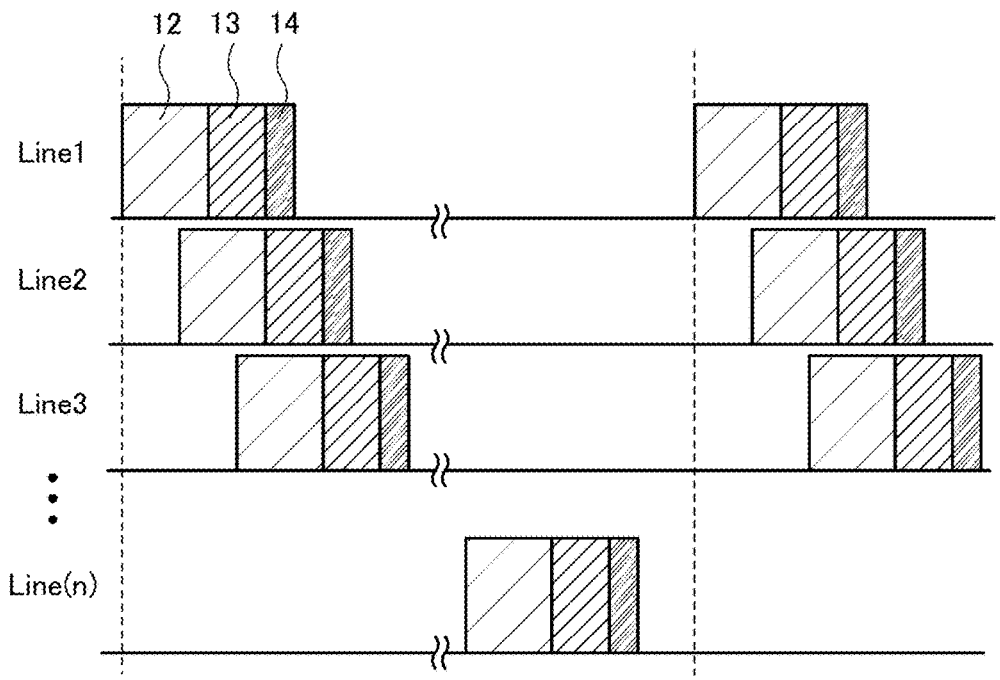
FIGS. 21A and 21B show operations of a rolling shutter system and a global shutter system, respectively.
Figure 21B:
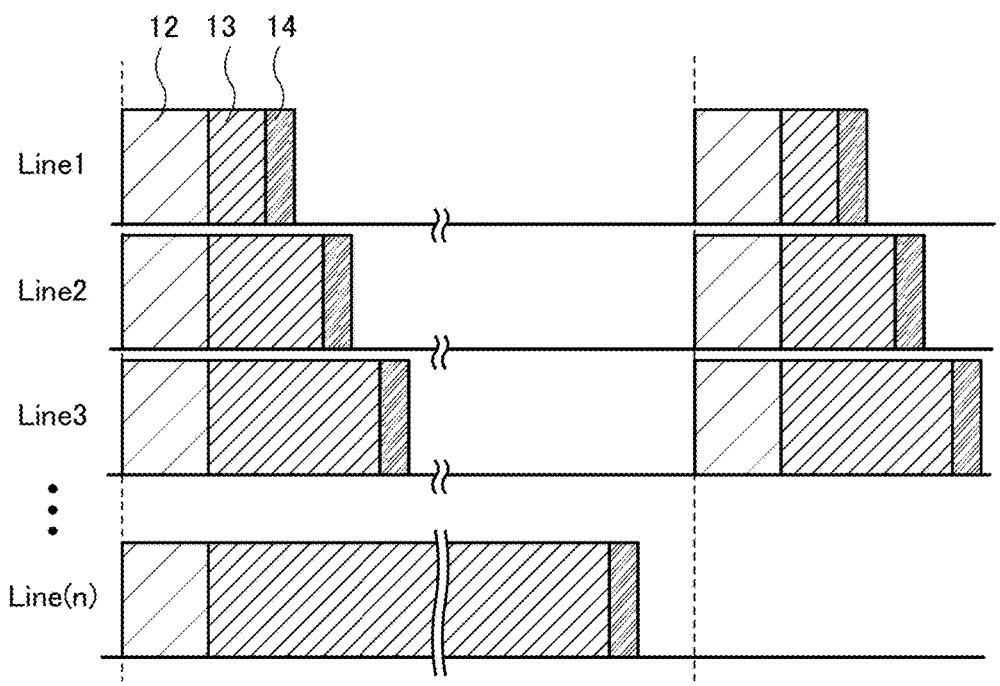

As a result, in one embodiment of the present invention, it is preferable to employ a global shutter system in which the imaging operation 12 and the retention operation 13 can be performed simultaneously in all the rows and the read operation 14 can be sequentially performed row by row as illustrated in FIG. 21B. By employing the global shutter system, simultaneousness of imaging in all the pixels in the imaging device can be secured, and an image with little distortion can be easily obtained even when an object moves.

In addition, the OS transistor has lower temperature dependence of change in electrical characteristics than a transistor including silicon in an active region or an active layer, and thus can be used in an extremely wide range of temperatures. Therefore, an imaging device and a semiconductor device that include OS transistors are suitable for use in automobiles, aircrafts, and spacecrafts.

Moreover, the OS transistor has higher drain breakdown voltage than the Si transistor. In a photoelectric conversion element including a selenium-based material in a photoelectric conversion layer, a relatively high voltage (e.g., 10 V or more) is preferably applied to easily cause an avalanche phenomenon. Therefore, by combination of the OS transistor and the photoelectric conversion element including a selenium-based material in the photoelectric conversion layer, a highly reliable imaging device can be obtained.

Figure 20B:
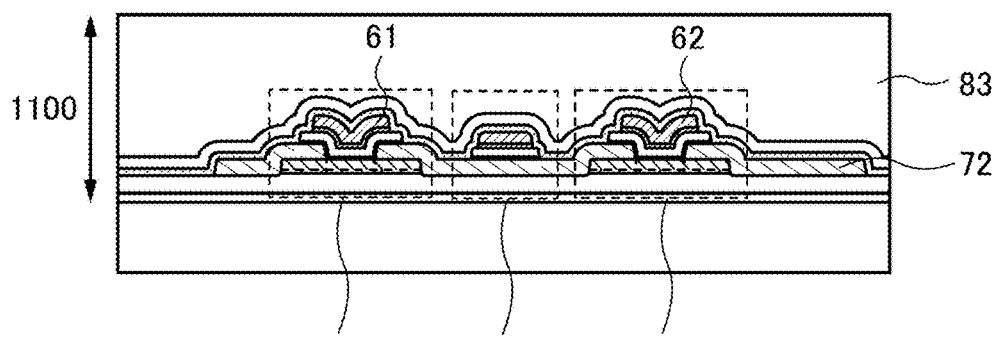
Figure 20C:
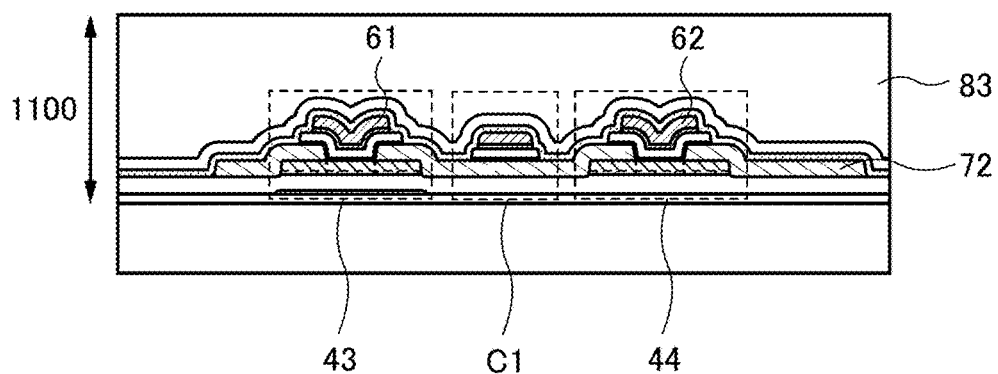

Note that although each transistor includes a back gate in FIG. 20A, each transistor does not necessarily include a back gate as illustrated in FIG. 20B. Alternatively, as illustrated in FIG. 20C, one or more transistors, for example, only the transistor 43 may include a back gate. The back gate might be electrically connected to a front gate of the transistor, which is provided to face the back gate. Alternatively, different fixed potentials might be supplied to the back gate and the front gate. Note that the presence or absence of the back gate can also be applied to another pixel described in this embodiment.

A variety of elements can be used as the photoelectric conversion element PD provided in the layer 1200. FIG. 20A illustrates the photoelectric conversion element PD including a selenium-based material for a photoelectric conversion layer 561. The photoelectric conversion element PD including a selenium-based material has high external quantum efficiency with respect to visible light. The photoelectric conversion element PD including a selenium-based material can be a highly sensitive sensor in which the amount of amplification of electrons with respect to the amount of incident light is large because of an avalanche phenomenon. In other words, the use of a selenium-based material for the photoelectric conversion layer 561 allows a sufficient amount of photocurrent to be obtained even when the pixel area is reduced. Moreover, the photoelectric conversion element PD including a selenium-based material is also suitable for image-capturing in a low-illuminance environment.

Amorphous selenium or crystalline selenium can be used as the selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity to and a higher absorption coefficient for visible light than amorphous selenium.

Figure 56:
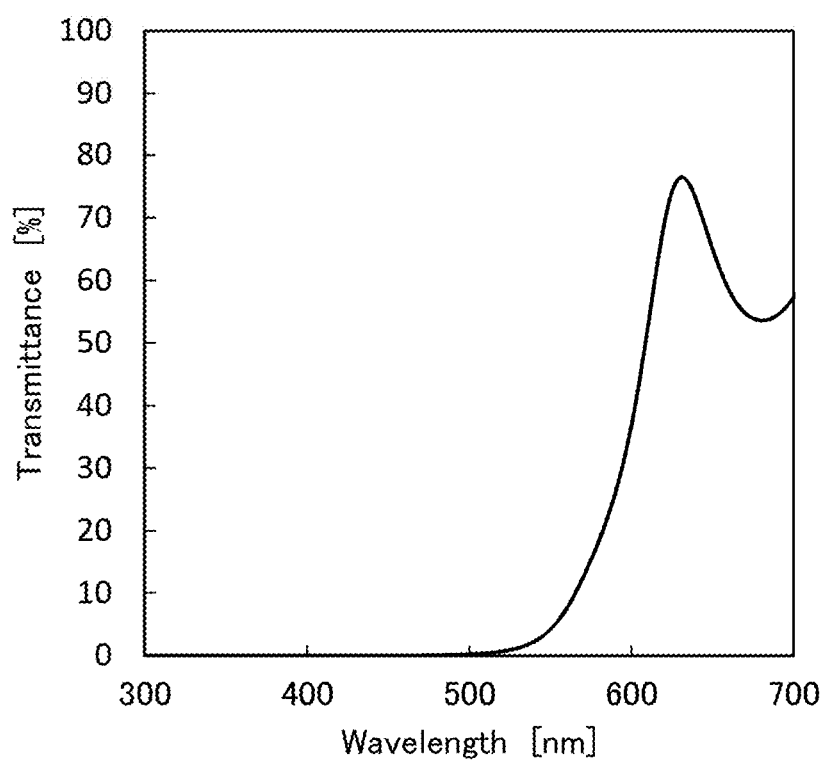
FIG. 56 is a graph showing the spectral transmittance of an amorphous selenium film.

Furthermore, the selenium-based material has a high light-absorption coefficient, making the photoelectric conversion layer 561 thin easily. FIG. 56 shows the spectral transmittance of 500-nm-thick amorphous selenium formed over a glass substrate. As can be seen from this graph, amorphous selenium hardly transmits light having a wavelength of 500 nm or less even with a thickness of 500 nm. Therefore, stray light passing through the photoelectric conversion layer can be reduced, and a change in the characteristics of the transistors due to light with a short wavelength like such stray light can be prevented.

Although the photoelectric conversion layer 561 is illustrated as a single layer, gallium oxide, cerium oxide, or the like as a hole-blocking layer may be provided on the light reception side of the selenium-based material, and nickel oxide, antimony sulfide, or the like as an electron-blocking layer may be provided on an electrode 566 side.

Furthermore, the photoelectric conversion layer 561 may be a layer including a compound of copper, indium, and selenium (CIS). Alternatively, a layer including a compound of copper, indium, gallium, and selenium (CIGS) may be used. A photoelectric conversion element including the CIS layer or the CIGS layer can also utilize an avalanche phenomenon like the photoelectric conversion element including selenium alone.

In the photoelectric conversion element PD using the selenium-based material, for example, the photoelectric conversion layer 561 can be provided between a light-transmitting conductive layer 562 and the electrode 566 formed using a metal material or the like. Furthermore, CIS and CIGS are p-type semiconductors, and an n-type semiconductor such as cadmium sulfide or zinc sulfide may be provided in contact with the p-type semiconductor in order to form a junction.

It is preferable to apply a relatively high voltage (e.g., 10 V or higher) to the photoelectric conversion element in order to cause the avalanche phenomenon. Since the OS transistor has higher drain breakdown voltage than the Si transistor, the application of a relatively high voltage to the photoelectric conversion element is easy. Thus, by combination of the OS transistor having high drain breakdown voltage and the photoelectric conversion element including the selenium-based material in the photoelectric conversion layer, a highly sensitive and highly reliable imaging device can be obtained.

Figure 22A:
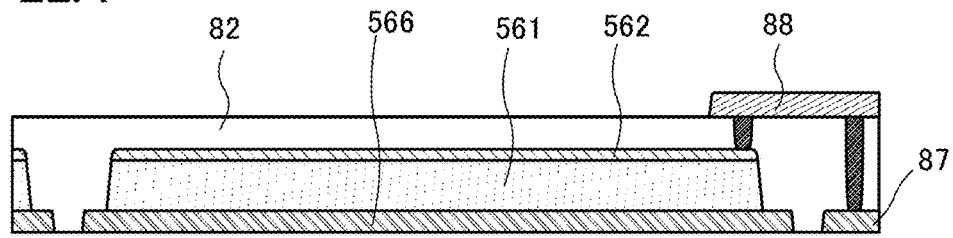
FIGS. 22A to 22D are cross-sectional views each illustrating connection of a photoelectric conversion element.
Figure 22B:
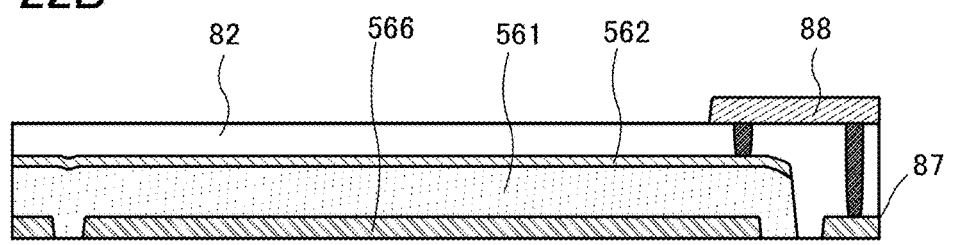
Figure 22C:
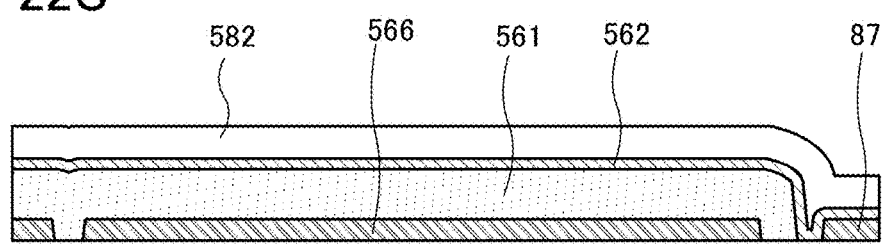
Figure 22D:
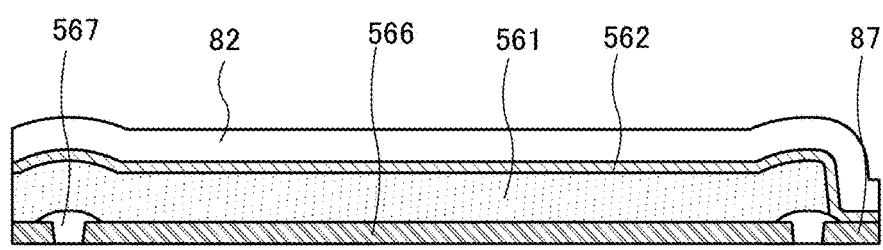

Although the photoelectric conversion layer 561 and the light-transmitting conductive layer 562 are not divided between pixel circuits in FIG. 20A, they may be divided between circuits as illustrated in FIG. 22A. In a region between pixels where the electrode 566 is not provided, a partition wall 567 formed of an insulator is preferably provided, thereby preventing generation of a crack in the photoelectric conversion layer 561 and the light-transmitting conductive layer 562. However, the partition wall 567 is not necessarily provided as illustrated in FIG. 22B. Although the light-transmitting conductive layer 562 and a wiring 87 are connected to each other through a wiring 88 and the conductor 81 in FIG. 20A, the light-transmitting conductive layer 562 and the wiring 87 may be in direct contact with each other as in FIGS. 22C and 22D.

Figure 23A:
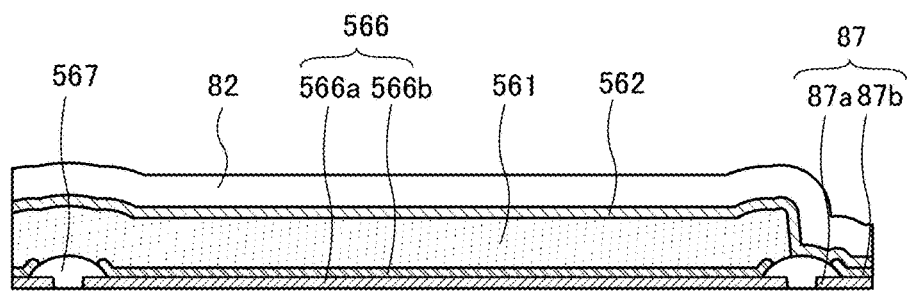
FIGS. 23A and 23B are cross-sectional views each illustrating connection of a photoelectric conversion element.

The electrode 566, the wiring 87, and the like may each be a multilayer. For example, as illustrated in FIG. 23A, the electrode 566 can include two conductive layers 566a and 566b and the wiring 87 can include two conductive layers 87a and 87b. In the structure in FIG. 23A, for example, the conductive layers 566a and 87a may be made of a low-resistance metal or the like, and the conductive layers 566b and 87*b* may be made of a metal or the like that exhibits an excellent contact property with the photoelectric conversion layer 561. Such a structure improves the electrical properties of the photoelectric conversion element PD. Furthermore, even when the conductive layer 87*a* contains a metal that causes electrolytic corrosion, which occurs when some kinds of metal are in contact with the light-transmitting conductive layer 562, the electrolytic corrosion can be prevented because the conductive layer 87*b* is between the conductive layer 87*a* and the light-transmitting conductive layer 562.

The conductive layers 566*b* and 87*b* can be formed using, for example, molybdenum, tungsten, or the like. The conductive layers 566*a* and 87*a* can be formed using, for example, aluminum, titanium, or a stack of titanium, aluminum, and titanium that are layered in that order.

Figure 23B:
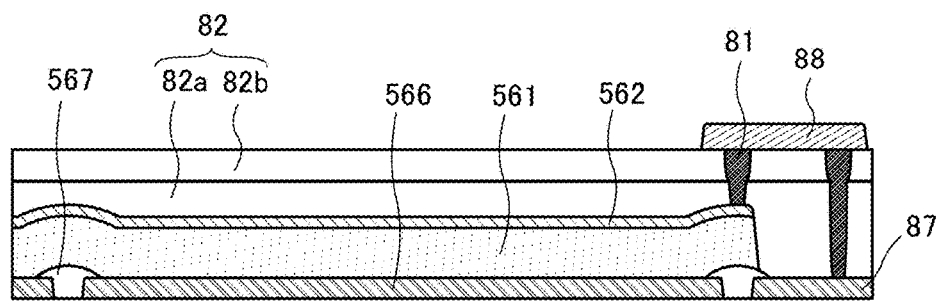

The insulating layer 82 and the like may each be a multilayer. For example, as illustrated in FIG. 23B, the conductor 81 has a difference in level in the case where the insulating layer 82 includes insulating layers 82*a* and 82*b* that have different etching rates. In the case where another insulating layer used as an interlayer insulating film or a planarization film is a multilayer, the conductor 81 also has a difference in level. Although the insulating layer 82 is formed using two layers here, the insulating layer 82 and another insulating layer may each be formed using three or more layers.

Note that the partition wall 567 can be formed using an inorganic insulator, an insulating organic resin, or the like. The partition wall 567 may be colored black or the like in order to shield the transistors and the like from light and/or to determine the area of a light-receiving portion in each pixel.

Alternatively, a PIN diode element formed using an amorphous silicon film, a microcrystalline silicon film, or the like may be used as the photoelectric conversion element PD.

Figure 24:
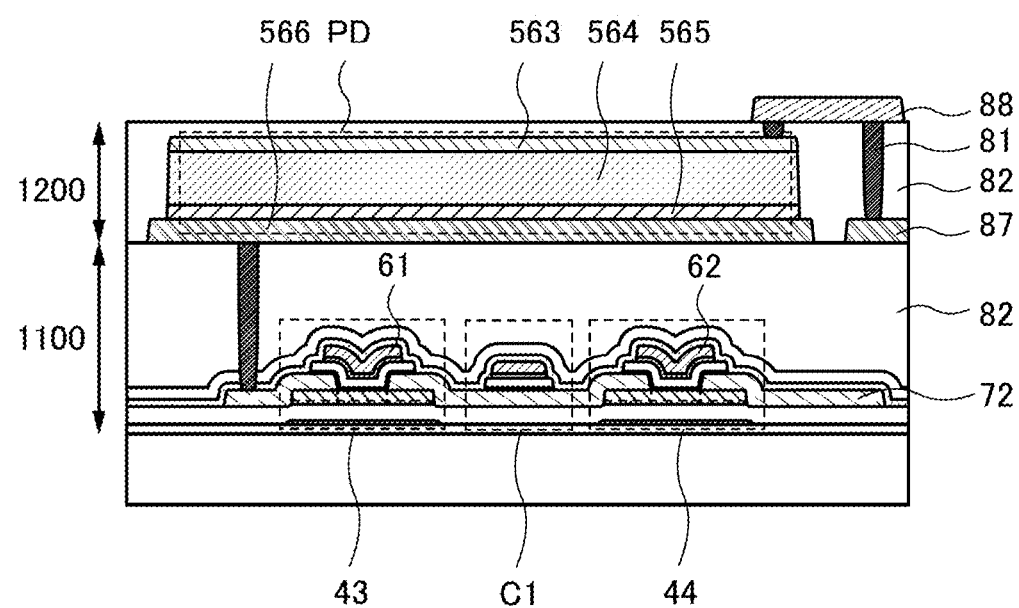
FIG. 24 is a cross-sectional view illustrating an imaging device.

FIG. 24 illustrates an example in which a thin film PIN photodiode is used as the photoelectric conversion element PD. In the photodiode, an n-type semiconductor layer 565, an i-type semiconductor layer 564, and a p-type semiconductor layer 563 are stacked in that order. The i-type semiconductor layer 564 is preferably formed using amorphous silicon. The p-type semiconductor layer 563 and the n-type semiconductor layer 565 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and therefore can easily sense weak visible light.

In the photoelectric conversion element PD in FIG. 24, the n-type semiconductor layer 565 functioning as a cathode is electrically connected to the electrode 566 that is electrically connected to the transistor 41. Furthermore, the p-type semiconductor layer 563 functioning as an anode is electrically connected to the wiring 87 through the conductor 81.

Note that as illustrated in FIG. 13A, the photoelectric conversion element PD may be connected in a manner opposite to that illustrated in FIG. 2. Therefore, in FIG. 24, the anode and the cathode of the photoelectric conversion element PD are connected to the electrode layer and the wiring in a manner opposite to that in FIG. 2 in some cases.

In any case, the photoelectric conversion element PD is preferably formed so that the p-type semiconductor layer 563 serves as a light-receiving surface. When the p-type semiconductor layer 563 serves as a light-receiving surface, the output current of the photoelectric conversion element PD can be increased.

FIGS. 25A to 25F show other examples of the structure of the photoelectric conversion element PD having a configuration of a PIN thin film photodiode and the connection between the photoelectric conversion element PD and the wirings. Note that the structure of the photoelectric conversion element PD and the connection between the photoelectric conversion element PD and the wirings are not limited thereto, and other configurations may be applied.

Figure 25A:
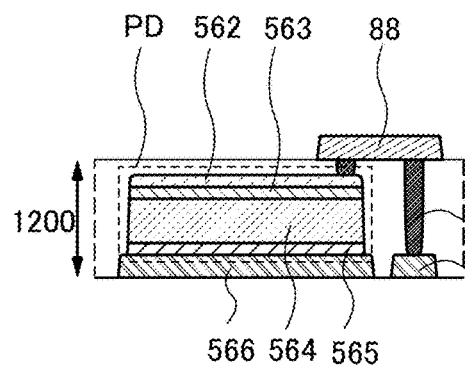
FIGS. 25A to 25F are cross-sectional views each illustrating connection of a photoelectric conversion element.

FIG. 25A illustrates a structure of the photoelectric conversion element PD that includes the light-transmitting conductive layer 562 in contact with the p-type semiconductor layer 563. The light-transmitting conductive layer 562 serves as an electrode and can increase the output current of the photoelectric conversion element PD.

For the light-transmitting conductive layer 562, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. The light-transmitting conductive layer 562 is not limited to a single layer, and may be a stacked layer of different films.

Figure 25B:
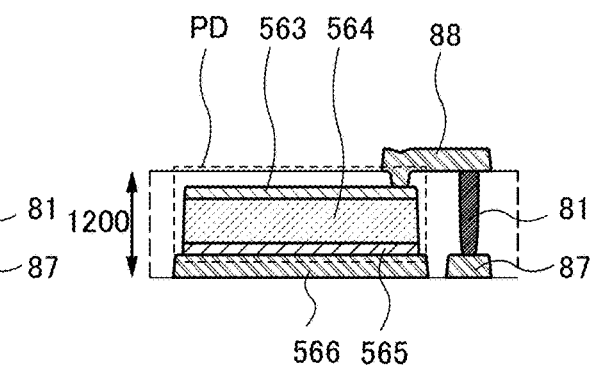

FIG. 25B illustrates a structure of the photoelectric conversion element PD in which the p-type semiconductor layer 563 is electrically connected directly to the wiring 88.

Figure 25C:
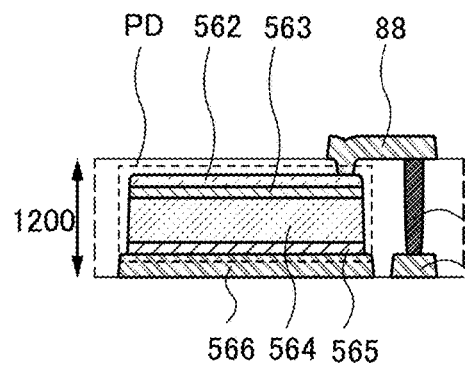

FIG. 25C illustrates a structure of the photoelectric conversion element PD which includes the light-transmitting conductive layer 562 in contact with the p-type semiconductor layer 563 and in which the wiring 87 is electrically connected to the light-transmitting conductive layer 562.

Figure 25D:
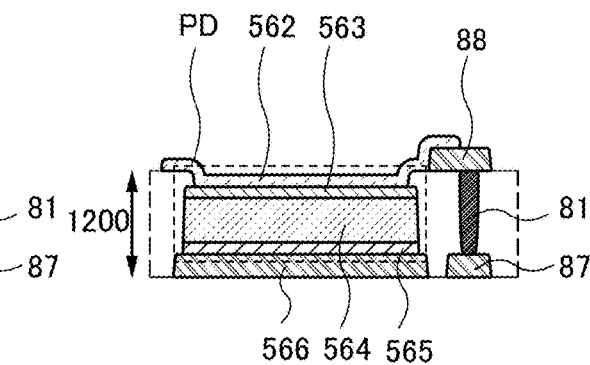

FIG. 25D illustrates a structure in which an opening exposing the p-type semiconductor layer 563 is provided in an insulating layer covering the photoelectric conversion element PD, and the light-transmitting conductive layer 562 that covers the opening is electrically connected to the wiring 88.

Figure 25E:
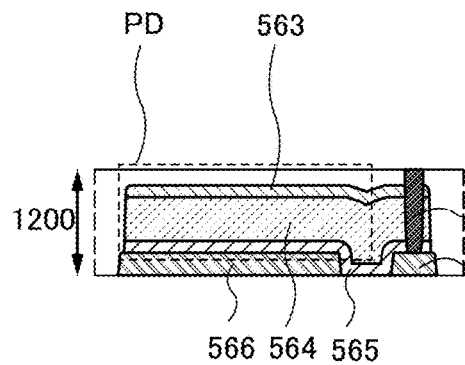

FIG. 25E illustrates a structure including the conductor 81 which penetrates the photoelectric conversion element PD. In the structure, the wiring 87 is electrically connected to the p-type semiconductor layer 563 through the conductor 81. Note that in the drawing, the wiring 87 appears to be electrically connected to the electrode 566 through the n-type semiconductor layer 563. However, because of a high resistance in the lateral direction of the n-type semiconductor layer 563, the resistance between the wiring 87 and the electrode 566 is extremely high when there is an appropriate distance therebetween. Thus, the photoelectric conversion element PD can have diode characteristics without a short circuit between the anode and the cathode. Note that two or more conductors 81 that are electrically connected to the p-type semiconductor layer 563 may be provided.

Figure 25F:
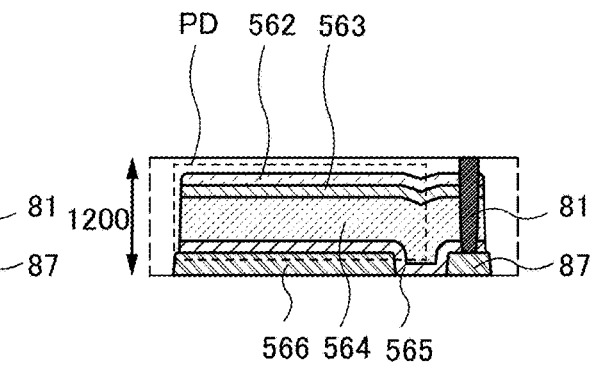

FIG. 25F illustrates a structure in which the photoelectric conversion element PD in FIG. 25E is provided with the light-transmitting conductive layer 562 in contact with the p-type semiconductor layer 563.

Note that each of the photoelectric conversion elements PD illustrated in FIGS. 25D to 25F has an advantage of having a large light-receiving area because wirings and the like do not overlap with a light-receiving region.

Figure 26:
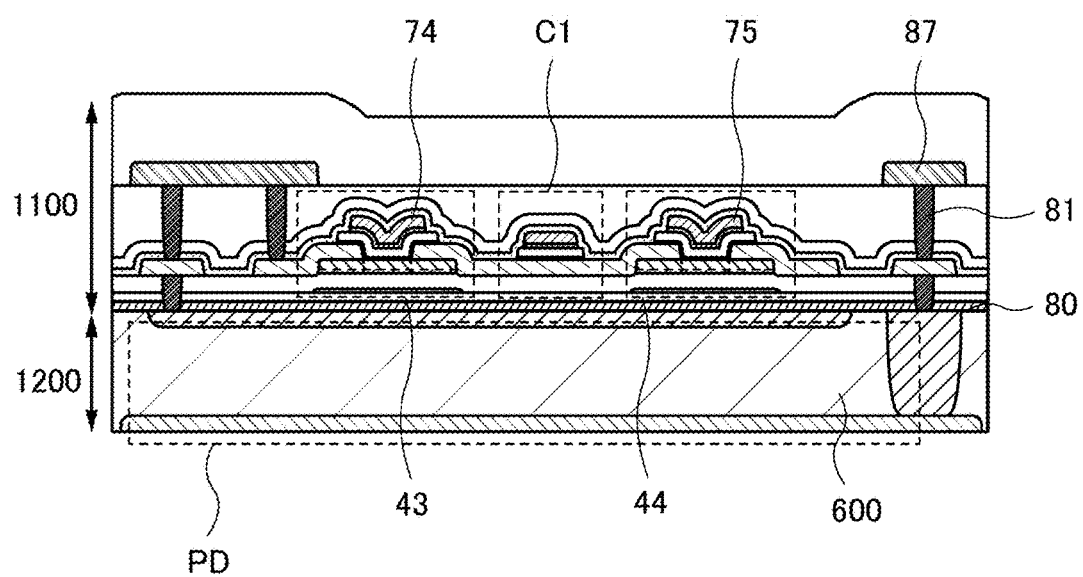
FIG. 26 is a cross-sectional view illustrating an imaging device.

Alternatively, as illustrated in FIG. 26, the photoelectric conversion element PD may be a photodiode including a silicon substrate 600 as a photoelectric conversion layer.

The photoelectric conversion element PD including the aforementioned selenium-based material, amorphous silicon, or the like can be formed through general semiconductor manufacturing processes such as a deposition process, a lithography process, and an etching process. In addition, because the resistance of the selenium-based material is high, the photoelectric conversion layer 561 does not need to be divided between circuits as illustrated in FIG. 20A. Therefore, the imaging device of one embodiment of the present invention can be manufactured with a high yield at low cost. In contrast, a photodiode including the silicon substrate 600 as the photoelectric conversion layer requires difficult processes such as a polishing process and a bonding process.

Figure 27A:
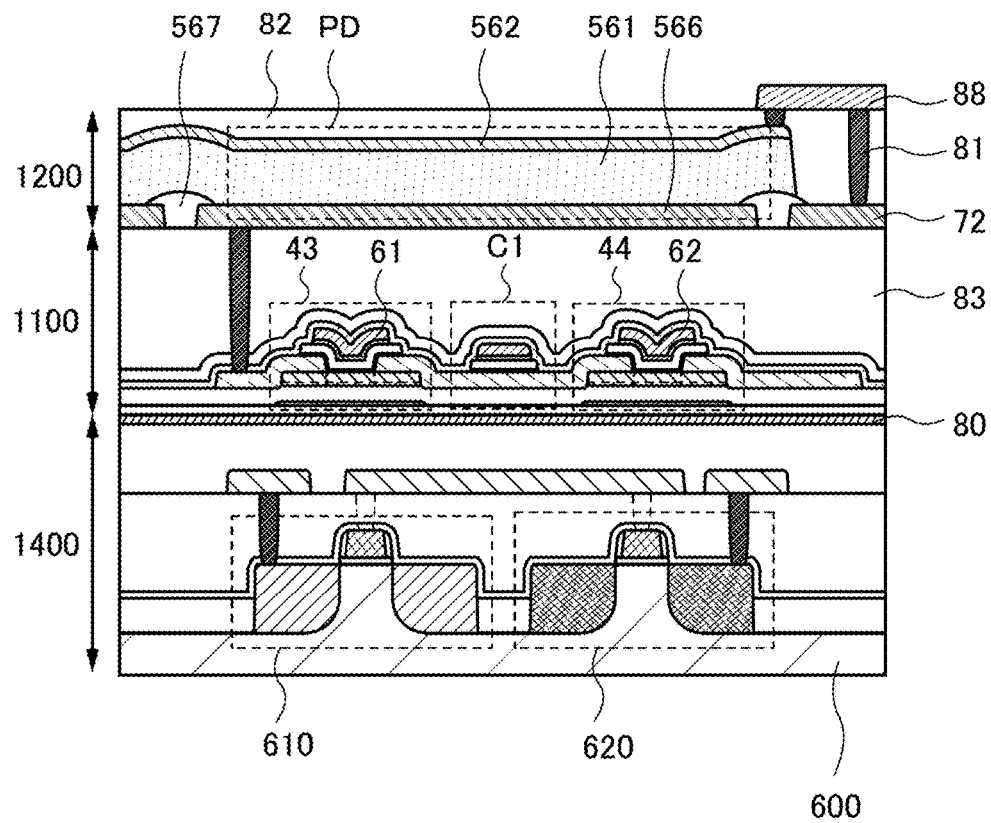
FIGS. 27A and 27B are cross-sectional views illustrating an imaging device.
Figure 27B:
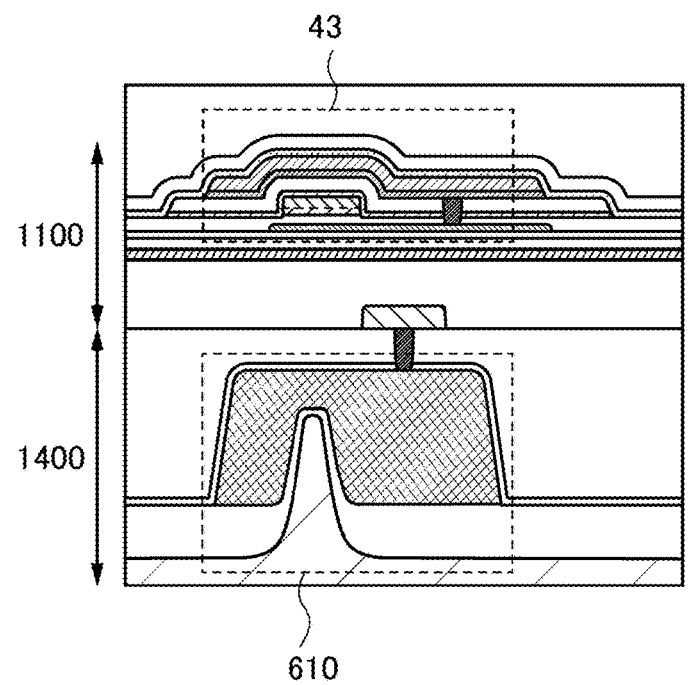

Furthermore, in the imaging device of one embodiment of the present invention, a stack including the silicon substrate 600 in which a circuit is formed may be used. For example, as illustrated in FIG. 27A, the pixel circuit may overlap with a layer 1400 that includes transistors 610 and 620 whose active regions are formed in the silicon substrate 600. FIG. 27B is a cross-sectional view illustrating the transistors in the channel width direction.

Figure 28A:
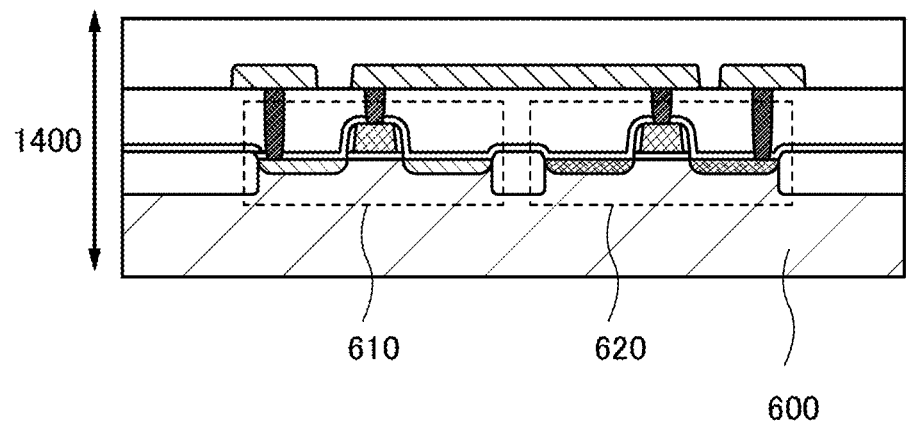
FIGS. 28A to 28C are cross-sectional views and a circuit diagram illustrating imaging devices.
Figure 28B:
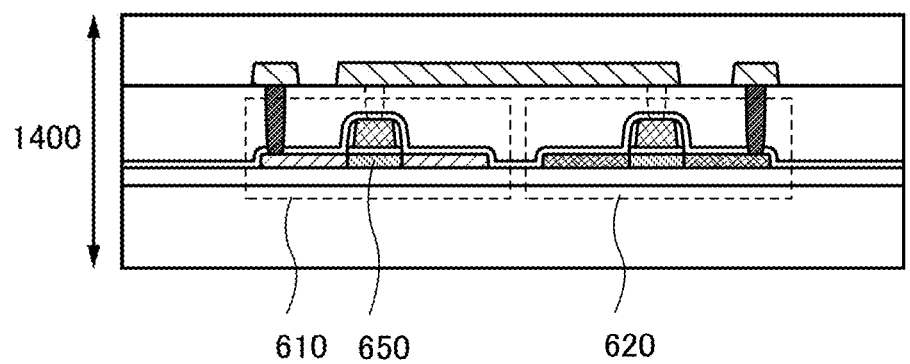

Although FIGS. 27A and 27B show the Si transistors of a fin type, the transistors may be of a planar type as illustrated in FIG. 28A. Alternatively, as illustrated in FIG. 28B, they may be transistors each including an active layer 650 formed using a silicon thin film. The active layer 650 can be formed using polycrystalline silicon or single crystal silicon of a silicon-on-insulator (SOI) structure.

Figure 28C:
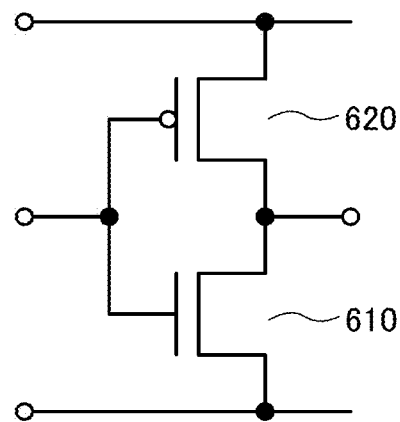

The circuit formed on the silicon substrate 600 is capable of reading a signal output from the pixel circuit and converting the signal; for example, the circuit may include a CMOS inverter as illustrated in the circuit diagram in FIG. 28C. A gate of the transistor 610 (n-channel transistor) is electrically connected to a gate of the transistor 620 (p-channel transistor). One of a source and a drain of one of the transistors 610 and 620 is electrically connected to one of a source and a drain of the other transistor. The other of the source and the drain of the one transistor is electrically connected to a wiring and the other of the source and the drain of the other transistor is electrically connected to another wiring.

Note that the circuit formed on the silicon substrate 600 corresponds to each of the circuit 23, the circuit 24, the circuit 25, the circuit 26, the selector circuit 27, the buffer circuit 51, and the buffer circuit 52 illustrated in FIG. 1, for example.

The silicon substrate 600 is not limited to a bulk silicon substrate and can be a substrate made of germanium, silicon germanium, silicon carbide, gallium arsenide, aluminum gallium arsenide, indium phosphide, gallium nitride, or an organic semiconductor.

Here, as illustrated in FIG. 26 and FIG. 27A, an insulating layer 80 is provided between a region including an oxide semiconductor transistor and a region including a Si device (a Si transistor or a Si photodiode).

Dangling bonds of silicon are terminated with hydrogen in insulating layers provided in the vicinities of the active regions of the transistors 610 and 620. Therefore, hydrogen has an effect of improving the reliability of the transistors 610 and 620. Meanwhile, hydrogen in insulating layers provided in the vicinity of the oxide semiconductor layer that is the active layer of the transistor 43 or the like causes generation of carriers in the oxide semiconductor layer, and therefore may reduce the reliability of the transistor 43 or the like. Thus, the insulating layer 80 having a function of preventing diffusion of hydrogen is preferably provided between one layer including the transistor using a silicon-based semiconductor material and another layer stacked thereon that includes the transistor using an oxide semiconductor. Hydrogen is confined in the one layer by the insulating layer 80, so that the reliability of the transistors 610 and 620 can be improved. Furthermore, diffusion of hydrogen from the one layer to the other layer is inhibited, so that the reliability of the transistor 43 or the like can also be improved.

The insulating layer 80 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Note that as illustrated in FIG. 27A, a circuit (e.g., a driver circuit) formed on the silicon substrate 600, the transistor 43 or the like, and the photoelectric conversion element PD can overlap with each other; thus, the integration degree of pixels can be increased. In other words, the resolution of the imaging device can be increased. Such a structure is suitable for an imaging device with, for example, 4K2K, 8K4K, or 16K8K pixels. Note that a structure may be employed in which a Si transistor is formed as the transistor 45 or the like included in the pixel 20 so as to overlap with the transistor 43, the transistor 44, the photoelectric conversion element PD, and the like.

Figure 29:
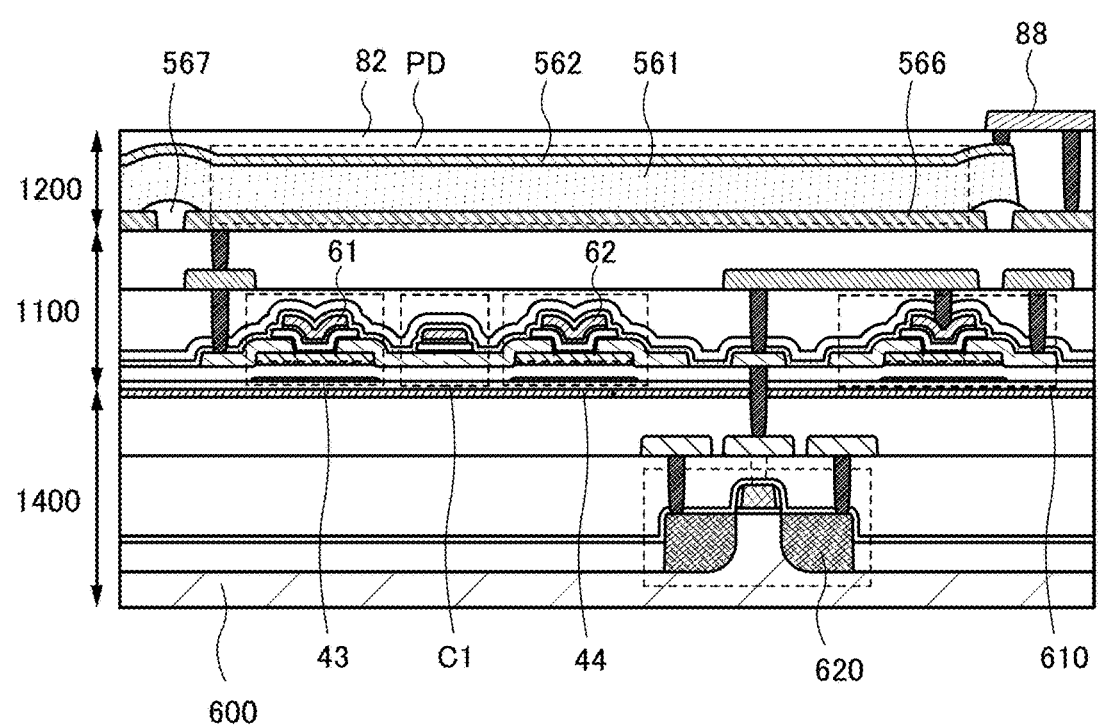
FIG. 29 is a cross-sectional view illustrating an imaging device.

An imaging device of one embodiment of the present invention can also have a structure in FIG. 29.

The imaging device in FIG. 29 is a modification example of the imaging device in FIG. 27A. A CMOS inverter is formed using an OS transistor and a Si transistor.

Here, the transistor 620 is a p-channel Si transistor provided in the layer 1400, and the transistor 610 is an n-channel OS transistor provided in the layer 1100. When only the p-channel transistor is provided on the silicon substrate 600, a step of forming a well, an n-type impurity layer, or the like can be skipped.

Although selenium is used for the photoelectric conversion element PD in the imaging device in FIG. 29, a PIN thin film photodiode may be used as in FIG. 24.

In the imaging device in FIG. 29, the transistor 610 can be formed through the same process as the transistors 43 and 44 formed in the layer 1100. Thus, the manufacturing process of the imaging device can be simplified.

Figure 30:
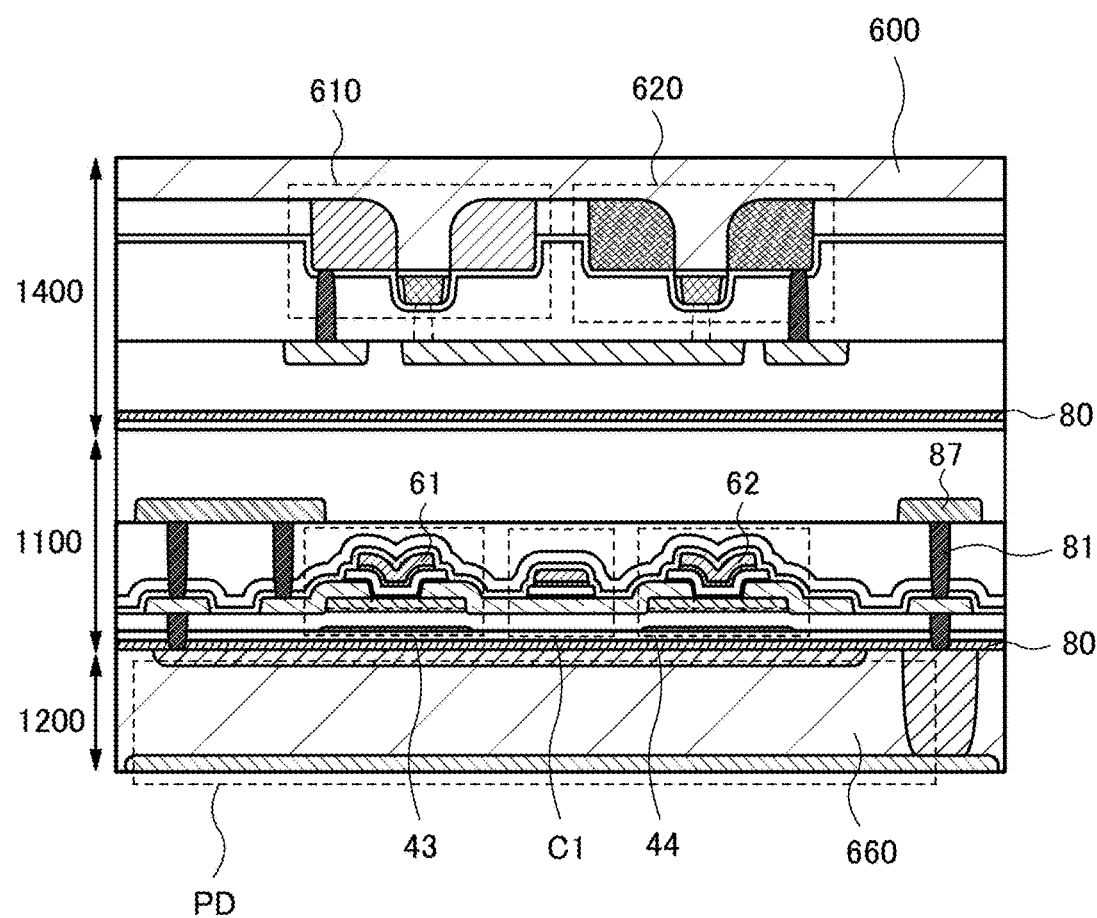
FIG. 30 is a cross-sectional view illustrating an imaging device.

As illustrated in FIG. 30, an imaging device of one embodiment of the present invention may have a structure where a pixel includes the photoelectric conversion element PD formed on a silicon substrate 660 and OS transistors formed over the photoelectric conversion element PD and the pixel and the silicon substrate 600 on which the circuit is formed are attached to each other. Such a structure is suitable for increasing the effective area of the photoelectric conversion element PD formed on the silicon substrate 660. Furthermore, the integration degree of the circuit formed on the silicon substrate 600 can be improved using miniaturized Si transistors; thus, a high-performance semiconductor device can be provided.

Figure 31:
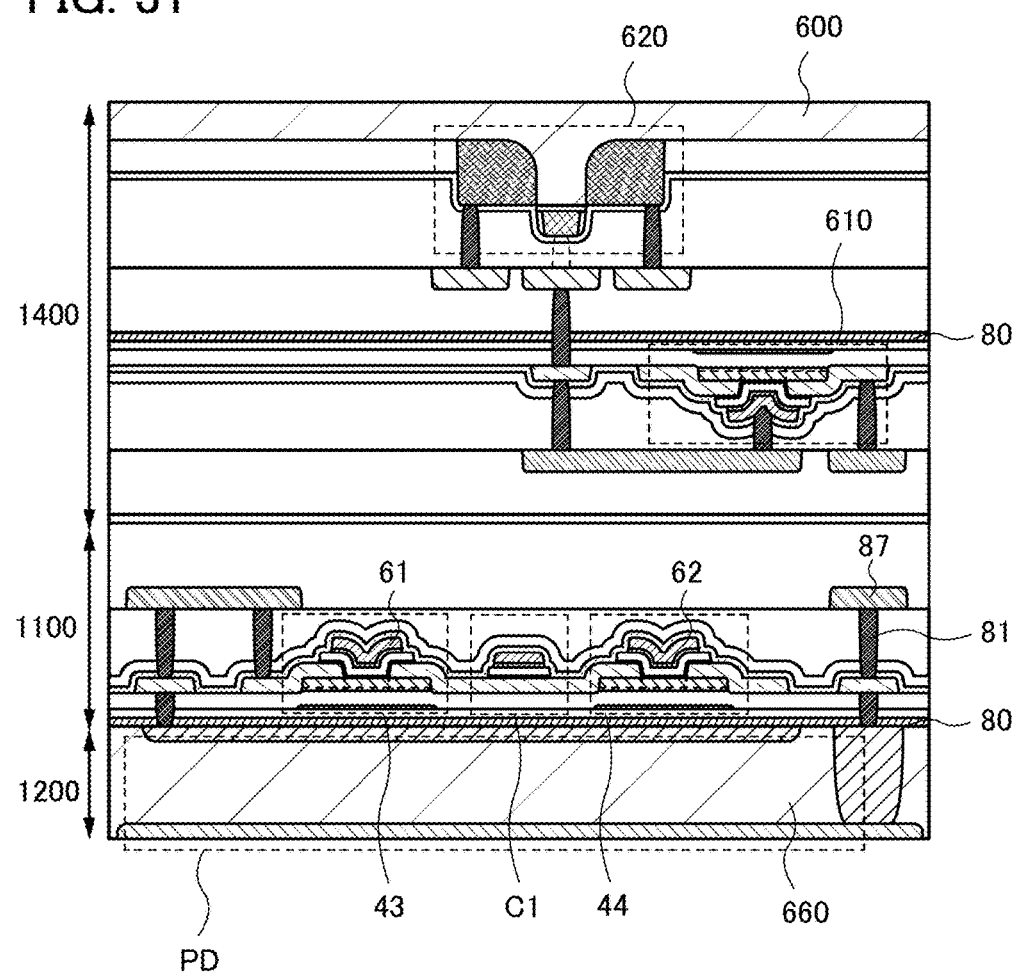
FIG. 31 is a cross-sectional view illustrating an imaging device.
Figure 32:
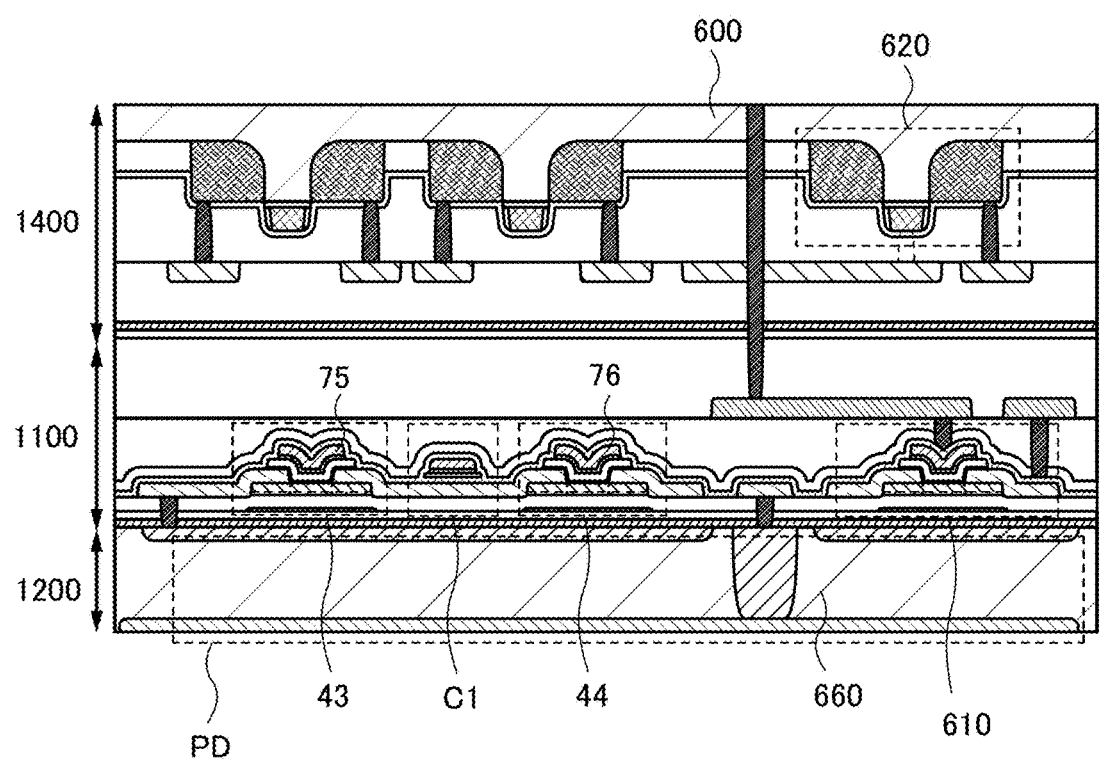
FIG. 32 is a cross-sectional view illustrating an imaging device.

FIG. 31 and FIG. 32 each show a modification example of FIG. 30, in which a circuit includes an OS transistor and a Si transistor. Such a structure is suitable for increasing the effective area of the photoelectric conversion element PD formed on the silicon substrate 660. Furthermore, the integration degree of the circuit formed on the silicon substrate 600 can be improved using miniaturized Si transistors; thus, a high-performance semiconductor device can be provided.

In the case of the structure illustrated in FIG. 31, a CMOS circuit can be formed using the Si transistor on the silicon substrate 600 and the OS transistor thereon. Since the off-state current of the OS transistor is extremely low, the static leakage current of the CMOS circuit can be extremely low.

In the case of the structure illustrated in FIG. 32, a CMOS circuit can be formed using the OS transistor over the silicon substrate 660 and the Si transistor on the silicon substrate 600.

Note that the structure of the transistor and the photoelectric conversion element included in each of the imaging devices described in this embodiment is only an example. Therefore, for example, one or more of the transistors 43 to 46 may include silicon or the like in an active region or an active layer. Furthermore, one of or both the transistors 610 and 620 may include an oxide semiconductor layer as an active layer.

Figure 33A:
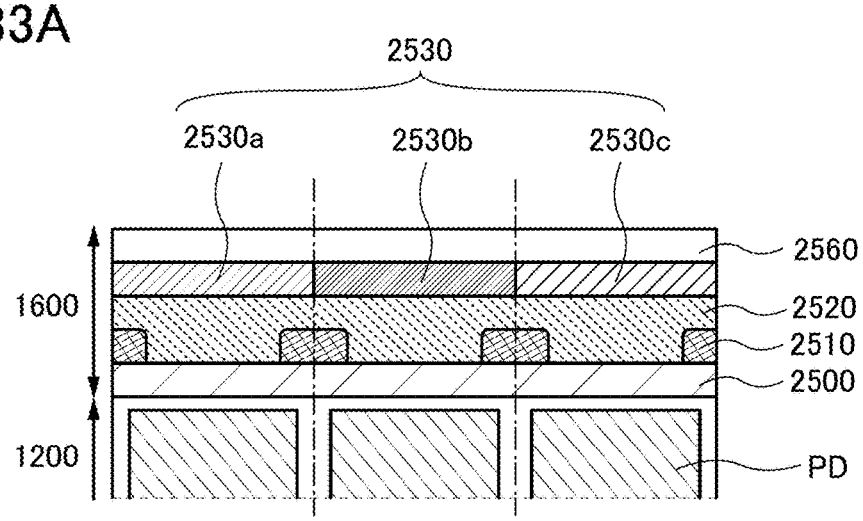
FIGS. 33A to 33C are cross-sectional views each illustrating the structure of an imaging device.

FIG. 33A is a cross-sectional view of an example of a mode in which a color filter and the like are added to the imaging device. The cross-sectional view illustrates part of a region including pixel circuits for three pixels. An insulating layer 2500 is formed over the layer 1200 where the photoelectric conversion element PD is formed. As the insulating layer 2500, for example, a silicon oxide film with a high visible-light transmitting property can be used. In addition, a silicon nitride film may be stacked as a passivation film. In addition, a dielectric film of hafnium oxide or the like may be stacked as an anti-reflection film.

A light-blocking layer 2510 may be formed over the insulating layer 2500. The light-blocking layer 2510 has a function of inhibiting color mixing of light passing through the color filter. The light-blocking layer 2510 can be formed of a metal layer of aluminum, tungsten, or the like, or a stack including the metal layer and a dielectric film functioning as an anti-reflection film.

An organic resin layer 2520 can be formed as a planarization film over the insulating layer 2500 and the light-blocking layer 2510. A color filter 2530 (a color filter 2530*a*, a color filter 2530*b*, and a color filter 2530*c*) is formed in each pixel. For example, the color filter 2530*a*, the color filter 2530*b*, and the color filter 2530*c* each have a color of red (R), green (G), blue (B), yellow (Y), cyan (C), magenta (M), or the like, so that a color image can be obtained.

A light-transmitting insulating layer 2560 or the like can be provided over the color filter 2530.

Figure 33B:
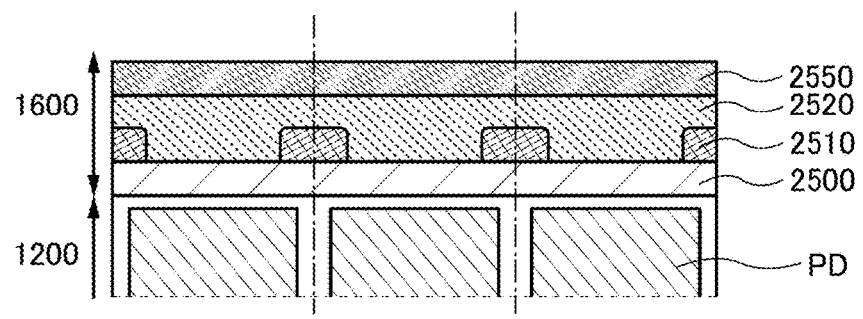

As illustrated in FIG. 33B, an optical conversion layer 2550 may be used instead of the color filter 2530. Such a structure enables the imaging device to take images in various wavelength regions.

For example, when a filter that blocks light having a wavelength shorter than or equal to that of visible light is used as the optical conversion layer 2550, an infrared imaging device can be obtained. When a filter that blocks light having a wavelength shorter than or equal to that of near infrared light is used as the optical conversion layer 2550, a far infrared imaging device can be obtained. When a filter that blocks light having a wavelength longer than or equal to that of visible light is used as the optical conversion layer 2550, an ultraviolet imaging device can be obtained.

Furthermore, when a scintillator is used as the optical conversion layer 2550, an imaging device that takes an image visualizing the intensity of radiation and is used for an X-ray imaging device or the like can be obtained. Radiation such as X-rays passes through a subject to enter a scintillator, and then is converted into light (fluorescence) such as visible light or ultraviolet light owing to a phenomenon known as photoluminescence. Then, the photoelectric conversion element PD detects the light to obtain image data. Furthermore, the imaging device having the structure may be used in a radiation detector or the like.

A scintillator is formed of a substance that, when irradiated with radiation such as X-rays or gamma-rays, absorbs energy of the radiation to emit visible light or ultraviolet light or a material containing the substance. For example, materials such as $Gd_2O_2S:Tb$, $Gd_2O_2S:Pr$, $Gd_2O_2S:Eu$, $BaFCl:Eu$, $NaI$, $CsI$, $CaF_2$, $BaF_2$, $CeF_3$, $LiF$, $LiI$, and $ZnO$ and a resin or ceramics in which any of the materials is dispersed can be used.

In the photoelectric conversion element PD using a selenium-based material, radiation such as X-rays can be directly converted into charge; thus, the scintillator is not necessarily used.

Figure 33C:
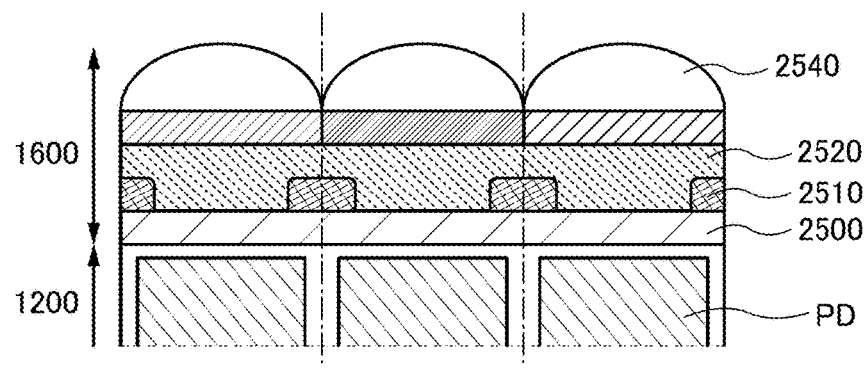

Alternatively, as illustrated in FIG. 33C, a microlens array 2540 may be provided over the color filters 2530*a*, 2530*b*, and 2530*c*. Light penetrating lenses included in the microlens array 2540 goes through the color filters positioned thereunder to reach the photoelectric conversion element PD. Note that a region other than the layer 1200 in FIGS. 33A to 33C is referred to as a layer 1600.

Figure 34:
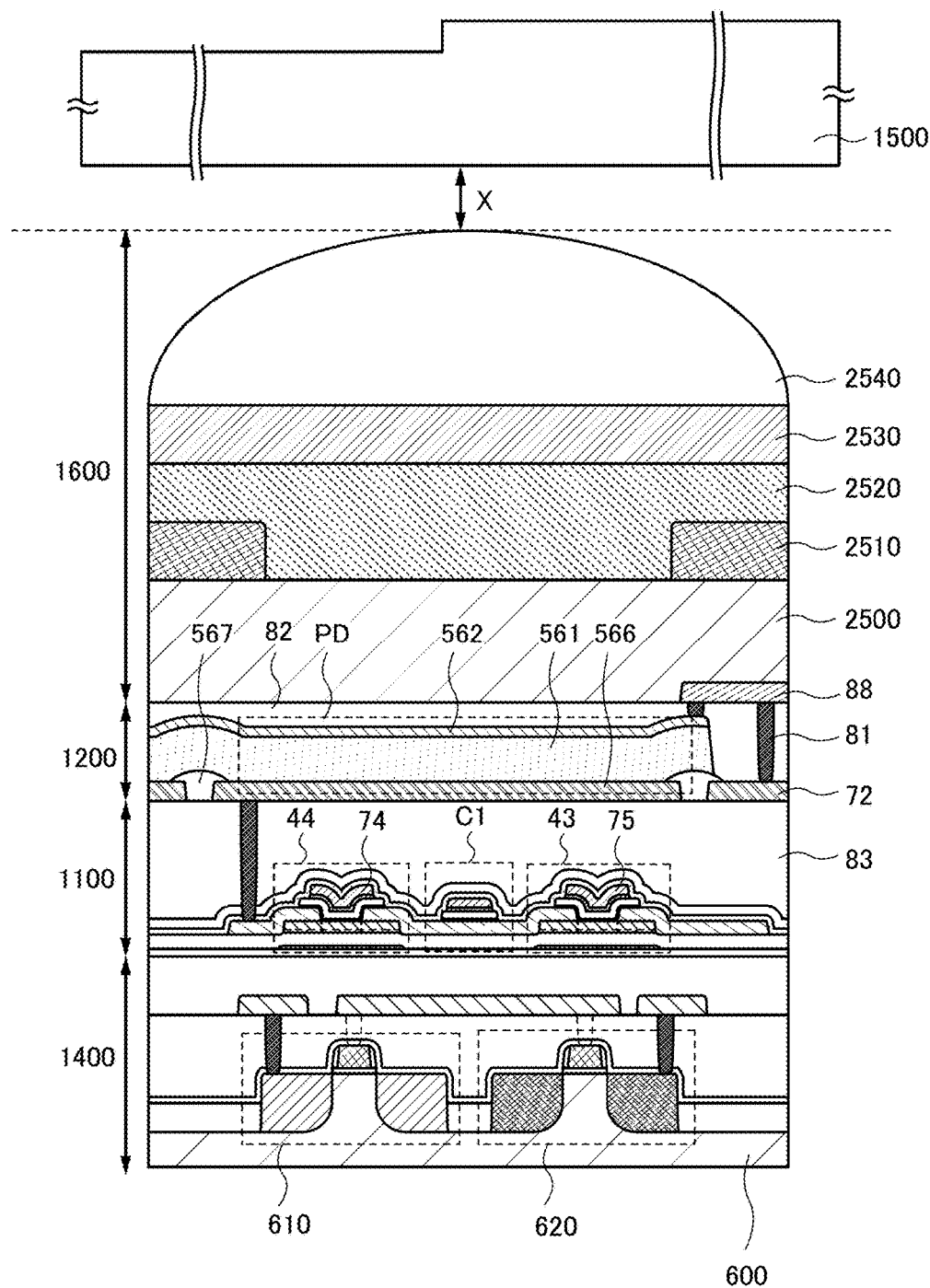
FIG. 34 is a cross-sectional view illustrating the structure of an imaging device.

FIG. 34 illustrates a specific example of a layered structure including the pixel 20 of one embodiment of the present invention, the microlens array 2540 illustrated in FIG. 33C, and the like. In the example illustrated in FIG. 34, the structure of the pixel illustrated in FIG. 27A is used. In the case of using the pixel illustrated in FIG. 26, a structure illustrated in FIG. 35 is employed.

The photoelectric conversion element PD, the circuit of the pixel 20, and the driver circuit can be positioned so as to overlap with each other in this manner, leading to a reduction in the size of the imaging device.

Figure 35:
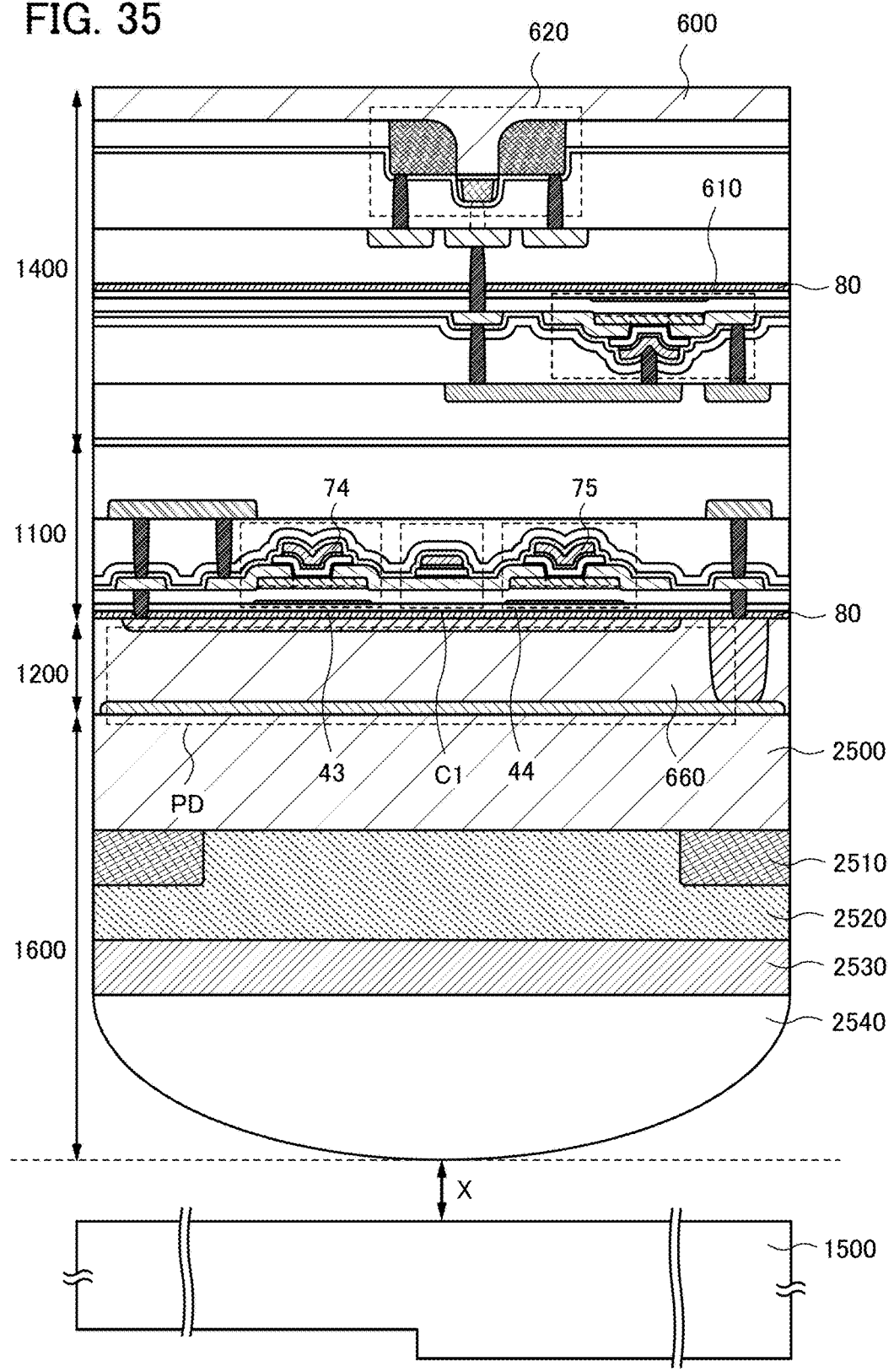
FIG. 35 is a cross-sectional view illustrating the structure of an imaging device.

As illustrated in FIG. 34 and FIG. 35, a diffraction grating 1500 may be provided above the microlens array 2540. An image of an object through the diffraction grating 1500 (i.e., a diffraction pattern) can be scanned into a pixel, and an input image (an object image) can be formed from a captured image in the pixel by arithmetic processing. In addition, the use of the diffraction grating 1500 instead of a lens can reduce the cost of the imaging device.

The diffraction grating 1500 can be formed using a light-transmitting material. An inorganic insulating film such as a silicon oxide film or a silicon oxynitride film can be used, for example. Alternatively, an organic insulating film such as an acrylic resin film or a polyimide resin film may be used. Alternatively, a stack of the inorganic insulating film and the organic insulating film may be used.

In addition, the diffraction grating 1500 can be formed by a lithography process using a photosensitive resin or the like. Alternatively, the diffraction grating 1500 can be formed by a lithography process and an etching process. Alternatively, the diffraction grating 1500 can be formed by nanoimprint lithography, laser scribing, or the like.

Note that a space X may be provided between the diffraction grating 1500 and the microlens array 2540. The space X can be less than or equal to 1 mm, preferably less than or equal to 100 μm. The space may be an empty space or may be a sealing layer or an adhesion layer formed using a light-transmitting material. For example, an inert gas such as nitrogen or a rare gas can be sealed in the space. Alternatively, an acrylic resin, an epoxy resin, a polyimide resin, or the like may be provided in the space. Alternatively, a liquid such as silicone oil may be provided. Even in the case where the microlens array 2540 is not provided, the space X may be provided between the color filter 2530 and the diffraction grating 1500.

As illustrated in FIGS. 36A1 and 36B1, the imaging device may be bent. FIG. 36A1 illustrates a state in which the imaging device is bent in the direction of dashed-two dotted line X1-X2. FIG. 36A2 is a cross-sectional view illustrating a portion indicated by dashed-two dotted line X1-X2 in FIG. 36A1. FIG. 36A3 is a cross-sectional view illustrating a portion indicated by dashed-two dotted line Y1-Y2 in FIG. 36A1.

FIG. 36B1 illustrates a state where the imaging device is bent in the direction of dashed-two dotted line X3-X4 and the direction of dashed-two dotted line Y3-Y4. FIG. 36B2 is a cross-sectional view illustrating a portion indicated by dashed-two dotted line X3-X4 in FIG. 36B1. FIG. 36B3 is a cross-sectional view illustrating a portion indicated by dashed-two dotted line Y3-Y4 in FIG. 36B1.

Bending the imaging device can reduce field curvature and astigmatism. Thus, the optical design of lens and the like, which is used in combination of the imaging device, can be facilitated. For example, the number of lenses used for aberration correction can be reduced; accordingly, the size or weight of electronic devices including the imaging device can be easily reduced. In addition, the quality of a captured image can be improved.

In Embodiment 1, one embodiment of the present invention has been described. Other embodiments of the present invention will be described in Embodiments 2 to 6. Note that one embodiment of the present invention is not limited thereto. In other words, various embodiments of the invention are described in this embodiment and the other embodiments, and one embodiment of the present invention is not limited to a particular embodiment. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with another function, for example. Although an example in which a channel formation region, a source region, a drain region, or the like of a transistor includes an oxide semiconductor is described as one embodiment of the present invention, one embodiment of the present invention is not limited thereto. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor.

This embodiment can be implemented in appropriate combination with any of the structures described in the other embodiments.

Embodiment 2

In this embodiment, a transistor including an oxide semiconductor that can be used in one embodiment of the present invention will be described with reference to drawings. In the drawings in this embodiment, some components are enlarged, reduced in size, or omitted for easy understanding.

Figure 37A:
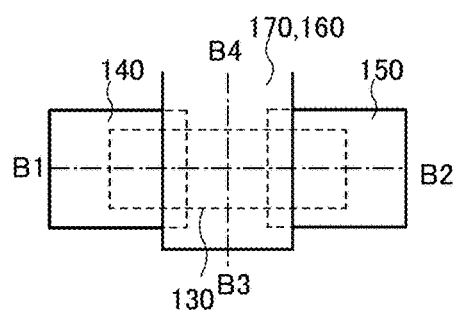
FIGS. 37A to 37F are top views and cross-sectional views illustrating transistors.
Figure 37B:
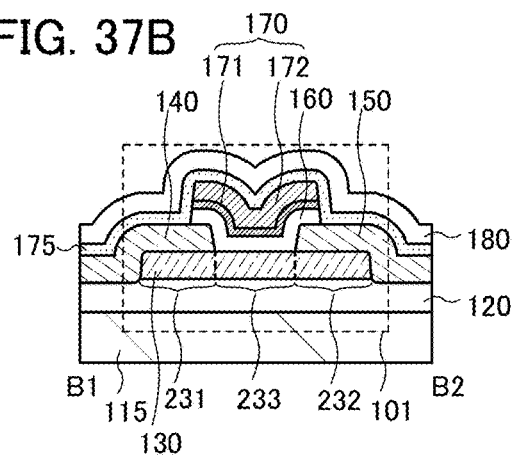
Figure 39A:
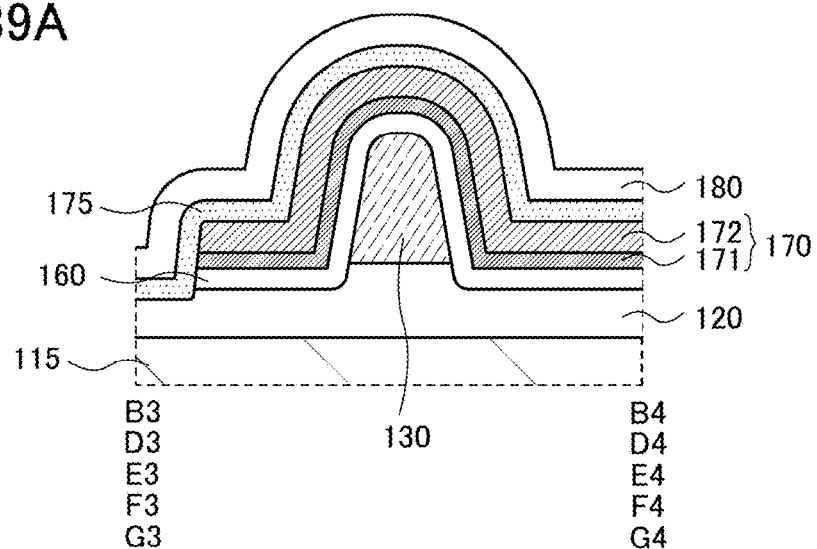
FIGS. 39A to 39D each illustrate a cross section of a transistor in a channel width direction.

FIGS. 37A and 37B are a top view and a cross-sectional view illustrating a transistor 101 of one embodiment of the present invention. FIG. 37A is the top view, and FIG. 37B illustrates a cross section taken along dashed-dotted line B1-B2 in FIG. 37A. A cross section in the direction of dashed-dotted line B3-B4 in FIG. 37A is illustrated in FIG. 39A. The direction of dashed-dotted line B1-B2 is referred to as a channel length direction, and the direction of dashed-dotted line B3-B4 is referred to as a channel width direction.

The transistor 101 includes an insulating layer 120 in contact with a substrate 115; an oxide semiconductor layer 130 in contact with the insulating layer 120; conductive layers 140 and 150 electrically connected to the oxide semiconductor layer 130; an insulating layer 160 in contact with the oxide semiconductor layer 130 and the conductive layers 140 and 150; a conductive layer 170 in contact with the insulating layer 160; an insulating layer 175 in contact with the conductive layers 140 and 150, the insulating layer 160, and the conductive layer 170; and an insulating layer 180 in contact with the insulating layer 175. The insulating layer 180 may function as a planarization film as necessary.

Here, the conductive layer 140, the conductive layer 150, the insulating layer 160, and the conductive layer 170 can function as a source electrode layer, a drain electrode layer, a gate insulating film, and a gate electrode layer, respectively.

A region 231, a region 232, and a region 233 in FIG. 37B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layers 140 and 150, the resistance of the regions 231 and 232 can be reduced.

Specifically, since the oxide semiconductor layer 130 is in contact with the conductive layers 140 and 150, an oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the regions 231 and 232 to n-type regions with low resistance.

Note that functions of a "source" and a "drain" of a transistor are sometimes interchanged with each other when a transistor of an opposite conductivity type is used or when the direction of current flow is changed in circuit operation, for example. Therefore, the terms "source" and "drain" can be interchanged with each other in this specification. In addition, the term "electrode layer" can be replaced with the term "wiring".

The conductive layer 170 includes two layers, a conductive layer 171 and a conductive layer 172, in the drawing, but also may be a single layer or a stack of three or more layers. The same applies to other transistors described in this embodiment.

Each of the conductive layers 140 and 150 is a single layer in the drawing, but also may be a stack of two or more layers. The same applies to other transistors described in this embodiment.

Figure 37C:
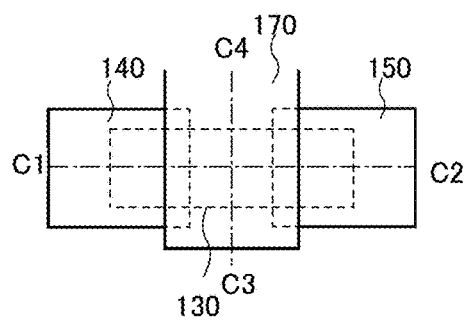
Figure 37D:
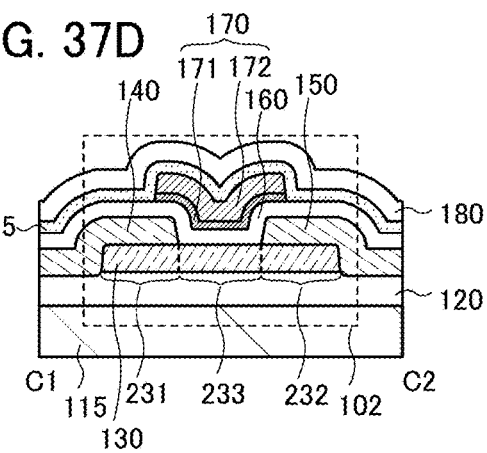
Figure 39B:
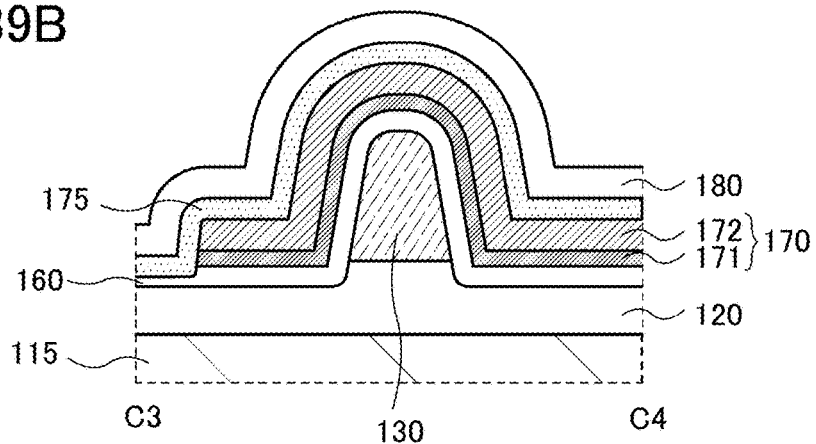

The transistor in one embodiment of the present invention may have a structure illustrated in FIGS. 37C and 37D. FIG. 37C is a top view of a transistor 102. A cross section in the direction of dashed-dotted line C1-C2 in FIG. 37C is illustrated in FIG. 37D. A cross section in the direction of dashed-dotted line C3-C4 in FIG. 37C is illustrated in FIG. 39B. The direction of dashed-dotted line C1-C2 is referred to as a channel length direction, and the direction of dashed-dotted line C3-C4 is referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layers 140 and 150 are covered with the insulating layer 160 and accordingly the resistance between the conductive layer 170 and the conductive layers 140 and 150 is high; therefore, the transistor 102 has a feature of low gate leakage current.

The transistors 101 and 102 each have a top-gate structure including a region where the conductive layer 170 overlaps with the conductive layers 140 and 150. To reduce parasitic capacitance, the width of the region in the channel length direction is preferably greater than or equal to 3 nm and less than 300 nm. Since an offset region is not formed in the oxide semiconductor layer 130 in this structure, a transistor with a high on-state current can be easily formed.

Figure 37E:
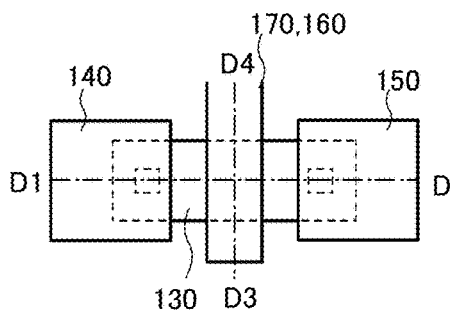
Figure 37F:
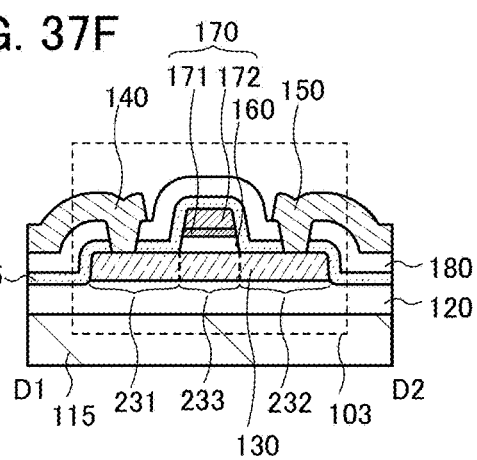

The transistor in one embodiment of the present invention may have a structure illustrated in FIGS. 37E and 37F. FIG. 37E is a top view of a transistor 103. A cross section in the direction of dashed-dotted line D1-D2 in FIG. 37E is illustrated in FIG. 37F. A cross section in the direction of dashed-dotted line D3-D4 in FIG. 37E is illustrated in FIG. 39A. The direction of dashed-dotted line D1-D2 is referred to as a channel length direction, and the direction of dashed-dotted line D3-D4 is referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layers 140 and 150 electrically connected to the oxide semiconductor layer 130 through openings provided in the insulating layers 175 and 180. The transistor 103 may further include, for example, an insulating layer (planarization film) in contact with the insulating layer 180 and the conductive layers 140 and 150 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 37F can function as a source region, a drain region, and a channel formation region, respectively. The regions 231 and 232 are in contact with the insulating layer 175. When an insulating material containing hydrogen is used for the insulating layer 175, for example, the resistance of the regions 231 and 232 can be reduced.

Specifically, interaction between an oxygen vacancy generated in the regions 231 and 232 by the steps up to formation of the insulating layer 175 and hydrogen that diffuses into the regions 231 and 232 from the insulating layer 175 changes the regions 231 and 232 to n-type regions with low resistance. As the insulating material containing hydrogen, for example, silicon nitride, aluminum nitride, or the like can be used.

Figure 38A:
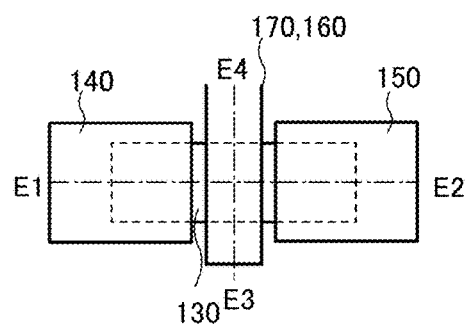
FIGS. 38A to 38F are top views and cross-sectional views illustrating transistors.
Figure 38B:
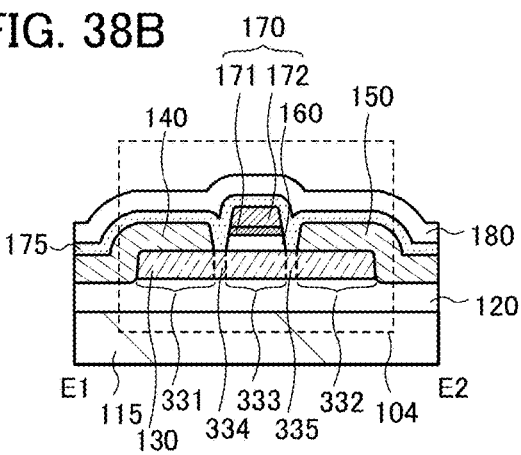

The transistor in one embodiment of the present invention may have a structure illustrated in FIGS. 38A and 38B. FIG. 38A is a top view of a transistor 104. A cross section in the direction of dashed-dotted line E1-E2 in FIG. 38A is illustrated in FIG. 38B. A cross section in the direction of dashed-dotted line E3-E4 in FIG. 38A is illustrated in FIG. 39A. The direction of dashed-dotted line E1-E2 is referred to as a channel length direction, and the direction of dashed-dotted line E3-E4 is referred to as a channel width direction.

The transistor 104 has the same structure as the transistor 103 except that the conductive layers 140 and 150 in contact with the oxide semiconductor layer 130 cover end portions of the oxide semiconductor layer 130.

In FIG. 38B, regions 331 and 334 can function as a source region, regions 332 and 335 can function as a drain region, and a region 333 can function as a channel formation region.

The resistance of the regions 331 and 332 can be reduced in a manner similar to that of the regions 231 and 232 in the transistor 101.

The resistance of the regions 334 and 335 can be reduced in a manner similar to that of the regions 231 and 232 in the transistor 103. In the case where the width of the regions 334 and 335 in the channel length direction is less than or equal to 100 nm, preferably less than or equal to 50 nm, a gate electric field prevents a significant decrease in on-state current. Therefore, a reduction in resistance of the regions 334 and 335 is not performed in some cases.

The transistors 103 and 104 each have a self-aligned structure that does not include a region where the conductive layer 170 overlaps with the conductive layers 140 and 150. A transistor with a self-aligned structure, which has extremely low parasitic capacitance between a gate electrode layer and source and drain electrode layers, is suitable for applications that require high-speed operation.

Figure 38C:
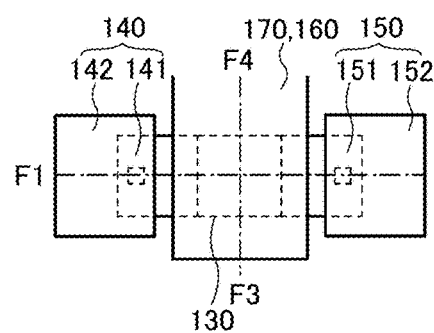
Figure 38D:
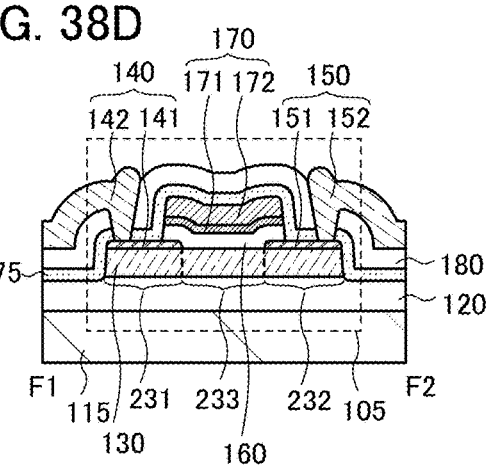

The transistor in one embodiment of the present invention may have a structure illustrated in FIGS. 38C and 38D. FIG. 38C is a top view of a transistor 105. A cross section in the direction of dashed-dotted line F1-F2 in FIG. 38C is illustrated in FIG. 38D. A cross section in the direction of dashed-dotted line F3-F4 in FIG. 38C is illustrated in FIG. 39A. The direction of dashed-dotted line F1-F2 is referred to as a channel length direction, and the direction of dashed-dotted line F3-F4 is referred to as a channel width direction.

The transistor 105 includes the insulating layer 120 in contact with the substrate 115; the oxide semiconductor layer 130 in contact with the insulating layer 120; conductive layers 141 and 151 electrically connected to the oxide semiconductor layer 130; the insulating layer 160 in contact with the oxide semiconductor layer 130 and the conductive layers 141 and 151; the conductive layer 170 in contact with the insulating layer 160; the insulating layer 175 in contact with the oxide semiconductor layer 130, the conductive layers 141 and 151, the insulating layer 160, and the conductive layer 170; the insulating layer 180 in contact with the insulating layer 175; and conductive layers 142 and 152 electrically connected to the conductive layers 141 and 151, respectively, through openings provided in the insulating layers 175 and 180. The transistor 105 may further include, for example, an insulating layer in contact with the insulating layer 180 and the conductive layers 142 and 152 as necessary.

Here, the conductive layers 141 and 151 are in contact with the top surface of the oxide semiconductor layer 130 and are not in contact with side surfaces of the oxide semiconductor layer 130.

The transistor 105 has the same structure as the transistor 101 except that the conductive layers 141 and 151 are provided, that openings are provided in the insulating layers 175 and 180, and that the conductive layers 142 and 152 electrically connected to the conductive layers 141 and 151, respectively, through the openings are provided. The conductive layer 140 (the conductive layers 141 and 142) can function as a source electrode layer, and the conductive layer 150 (the conductive layers 151 and 152) can function as a drain electrode layer.

Figure 38E:
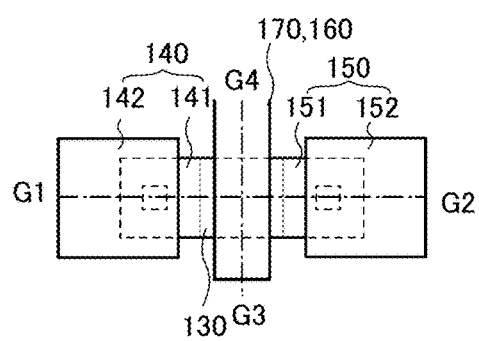
Figure 38F:
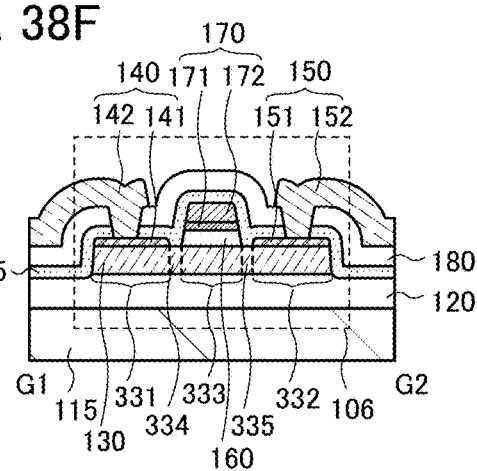

The transistor in one embodiment of the present invention may have a structure illustrated in FIGS. 38E and 38F. FIG. 38E is a top view of a transistor 106. A cross section in the direction of dashed-dotted line G1-G2 in FIG. 38E is illustrated in FIG. 38F. A cross section in the direction of dashed-dotted line G3-G4 in FIG. 38A is illustrated in FIG. 39A. The direction of dashed-dotted line G1-G2 is referred to as a channel length direction, and the direction of dashed-dotted line G3-G4 is referred to as a channel width direction.

The transistor 106 includes the insulating layer 120 in contact with the substrate 115; the oxide semiconductor layer 130 in contact with the insulating layer 120; the conductive layers 141 and 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layers 141 and 151, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 106 may further include, for example, an insulating layer (planarization film) in contact with the insulating layer 180 and the conductive layers 142 and 152 as necessary.

Here, the conductive layers 141 and 151 are in contact with the top surface of the oxide semiconductor layer 130 and are not in contact with side surfaces of the oxide semiconductor layer 130.

The transistor 106 has the same structure as the transistor 103 except that the conductive layers 141 and 151 are provided. The conductive layer 140 (the conductive layers 141 and 142) can function as a source electrode layer, and the conductive layer 150 (the conductive layers 151 and 152) can function as a drain electrode layer.

In the structures of the transistors 105 and 106, the conductive layers 140 and 150 are not in contact with the insulating layer 120. These structures make the insulating layer 120 less likely to be deprived of oxygen by the conductive layers 140 and 150 and facilitate oxygen supply from the insulating layer 120 to the oxide semiconductor layer 130.

An impurity for forming an oxygen vacancy to increase conductivity may be added to the regions 231 and 232 in the transistor 103 and the regions 334 and 335 in the transistors 104 and 106. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property like the oxide semiconductor.

The oxide conductor is a degenerated semiconductor and it is suggested that the conduction band edge equals or substantially equals the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 39C:
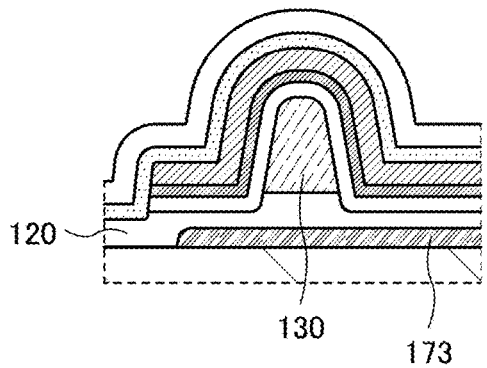
Figure 39D:
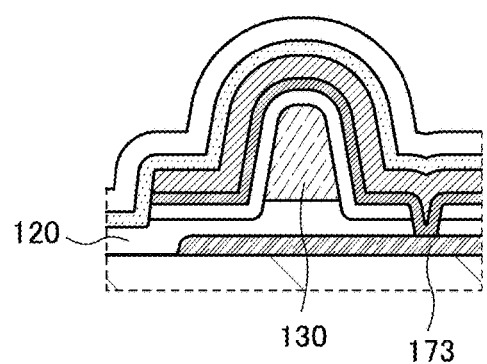
Figure 40A:
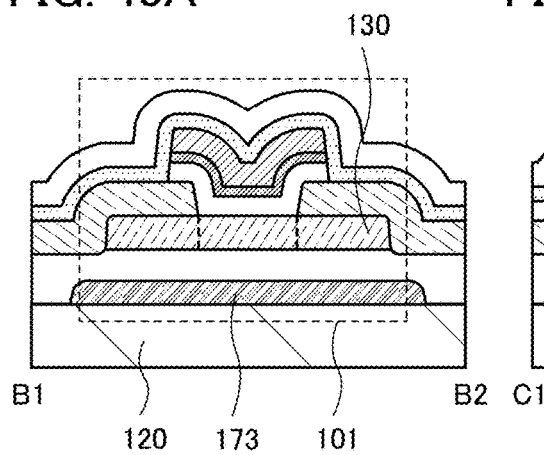
FIGS. 40A to 40F each illustrate a cross section of a transistor in a channel length direction.
Figure 40B:
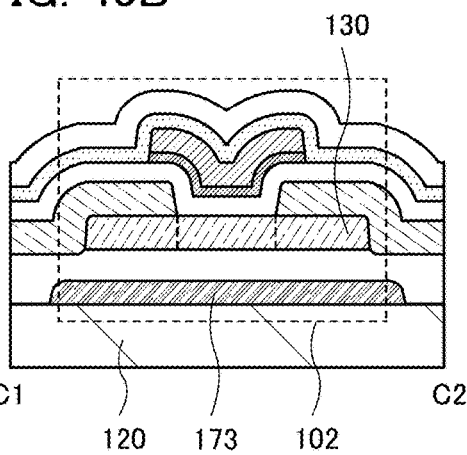
Figure 40C:
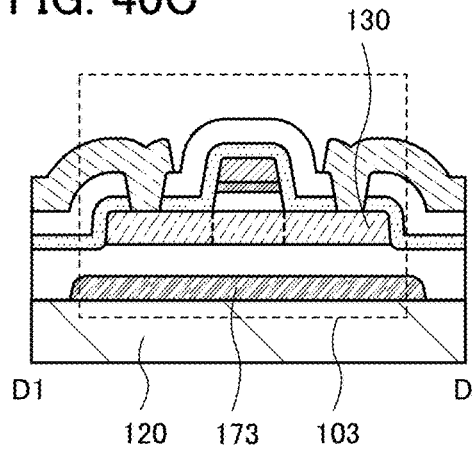
Figure 40D:
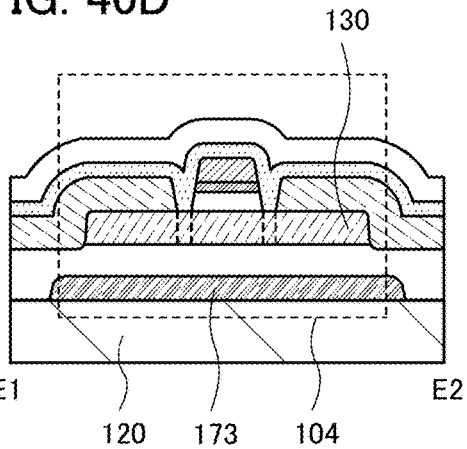
Figure 40E:
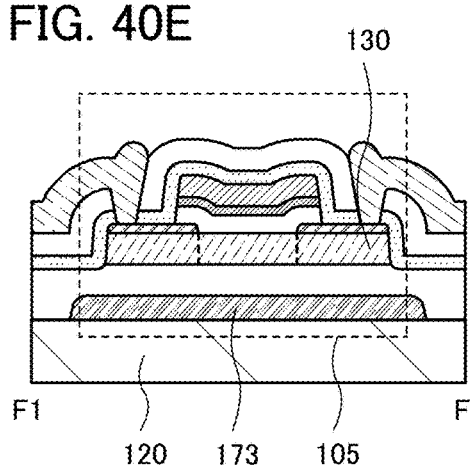
Figure 40F:
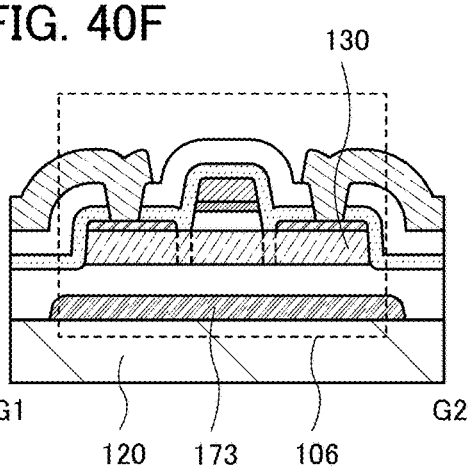

The transistor in one embodiment of the present invention may include a conductive layer 173 between the oxide semiconductor layer 130 and the substrate 115 as illustrated in cross-sectional views in the channel length direction in FIGS. 40A to 40F and cross-sectional views in the channel width direction in FIGS. 39C and 39D. When the conductive layer 173 is used as a second gate electrode layer (back gate), the on-state current can be increased or the threshold voltage can be controlled. In the cross-sectional views in FIGS. 40A to 40F, the width of the conductive layer 173 may be shorter than that of the oxide semiconductor layer 130. Moreover, the width of the conductive layer 173 may be shorter than that of the conductive layer 170.

In order to increase the on-state current, for example, the conductive layers 170 and 173 are made to have the same potential, and the transistor is driven as a double-gate transistor. Furthermore, in order to control the threshold voltage, a fixed potential that is different from the potential of the conductive layer 170 is applied to the conductive layer 173. To set the conductive layers 170 and 173 at the same potential, for example, as illustrated in FIG. 39D, the conductive layers 170 and 173 may be electrically connected to each other through a contact hole.

Although the transistors 101 to 106 in FIGS. 37A to 37F and FIGS. 38A to 38F are examples in which the oxide semiconductor layer 130 is a single layer, the oxide semiconductor layer 130 may be a stacked layer. The oxide semiconductor layer 130 in the transistors 101 to 106 can be replaced with the oxide semiconductor layer 130 in FIGS. 41B and 41C or FIGS. 41D and 41E.

Figure 41A:
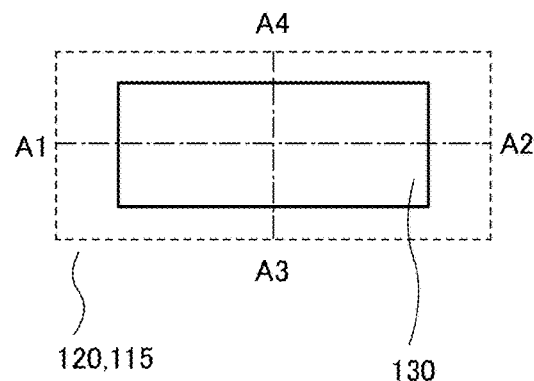
FIGS. 41A to 41E are a top view and cross-sectional views illustrating semiconductor layers.
Figure 41B:
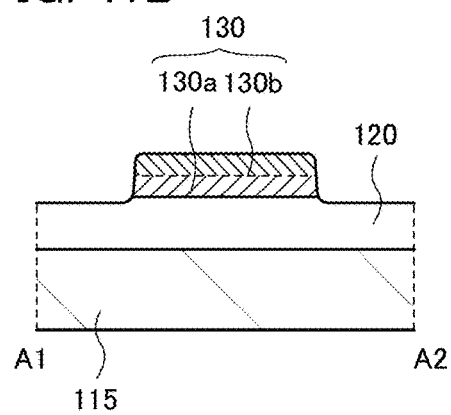
Figure 41D:
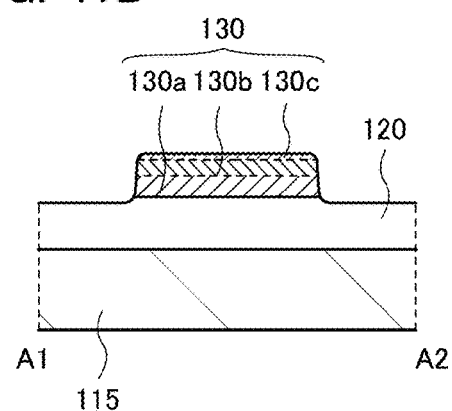
Figure 41C:
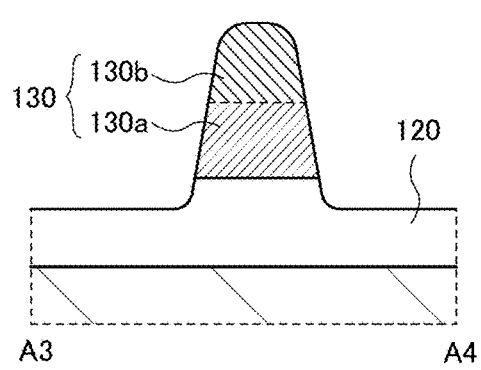
Figure 41E:
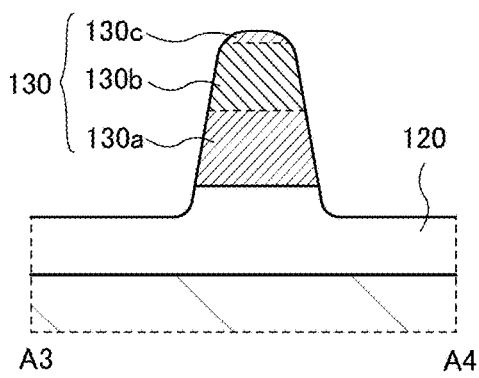

FIG. 41A is a top view of the oxide semiconductor layer 130, and FIGS. 41B and 41C are cross-sectional views of the oxide semiconductor layer 130 with a two-layer structure. FIGS. 41D and 41E are cross-sectional views of the oxide semiconductor layer 130 with a three-layer structure.

Oxide semiconductor layers with different compositions, for example, can be used as an oxide semiconductor layer 130a, an oxide semiconductor layer 130b, and an oxide semiconductor layer 130c.

Figure 42A:
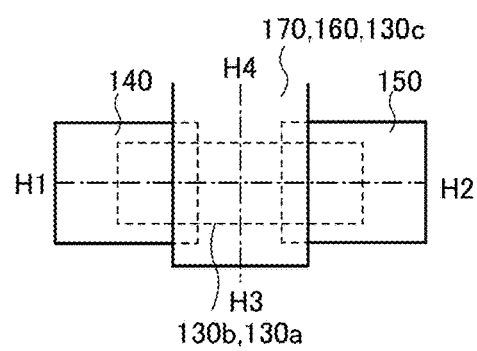
FIGS. 42A to 42F are top views and cross-sectional views illustrating transistors.
Figure 42B:
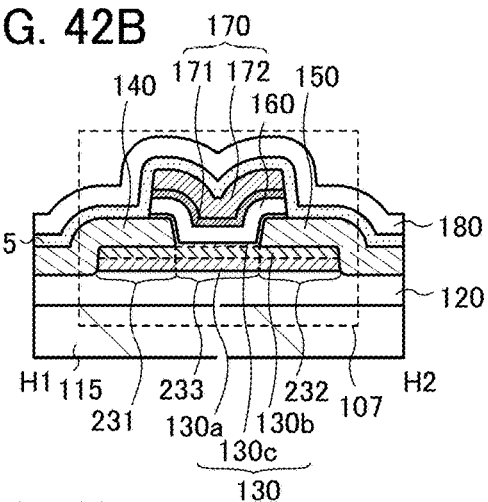
Figure 44A:
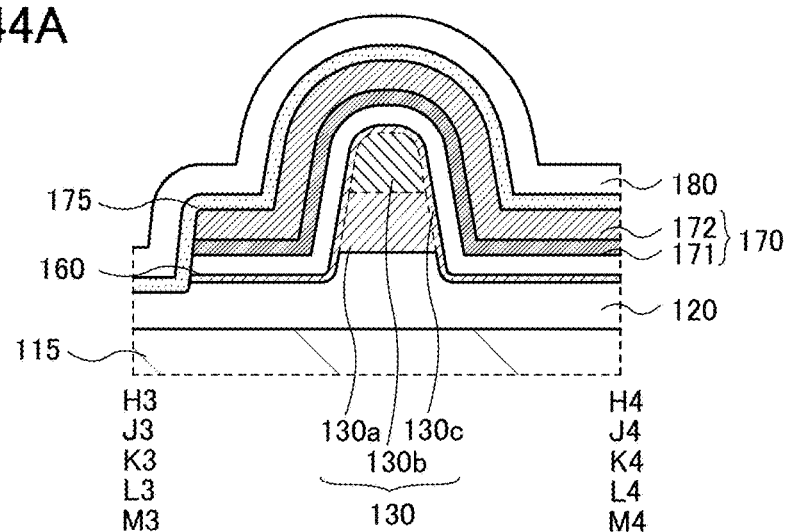
FIGS. 44A to 44D each illustrate a cross section of a transistor in a channel width direction.

The transistor in one embodiment of the present invention may have a structure illustrated in FIGS. 42A and 42B. FIG. 42A is a top view of a transistor 107. A cross section in the direction of dashed-dotted line H1-H2 in FIG. 42A is illustrated in FIG. 42B. A cross section in the direction of dashed-dotted line H3-H4 in FIG. 42A is illustrated in FIG. 44A. The direction of dashed-dotted line H1-H2 is referred to as a channel length direction, and the direction of dashed-dotted line H3-H4 is referred to as a channel width direction.

The transistor 107 includes the insulating layer 120 in contact with the substrate 115; a stack of the oxide semiconductor layers 130a and 130b in contact with the insulating layer 120; the conductive layers 140 and 150 electrically connected to the stack; the oxide semiconductor layer 130c in contact with the stack and the conductive layers 140 and 150; the insulating layer 160 in contact with the oxide semiconductor layer 130c; the conductive layer 170 in contact with the insulating layer 160; the insulating layer 175 in contact with the conductive layers 140 and 150, the oxide semiconductor layer 130c, the insulating layer 160, and the conductive layer 170; and the insulating layer 180 in contact with the insulating layer 175. The insulating layer 180 may function as a planarization film as necessary.

The transistor 107 has the same structure as the transistor 101 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 140 and 150.

Figure 42C:
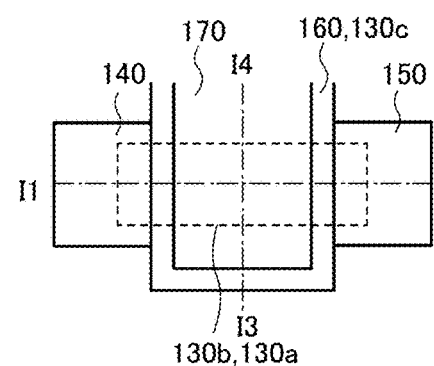
Figure 42D:
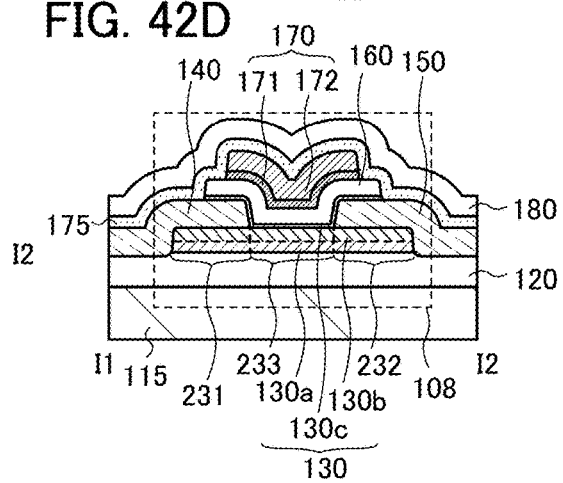
Figure 44B:
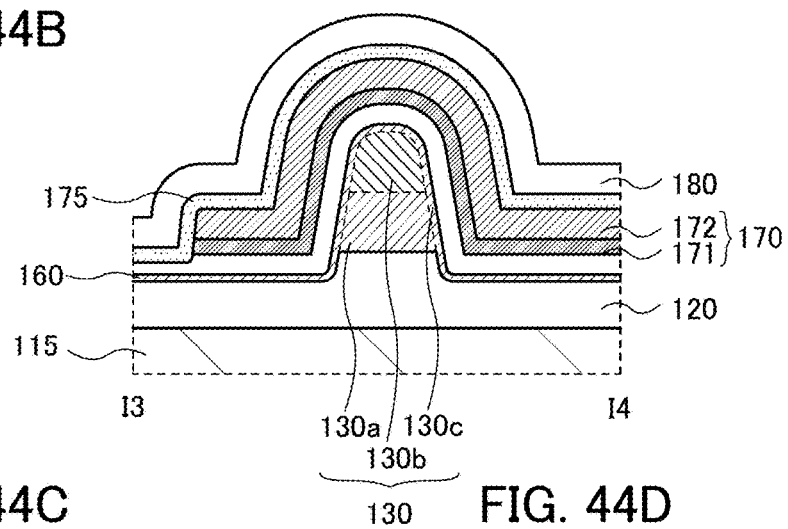

The transistor in one embodiment of the present invention may have a structure illustrated in FIGS. 42C and 42D. FIG. 42C is a top view of a transistor 108. A cross section in the direction of dashed-dotted line I1-I2 in FIG. 42C is illustrated in FIG. 42D. A cross section in the direction of dashed-dotted line I3-I4 in FIG. 42C is illustrated in FIG. 44B. The direction of dashed-dotted line I1-I2 is referred to as a channel length direction, and the direction of dashed-dotted line I3-I4 is referred to as a channel width direction.

The transistor 108 differs from the transistor 107 in that end portions of the insulating layer 160 and the oxide semiconductor layer 130c are not aligned with the end portion of the conductive layer 170.

Figure 42E:
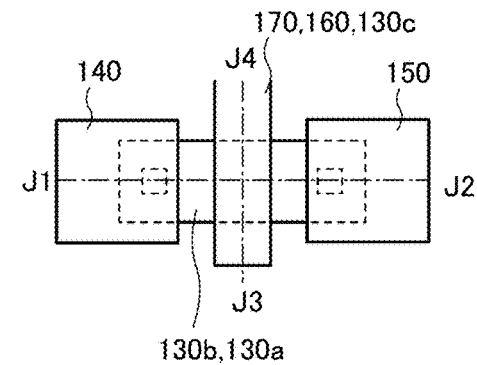
Figure 42F:
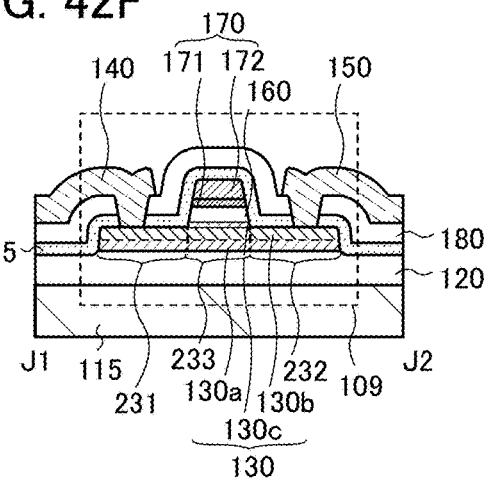

The transistor in one embodiment of the present invention may have a structure illustrated in FIGS. 42E and 42F. FIG. 42E is a top view of a transistor 109. A cross section in the direction of dashed-dotted line J1-J2 in FIG. 42E is illustrated in FIG. 42F. A cross section in the direction of dashed-dotted line J3-J4 in FIG. 42E is illustrated in FIG. 44A. The direction of dashed-dotted line J1-J2 is referred to as a channel length direction, and the direction of dashed-dotted line J3-J4 is referred to as a channel width direction.

The transistor 109 includes the insulating layer 120 in contact with the substrate 115; a stack of the oxide semiconductor layers 130a and 130b in contact with the insulating layer 120; the oxide semiconductor layer 130c in contact with the stack; the insulating layer 160 in contact with the oxide semiconductor layer 130c; the conductive layer 170 in contact with the insulating layer 160; the insulating layer 175 covering the stack, the oxide semiconductor layer 130c, the insulating layer 160, and the conductive layer 170; the insulating layer 180 in contact with the insulating layer 175; and the conductive layers 140 and 150 electrically connected to the stack through openings provided in the insulating layers 175 and 180. The transistor 109 may further include, for example, an insulating layer (planarization film) in contact with the insulating layer 180 and the conductive layers 140 and 150 as necessary.

The transistor 109 has the same structure as the transistor 103 except that the oxide semiconductor layer 130 includes two layers (the oxide semiconductor layers 130a and 130b) in the regions 231 and 232 and that the oxide semiconductor layer 130 includes three layers (the oxide semiconductor layers 130a to 130c) in the region 233.

Figure 43A:
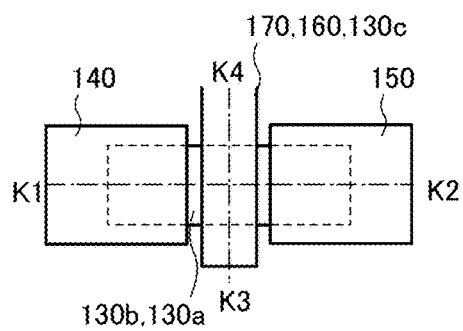
FIGS. 43A to 43F are top views and cross-sectional views illustrating transistors.
Figure 43B:
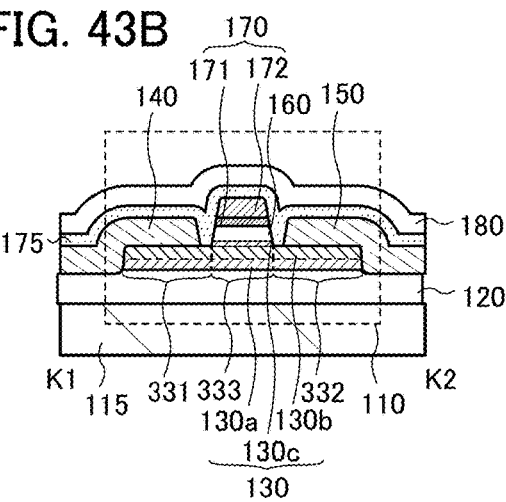

The transistor in one embodiment of the present invention may have a structure illustrated in FIGS. 43A and 43B. FIG. 43A is a top view of a transistor 110. A cross section in the direction of dashed-dotted line K1-K2 in FIG. 43A is illustrated in FIG. 43B. A cross section in the direction of dashed-dotted line K3-K4 in FIG. 43A is illustrated in FIG. 44A. The direction of dashed-dotted line K1-K2 is referred to as a channel length direction, and the direction of dashed-dotted line K3-K4 is referred to as a channel width direction.

The transistor 110 has the same structure as the transistor 104 except that the oxide semiconductor layer 130 includes two layers (the oxide semiconductor layers 130a and 130b) in the regions 331 and 332 and that the oxide semiconductor layer 130 includes three layers (the oxide semiconductor layers 130a to 130c) in the region 333.

Figure 43C:
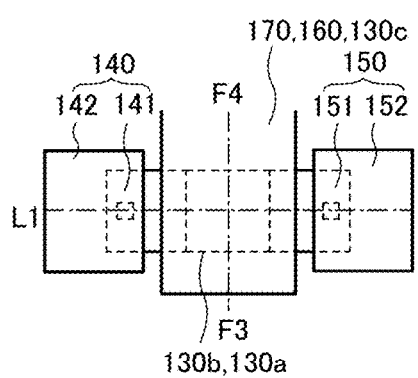
Figure 43D:
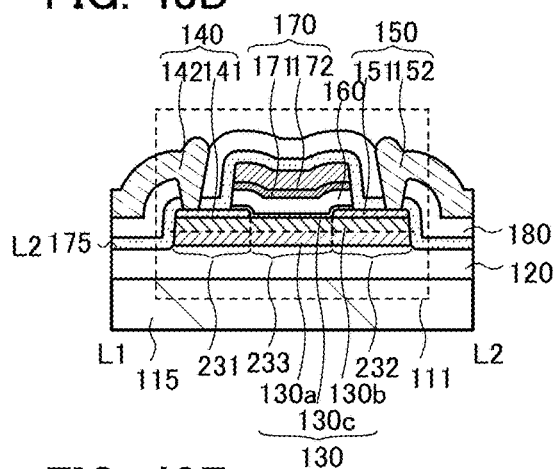

The transistor in one embodiment of the present invention may have a structure illustrated in FIGS. 43C and 43D. FIG. 43C is a top view of a transistor 111. A cross section in the direction of dashed-dotted line K1-K2 in FIG. 43C is illustrated in FIG. 43D. A cross section in the direction of dashed-dotted line K3-K4 in FIG. 43C is illustrated in FIG. 44A. The direction of dashed-dotted line K1-K2 is referred to as a channel length direction, and the direction of dashed-dotted line K3-K4 is referred to as a channel width direction.

The transistor 111 includes the insulating layer 120 in contact with the substrate 115; a stack of the oxide semiconductor layers 130a and 130b in contact with the insulating layer 120; the conductive layers 141 and 151 electrically connected to the stack; the oxide semiconductor layer 130c in contact with the stack and the conductive layers 141 and 151; the insulating layer 160 in contact with the oxide semiconductor layer 130c; the conductive layer 170 in contact with the insulating layer 160; the insulating layer 175 in contact with the stack, the conductive layers 141 and 151, the oxide semiconductor layer 130c, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 111 may further include, for example, an insulating layer (planarization film) in contact with the insulating layer 180 and the conductive layers 142 and 152 as necessary.

The transistor 111 has the same structure as the transistor 105 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 141 and 151.

Figure 43E:
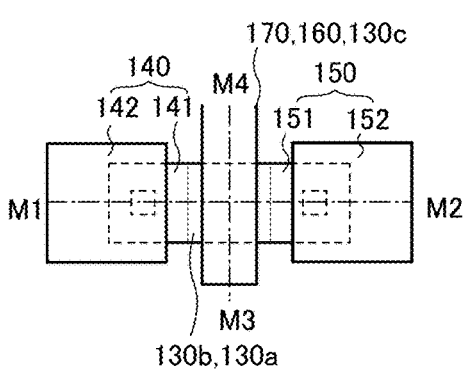
Figure 43F:
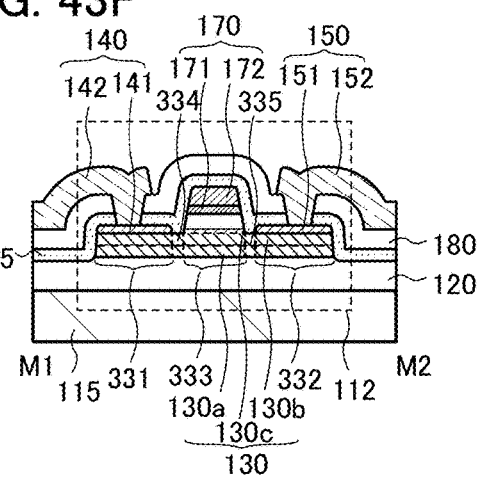

The transistor in one embodiment of the present invention may have a structure illustrated in FIGS. 43E and 43F. FIG. 43E is a top view of a transistor 112. A cross section in the direction of dashed-dotted line M1-M2 in FIG. 43E is illustrated in FIG. 43F. A cross section in the direction of dashed-dotted line M3-M4 in FIG. 43E is illustrated in FIG. 44A. The direction of dashed-dotted line M1-M2 is referred to as a channel length direction, and the direction of dashed-dotted line M3-M4 is referred to as a channel width direction.

The transistor 112 has the same structure as the transistor 106 except that the oxide semiconductor layer 130 includes two layers (the oxide semiconductor layers 130a and 130b) in the regions 331, 332, 334, and 335 and that the oxide semiconductor layer 130 includes three layers (the oxide semiconductor layers 130a to 130c) in the region 333.

Figure 44C:
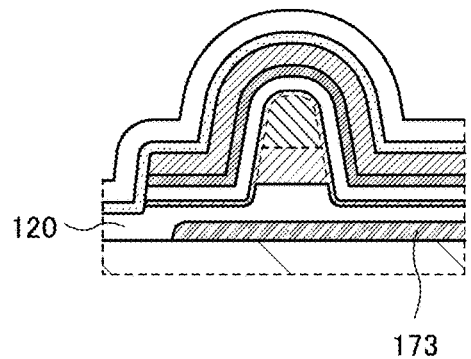
Figure 44D:
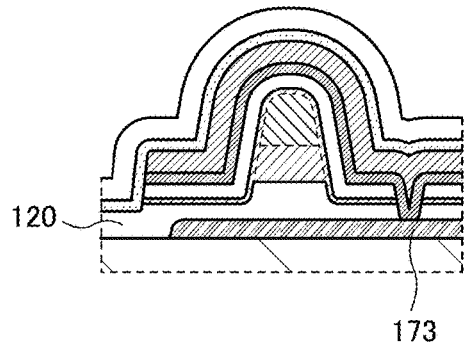
Figure 45A:
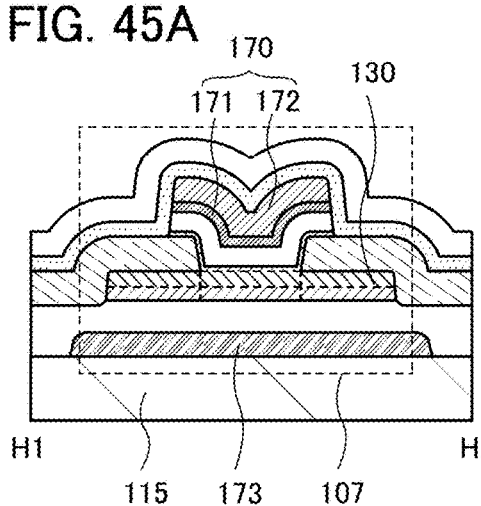
FIGS. 45A to 45F each illustrate a cross section of a transistor in a channel length direction.
Figure 45B:
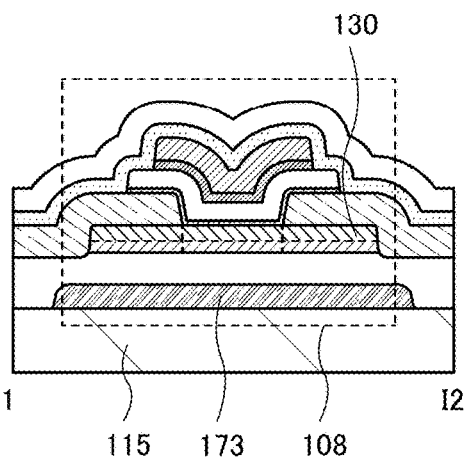
Figure 45C:
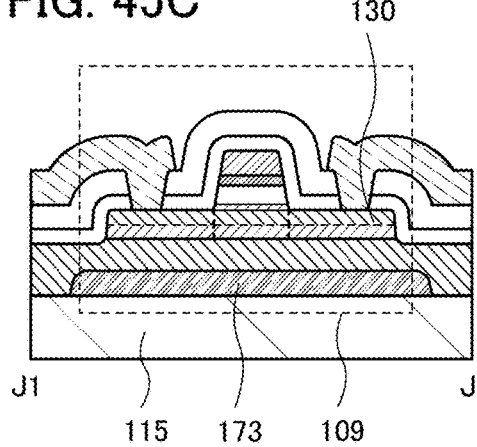
Figure 45D:
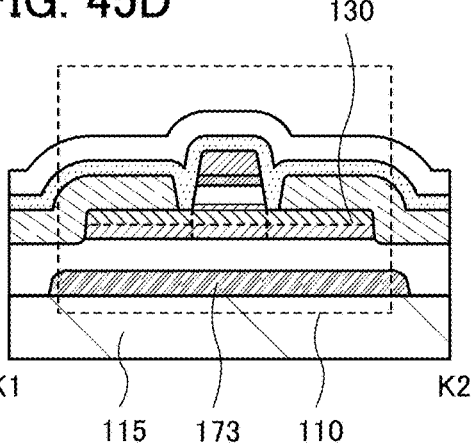
Figure 45E:
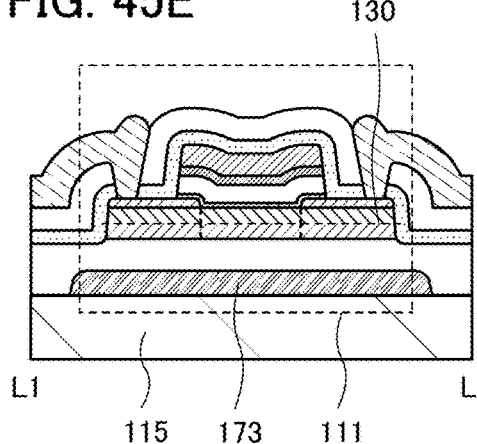
Figure 45F:
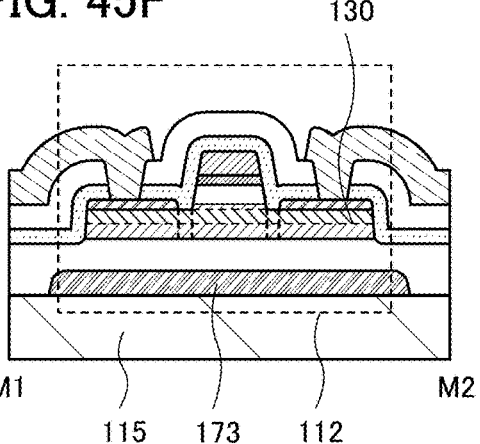

The transistor in one embodiment of the present invention may include the conductive layer 173 between the oxide semiconductor layer 130 and the substrate 115 as illustrated in cross-sectional views in the channel length direction in FIGS. 45A to 45F and cross-sectional views in the channel width direction in FIGS. 44C and 44D. When the conductive layer is used as a second gate electrode layer (back gate), the on-state current can be increased or the threshold voltage can be controlled. In the cross-sectional views in FIGS. 45A to 45F, the width of the conductive layer 173 may be shorter than that of the oxide semiconductor layer 130. Moreover, the width of the conductive layer 173 may be shorter than that of the conductive layer 170.

Figure 46A:
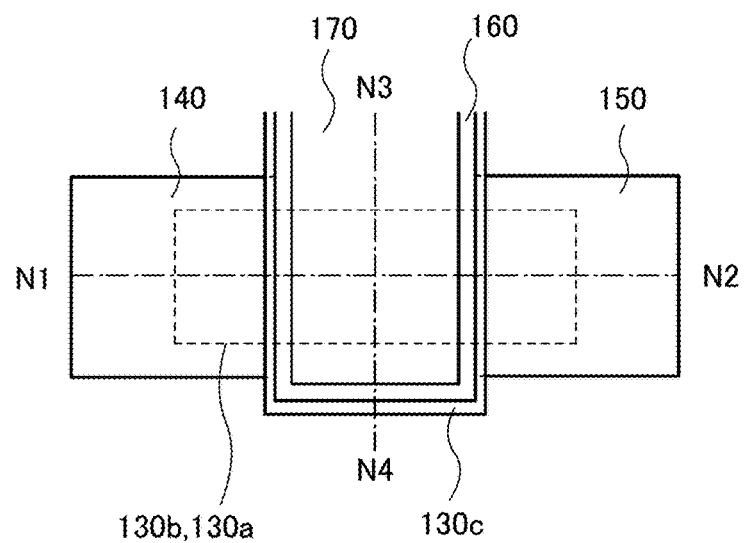
FIGS. 46A and 46B are a top view and cross-sectional views illustrating a transistor.
Figure 46B:
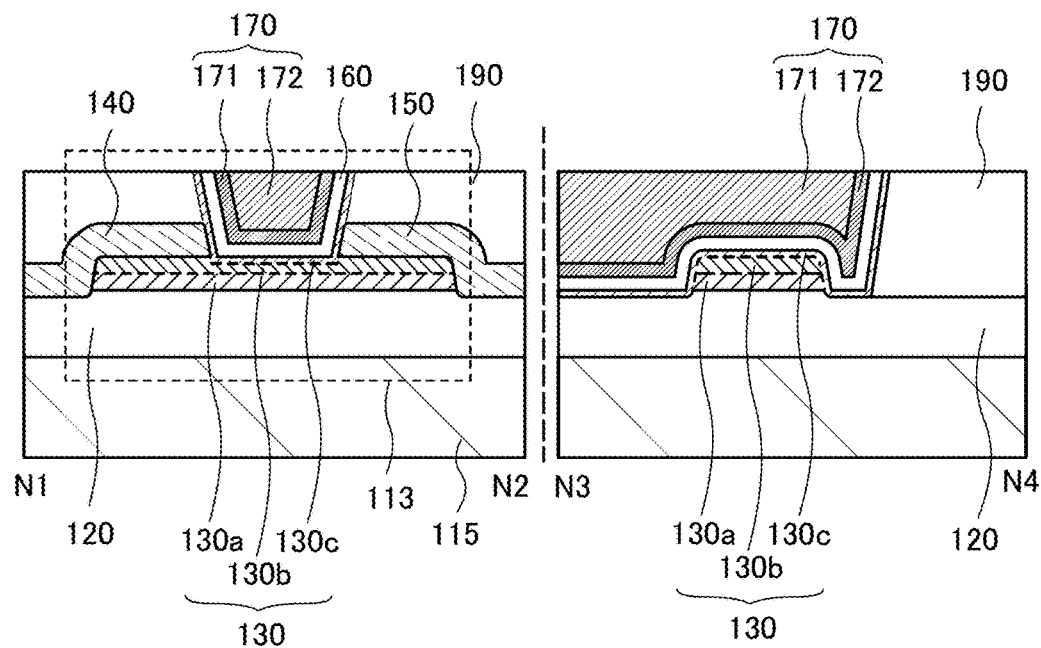

The transistor in one embodiment of the present invention may have a structure illustrated in FIGS. 46A and 46B. FIG. 46A is a top view and FIG. 46B is a cross-sectional view taken along dashed-dotted line N1-N2 and dashed-dotted line N3-N4 in FIG. 46A. Note that for simplification of the drawing, some components are not illustrated in the top view in FIG. 46A.

A transistor 113 illustrated in FIGS. 46A and 46B includes the substrate 115, the insulating layer 120 over the substrate 115, the oxide semiconductor layer 130 (the oxide semiconductor layer 130a, the oxide semiconductor layer 130b, and the oxide semiconductor layer 130c) over the insulating layer 120, the conductive layers 140 and 150 which are in contact with the oxide semiconductor layer 130 and are apart from each other, the insulating layer 160 in contact with the oxide semiconductor layer 130c, and the conductive layer 170 in contact with the insulating layer 160. Note that the oxide semiconductor layer 130c, the insulating layer 160, and the conductive layer 170 are provided in an opening which is provided in the insulating layer 190 over the transistor 113 and reaches the oxide semiconductor layers 130a and 130b and the insulating layer 120.

The transistor 113 has a smaller region in which a conductor serving as a source electrode or a drain electrode overlaps with a conductor serving as a gate electrode than the other transistors described above; thus, the parasitic capacitance in the transistor 113 can be reduced. Therefore, the transistor 113 is preferable as a component of a circuit for which high-speed operation is needed. As illustrated in FIG. 46B, a top surface of the transistor 113 is preferably planarized by a chemical mechanical polishing (CMP) method or the like, but is not necessarily planarized.

Figure 47A:
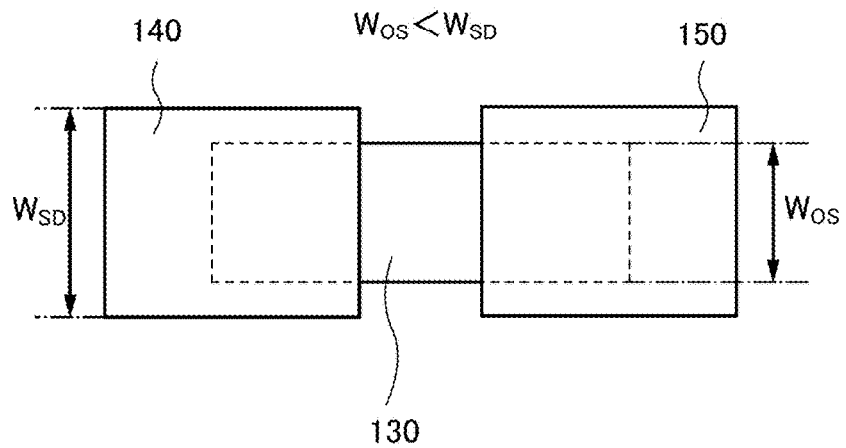
FIGS. 47A to 47C are top views each illustrating a transistor.
Figure 47B:
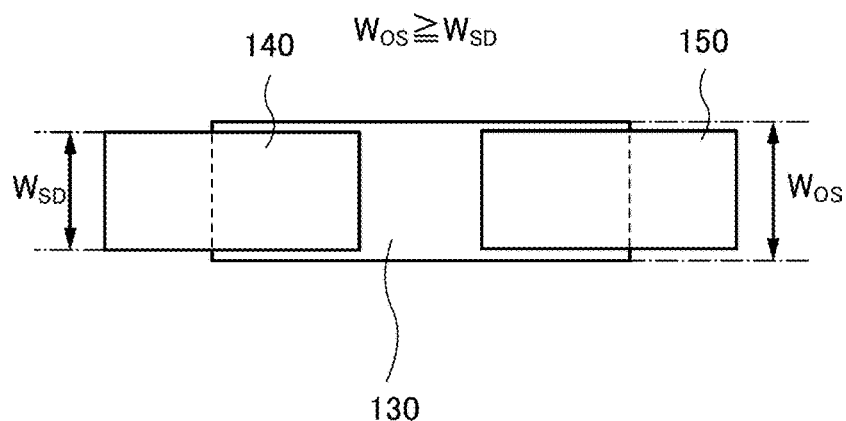
Figure 47C:
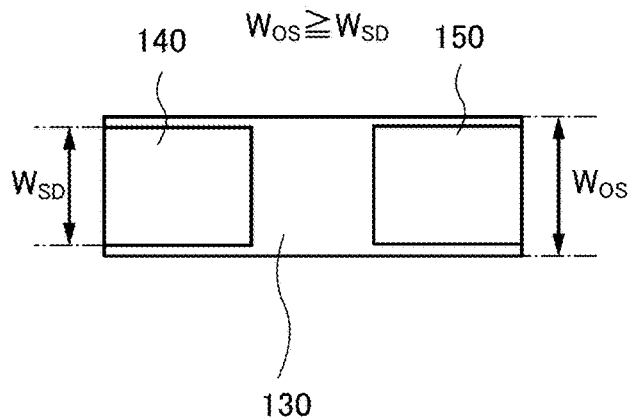

As shown in the top views in FIGS. 47A and 47B (showing only the oxide semiconductor layer 130, the conductive layer 140, and the conductive layer 150), the widths ($W_{SD}$) of the conductive layer 140 (source electrode layer) and the conductive layer 150 (drain electrode layer) in the transistor of one embodiment of the present invention may be either longer than or shorter than the width ($W_{OS}$) of the oxide semiconductor layer 130. When $W_{OS} \geq W_{SD}$ ($W_{SD}$ is less than or equal to $W_{OS}$) is satisfied, a gate electric field is easily applied to the entire oxide semiconductor layer 130, so that electrical characteristics of the transistor can be improved. As illustrated in FIG. 47C, the conductive layers 140 and 150 may be formed only in a region that overlaps with the oxide semiconductor layer 130.

In the transistor in one embodiment of the present invention (any of the transistors 101 to 113), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layers 130a and 130b and the transistor including the oxide semiconductor layers 130a to 130c, selecting appropriate materials for the two or three layers forming the oxide semiconductor layer 130 makes current flow to the oxide semiconductor layer 130b. Since current flows to the oxide semiconductor layer 130b, the current is hardly influenced by interface scattering, leading to high on-state current. Thus, increasing the thickness of the oxide semiconductor layer 130b improves the on-state current in some cases.

With the above structure, the electrical characteristics of the transistor can be improved.

The structures described in this embodiment can be used in appropriate combination with any of the structures described in the other embodiments.

Embodiment 3

In this embodiment, components of the transistors described in Embodiment 2 will be described in detail.

As the substrate 115, a glass substrate, a quartz substrate, a semiconductor substrate, a ceramic substrate, a metal substrate with an insulated surface, or the like can be used. Alternatively, a silicon substrate provided with a transistor, a photodiode, or the like can be used, and an insulating layer, a wiring, a conductor functioning as a contact plug, and the like may be provided over the silicon substrate. Note that when p-channel transistors are formed using the silicon substrate, a silicon substrate with n⁻-type conductivity is preferably used. Alternatively, an SOI substrate including an n⁻-type or i-type silicon layer may be used. In the case where a p-channel transistor is formed on the silicon substrate, it is preferable to use a silicon substrate in which a plane where the transistor is formed is a (110) plane orientation. Forming a p-channel transistor with the (110) plane can increase mobility.

The insulating layer 120 can have a function of supplying oxygen to the oxide semiconductor layer 130 as well as a function of preventing diffusion of impurities from a component included in the substrate 115. For this reason, the insulating layer 120 is preferably an insulating film containing oxygen and further preferably, the insulating layer 120 is an insulating film containing oxygen in which the oxygen content is higher than that in the stoichiometric composition. The insulating layer 120 is a film in which the amount of released oxygen when converted into oxygen atoms is preferably greater than or equal to $1.0 \times 10^{19}$ atoms/cm³ in TDS analysis. In the TDS analysis, the film surface temperature is higher than or equal to 100° C. and lower than or equal to 700° C., or higher than or equal to 100° C. and lower than or equal to 500° C. In the case where the substrate 115 is provided with another device, the insulating layer 120 also has a function as an interlayer insulating film. In that case, the insulating layer 120 is preferably subjected to planarization treatment such as chemical mechanical polishing (CMP) treatment so as to have a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. The insulating layer 120 may be a stack of any of the above materials.

In this embodiment, detailed description is given mainly on the case where the oxide semiconductor layer 130 of the transistor has a three-layer structure in which the oxide semiconductor layers 130a to 130c are sequentially stacked from the insulating layer 120 side.

Note that in the case where the oxide semiconductor layer 130 is a single layer, a layer corresponding to the oxide semiconductor layer 130b described in this embodiment is used.

In the case where the oxide semiconductor layer 130 has a two-layer structure, a stack in which layers corresponding to the oxide semiconductor layer 130a and the oxide semiconductor layer 130b described in this embodiment are sequentially stacked from the insulating layer 120 side is used. In such a case, the oxide semiconductor layers 130a and 130b can be replaced with each other.

In the case where the oxide semiconductor layer 130 has a layered structure of four or more layers, for example, a structure in which another oxide semiconductor layer is added to the three-layer stack of the oxide semiconductor layer 130 described in this embodiment can be employed.

For the oxide semiconductor layer 130b, for example, an oxide semiconductor whose electron affinity (an energy difference between a vacuum level and the conduction band minimum) is higher than those of the oxide semiconductor layers 130a and 130c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layers 130a and 130c each contain one or more kinds of metal elements contained in the oxide semiconductor layer 130b. For example, the oxide semiconductor layers 130a and 130c are preferably formed using an oxide semiconductor whose conduction band minimum is closer to a vacuum level than that of the oxide semiconductor layer 130b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 170, a channel is formed in the oxide semiconductor layer 130b whose conduction band minimum is the lowest in the oxide semiconductor layer 130. Therefore, the oxide semiconductor layer 130b can be regarded as having a region serving as a semiconductor, while the oxide semiconductor layer 130a and the oxide semiconductor layer 130c can be regarded as having a region serving as an insulator or a semi-insulator.

Furthermore, since the oxide semiconductor layer 130a contains one or more kinds of metal elements contained in the oxide semiconductor layer 130b, an interface state is unlikely to be formed at the interface between the oxide semiconductor layers 130a and 130b, compared with the interface between the oxide semiconductor layer 130b and the insulating layer 120 on the assumption that the oxide semiconductor layer 130b is in contact with the insulating layer 120. The interface state sometimes forms a channel; therefore, the threshold voltage of the transistor is changed in some cases. Thus, with the oxide semiconductor layer 130a, variations in electrical characteristics of the transistor, such as a threshold voltage, can be reduced. Moreover, the reliability of the transistor can be improved.

Since the oxide semiconductor layer 130c contains one or more kinds of metal elements contained in the oxide semiconductor layer 130b, scattering of carriers is unlikely to occur at the interface between the oxide semiconductor layers 130b and 130c, compared with the interface between the oxide semiconductor layer 130b and the gate insulating film (the insulating layer 160) on the assumption that the oxide semiconductor layer 130b is in contact with the gate insulating film. Thus, with the oxide semiconductor layer 130c, the field-effect mobility of the transistor can be increased.

For the oxide semiconductor layers 130a and 130c, for example, a material containing Al, Ti, Ga, Ge, Y, Zr, Sn, La, Ce, or Hf with a higher atomic ratio than that used for the oxide semiconductor layer 130b can be used. Specifically, the atomic ratio of any of the above metal elements in the oxide semiconductor layers 130a and 130c is 1.5 times or more, preferably 2 times or more, further preferably 3 times or more as large as that in the oxide semiconductor layer 130b. Any of the above metal elements is strongly bonded to oxygen and thus has a function of suppressing generation of an oxygen vacancy in the oxide semiconductor layers 130a and 130c. That is, an oxygen vacancy is less likely to be generated in the oxide semiconductor layers 130a and 130c than in the oxide semiconductor layer 130b.

An oxide semiconductor that can be used for each of the oxide semiconductor layers 130a to 130c preferably contains at least In or Zn. Both In and Zn are preferably contained. In order to reduce variations in electrical characteristics of the transistor including the oxide semiconductor, the oxide semiconductor preferably contains a stabilizer in addition to In and Zn.

Examples of a stabilizer include Ga, Sn, Hf, Al, and Zr. Other examples of the stabilizer include lanthanoids such as La, Ce, Pr, Nd, Sm, Eu, Gd, Tb, Dy, Ho, Er, Tm, Yb, and Lu.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide means an oxide containing In, Ga, and Zn as its main components. The In—Ga—Zn oxide may contain another metal element in addition to In, Ga, and Zn. In this specification, a film containing the In—Ga—Zn oxide is also referred to as an IGZO film.

A material represented by $InMO_3(ZnO)_m$ (m>0, where m is not an integer) may be used. Note that M represents one or more metal elements selected from Ga, Y, Zr, La, Ce, and Nd. Alternatively, a material represented by $In_2SnO_5(ZnO)_n$ (n>0, where n is an integer) may be used.

Note that when each of the oxide semiconductor layers 130a to 130c is an In-M-Zn oxide containing at least indium, zinc, and M (M is a metal such as Al, Ti, Ga, Ge, Y, Zr, Sn, La, Ce, or Hf), in the case where the oxide semiconductor layer 130a has an atomic ratio of In to M and Zn which is $x_1:y_1:z_1$, the oxide semiconductor layer 130b has an atomic ratio of In to M and Zn which is $x_2:y_2:z_2$, and the oxide semiconductor layer 130c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, more preferably 3 times or more as large as $y_2/x_2$. At this time, when $y_2$ is greater than or equal to $x_2$ in the oxide semiconductor layer 130b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layers 130a and 130c are preferably less than 50 atomic % and greater than or equal to 50 atomic %, respectively, more preferably less than 25 atomic % and greater than or equal to 75 atomic %, respectively. Furthermore, in the case where Zn and O are not taken into consideration, the proportion of In and the proportion of M in the oxide semiconductor layer 130b are preferably greater than or equal to 25 atomic % and less than 75 atomic %, respectively, more preferably greater than or equal to 34 atomic % and less than 66 atomic %, respectively.

The indium content in the oxide semiconductor layer 130b is preferably higher than those in the oxide semiconductor layers 130a and 130c. In an oxide semiconductor, the s orbital of heavy metal mainly contributes to carrier transfer, and when the proportion of In in the oxide semiconductor is increased, overlap of the s orbitals is likely to be increased. Therefore, an oxide in which the proportion of In is higher than that of M has higher mobility than an oxide in which the proportion of In is equal to or lower than that of M. Thus, with the use of an oxide having a high content of indium for the oxide semiconductor layer 130b, a transistor having high field-effect mobility can be obtained.

The thickness of the oxide semiconductor layer 130a is greater than or equal to 3 nm and less than or equal to 100 nm, preferably greater than or equal to 5 nm and less than or equal to 50 nm, more preferably greater than or equal to 5 nm and less than or equal to 25 nm. The thickness of the oxide semiconductor layer 130b is greater than or equal to 3 nm and less than or equal to 200 nm, preferably greater than or equal to 5 nm and less than or equal to 150 nm, more preferably greater than or equal to 10 nm and less than or equal to 100 nm. The thickness of the oxide semiconductor layer 130c is greater than or equal to 1 nm and less than or equal to 50 nm, preferably greater than or equal to 2 nm and less than or equal to 30 nm, more preferably greater than or equal to 3 nm and less than or equal to 15 nm. In addition, the oxide semiconductor layer 130b is preferably thicker than the oxide semiconductor layer 130c.

In order that a transistor in which a channel is formed in an oxide semiconductor layer have stable electrical characteristics, it is effective to make the oxide semiconductor layer intrinsic (i-type) or substantially intrinsic by reducing the concentration of impurities in the oxide semiconductor layer. The term "substantially intrinsic" refers to a state where an oxide semiconductor layer has a carrier density lower than $1\times10^{19}/cm^3$, lower than $1\times10^{15}/cm^3$, lower than $1\times10^{13}/cm^3$, or lower than $1\times10^{8}/cm^3$, and higher than or equal to $1\times10^{-9}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density, and silicon forms impurity levels in the oxide semiconductor layer. The impurity levels serve as traps and might cause deterioration of electrical characteristics of the transistor. Therefore, it is preferable to reduce the concentration of the impurities in the oxide semiconductor layers 130a to 130c and at interfaces between the oxide semiconductor layers.

In order to make the oxide semiconductor layer intrinsic or substantially intrinsic, the oxide semiconductor layer is controlled to have a region in which the concentration of hydrogen estimated by secondary ion mass spectrometry (SIMS) is lower than or equal to $2\times10^{20}$ atoms/$cm^3$, preferably lower than or equal to $5\times10^{19}$ atoms/$cm^3$, more preferably lower than or equal to $1\times10^{19}$ atoms/$cm^3$, still more preferably lower than or equal to $5\times10^{18}$ atoms/$cm^3$ and is higher than or equal to $1\times10^{17}$ atoms/$cm^3$. In addition, the oxide semiconductor layer is controlled to have a region in which the concentration of nitrogen is lower than $5\times10^{19}$ atoms/$cm^3$, preferably lower than or equal to $5\times10^{18}$ atoms/$cm^3$, more preferably lower than or equal to $1\times10^{18}$ atoms/$cm^3$, still more preferably lower than or equal to $5\times10^{17}$ atoms/$cm^3$ and is higher than or equal to $5\times10^{16}$ atoms/$cm^3$.

The high concentration of silicon or carbon might reduce the crystallinity of the oxide semiconductor layer. In order not to lower the crystallinity of the oxide semiconductor layer, the oxide semiconductor layer is controlled to have a region in which the concentration of silicon is lower than $1\times10^{19}$ atoms/$cm^3$, preferably lower than $5\times10^{18}$ atoms/$cm^3$ and is higher than or equal to $1\times10^{18}$ atoms/$cm^3$. Furthermore, the oxide semiconductor layer is controlled to have a region in which the concentration of carbon is lower than $1\times10^{19}$ atoms/$cm^3$, preferably lower than $5\times10^{18}$ atoms/$cm^3$, more preferably lower than $1\times10^{18}$ atoms/$cm^3$ and is higher than or equal to $6\times10^{17}$ atoms/$cm^3$.

As described above, a transistor in which a highly purified oxide semiconductor film is used for a channel formation region exhibits an extremely low off-state current. When voltage between a source and a drain is set at about 0.1 V, 5 V, or 10 V, for example, the off-state current per channel width of the transistor can be as low as several yoctoamperes per micrometer to several zeptoamperes per micrometer.

As the gate insulating film of the transistor, an insulating film containing silicon is used in many cases; thus, it is preferable that, as in the transistor of one embodiment of the present invention, a region of the oxide semiconductor layer that serves as a channel not be in contact with the gate insulating film for the above reason. In the case where a channel is formed at the interface between the gate insulating film and the oxide semiconductor layer, scattering of carriers occurs at the interface, so that the field-effect mobility of the transistor is reduced in some cases. Also from the view of the above, it is preferable that the region of the oxide semiconductor layer that serves as a channel be separated from the gate insulating film.

Accordingly, with the oxide semiconductor layer 130 having a layered structure including the oxide semiconductor layers 130a to 130c, a channel can be formed in the oxide semiconductor layer 130b; thus, the transistor can have high field-effect mobility and stable electrical characteristics.

In a band structure, the conduction band minimums of the oxide semiconductor layers 130a to 130c are continuous. This can be understood also from the fact that the compositions of the oxide semiconductor layers 130a to 130c are close to one another and oxygen is easily diffused among the oxide semiconductor layers 130a to 130c. Thus, the oxide semiconductor layers 130a to 130c have a continuous physical property though they have different compositions and form a stack. In the drawings, interfaces between the oxide semiconductor layers of the stack are indicated by dotted lines.

The oxide semiconductor layer 130 in which layers containing the same main components are stacked is formed to have not only a simple layered structure of the layers but also a continuous energy band (here, in particular, a well structure having a U shape in which the conduction band minimums are continuous (U-shape well)). In other words, the layered structure is formed such that there exists no impurity that forms a defect level such as a trap center or a recombination center at each interface. If impurities exist between the stacked oxide semiconductor layers, the continuity of the energy band is lost and carriers disappear by a trap or recombination at the interface.

For example, an In—Ga—Zn oxide whose atomic ratio of In to Ga and Zn is 1:3:2, 1:3:3, 1:3:4, 1:3:6, 1:4:5, 1:6:4, or 1:9:6 can be used for the oxide semiconductor layers 130a and 130c, and an In—Ga—Zn oxide whose atomic ratio of In to Ga and Zn is 1:1:1, 2:1:3, 5:5:6, 3:1:2, 4:2:3, or 4:2:4.1 can be used for the oxide semiconductor layer 130b. In each of the oxide semiconductor layers 130a, 130b, and 130c, the proportion of each atom in the atomic ratio varies within a range of ±40% as an error.

The oxide semiconductor layer 130b of the oxide semiconductor layer 130 serves as a well, so that a channel is formed in the oxide semiconductor layer 130b. Since the conduction band minimums are continuous, the oxide semiconductor layer 130 can also be referred to as a U-shaped well. Furthermore, a channel formed to have such a structure can also be referred to as a buried channel.

Note that trap levels due to impurities or defects might be formed in the vicinity of the interface between an insulating layer such as a silicon oxide film and each of the oxide semiconductor layers 130a and 130c. The oxide semiconductor layer 130b can be distanced away from the trap levels owing to the existence of the oxide semiconductor layers 130a and 130c.

However, when the energy differences between the conduction band minimum of the oxide semiconductor layer 130b and the conduction band minimum of each of the oxide semiconductor layers 130a and 130c are small, an electron in the oxide semiconductor layer 130b might reach the trap level by passing over the energy differences. When the electron is trapped in the trap level, negative charge is generated at the interface with the insulating layer, so that the threshold voltage of the transistor is shifted in the positive direction.

The oxide semiconductor layers 130a to 130c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, and Sc and alloys of any of these metal materials can be used. Typically, it is preferable to use Ti, which is particularly easily bonded to oxygen, or W, which has a high melting point and thus allows subsequent processes to be performed at relatively high temperatures. It is also possible to use a stack of any of the above materials and Cu or an alloy such as Cu—Mn, which has low resistance. In the transistors 105, 106, 111, and 112, for example, it is possible to use W for the conductive layers 141 and 151 and use a stack of Ti and Al for the conductive layers 142 and 152.

The above materials are capable of extracting oxygen from an oxide semiconductor film. Therefore, in a region of the oxide semiconductor layer that is in contact with any of the above materials, oxygen is released from the oxide semiconductor layer and an oxygen vacancy is formed. Hydrogen slightly contained in the layer and the oxygen vacancy are bonded to each other, so that the region is markedly changed to an n-type region. Accordingly, the n-type region can serve as a source or a drain of the transistor.

In the case where W is used for the conductive layers 140 and 150, the conductive layers 140 and 150 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 140 and 150 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials. The insulating layer 160 may contain La, N, Zr, or the like as an impurity.

An example of a layered structure of the insulating layer 160 is described. The insulating layer 160 includes, for example, oxygen, nitrogen, silicon, or hafnium. Specifically, the insulating layer 160 preferably includes hafnium oxide and silicon oxide or silicon oxynitride.

Hafnium oxide and aluminum oxide have higher dielectric constants than silicon oxide and silicon oxynitride. Therefore, the insulating layer 160 using hafnium oxide or aluminum oxide can have larger thickness than the insulating layer 160 using silicon oxide, so that leakage current due to tunnel current can be reduced. That is, a transistor with a low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the these examples.

For the insulating layers 120 and 160 in contact with the oxide semiconductor layer 130, a film that releases less nitrogen oxide is preferably used. In the case where the oxide semiconductor is in contact with an insulating layer that releases a large amount of nitrogen oxide, the density of states due to nitrogen oxide increases in some cases. For the insulating layers 120 and 160, for example, an oxide insulating layer such as a silicon oxynitride film or an aluminum oxynitride film that releases less nitrogen oxide can be used.

A silicon oxynitride film that releases less nitrogen oxide is a film of which the amount of released ammonia is larger than the amount of released nitrogen oxide in TDS; the amount of released ammonia is typically greater than or equal to $1 \times 10^{18}$ molecules/cm$^3$ and less than or equal to $5 \times 10^{19}$ molecules/cm$^3$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

By using the above oxide insulating layer for the insulating layers 120 and 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, or W can be used. Alternatively, an alloy or a conductive nitride of any of these materials may be used. Alternatively, a stack of a plurality of materials selected from these materials, alloys of these materials, and conductive nitrides of these materials may be used. Typically, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 171 and tungsten is used for the conductive layer 172 to form the conductive layer 170.

As the insulating layer 175, a silicon nitride film, an aluminum nitride film, or the like containing hydrogen can be used. In the transistors 103, 104, 106, 109, 110, and 112 described in Embodiment 2, when an insulating film containing hydrogen is used as the insulating layer 175, part of the oxide semiconductor layer can have n-type conductivity. In addition, a nitride insulating film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 2. The aluminum oxide film has a significant effect of blocking both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120. Furthermore, oxygen contained in the aluminum oxide film can be diffused into the oxide semiconductor layer.

Furthermore, the insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. In particular, a decrease in channel width causes a reduction in on-state current.

In the transistors 107 to 112 in one embodiment of the present invention, the oxide semiconductor layer 130*c* is formed to cover the oxide semiconductor layer 130*b* where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor in one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in a direction perpendicular to its side surface in addition to a direction perpendicular to its top surface. In other words, a gate electric field is applied to the entire channel formation layer and an effective channel width is increased, leading to a further increase in on-state current.

Furthermore, in the transistor in one embodiment of the present invention in which the oxide semiconductor layer 130 has a two-layer structure or a three-layer structure, since the oxide semiconductor layer 130*b* where a channel is formed is provided over the oxide semiconductor layer 130*a*, an interface state is less likely to be formed. In the transistor in one embodiment of the present invention in which the oxide semiconductor layer 130 has a three-layer structure, since the oxide semiconductor layer 130*b* is positioned at the middle of the three-layer structure, the influence of an impurity that enters from upper and lower layers on the oxide semiconductor layer 130*b* can also be eliminated. Therefore, the transistor can achieve not only the increase in on-state current but also stabilization of the threshold voltage and a reduction in S value (subthreshold value). Thus, current at a gate voltage VG of 0 V can be reduced and power consumption can be reduced. In addition, since the threshold voltage of the transistor becomes stable, long-term reliability of the semiconductor device can be improved. Furthermore, the transistor in one embodiment of the present invention is suitable for a highly integrated semiconductor device because deterioration of electrical characteristics due to miniaturization is reduced.

Although the variety of films such as the metal films, the semiconductor films, and the inorganic insulating films that are described in this embodiment typically can be formed by sputtering or plasma-enhanced CVD, such films may be formed by another method such as thermal CVD. Examples of the thermal CVD include metal organic chemical vapor deposition (MOCVD) and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is absorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the above embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed by a deposition apparatus using ALD, two kinds of gases, i.e., ozone ($O_3$) as an oxidizer and a source material gas which is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide) hafnium) are used.

For example, in the case where an aluminum oxide film is formed by a deposition apparatus using ALD, two kinds of gases, i.e., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, in the case where a tungsten film is formed by a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor film, e.g., an In—Ga—Zn—O film is formed by a deposition apparatus using ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example. A mixed compound layer such as an In—Ga—O layer, an In—Zn—O layer, or a Ga—Zn—O layer may be formed by using these gases. Although an $H_2O$ gas which is obtained by bubbling with an inert gas such as Ar may be used instead of an $O_3$ gas, it is preferable to use an $O_3$ gas, which does not contain H.

A facing-target-type sputtering apparatus can be used for deposition of an oxide semiconductor layer. Deposition using the facing-target-type sputtering apparatus can also be referred to as vapor deposition SP (VDSP).

When an oxide semiconductor layer is deposited using a facing-target-type sputtering apparatus, plasma damage to the oxide semiconductor layer at the time of deposition can be reduced. Thus, oxygen vacancies in the film can be reduced. In addition, the use of the facing-target-type sputtering apparatus enables low-pressure deposition. Accordingly, the concentration of impurities (e.g., hydrogen, a rare gas (e.g., argon), and water) in a deposited oxide semiconductor layer can be lowered.

The structures described in this embodiment can be used in appropriate combination with any of the structures described in the other embodiments.

Embodiment 4

A structure of an oxide semiconductor film that can be used in one embodiment of the present invention will be described below.

In this specification, the term "parallel" indicates that the angle formed between two straight lines is greater than or equal to −10° and less than or equal to 10°, and accordingly also includes the case where the angle is greater than or equal to −5° and less than or equal to 5°. Furthermore, the term "perpendicular" indicates that the angle formed between two straight lines is greater than or equal to 80° and less than or equal to 100°, and accordingly also includes the case where the angle is greater than or equal to 85° and less than or equal to 95°.

In this specification, trigonal and rhombohedral crystal systems are included in a hexagonal crystal system.

<Structure of Oxide Semiconductor>

The structure of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed positions of atoms, to have a flexible bond angle, and to have a short-range order but have no long-range order, for example.

In other words, a stable oxide semiconductor cannot be regarded as a completely amorphous oxide semiconductor.

Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is one of oxide semiconductors having a plurality of c-axis aligned crystal parts (also referred to as pellets).

Figure 48A:
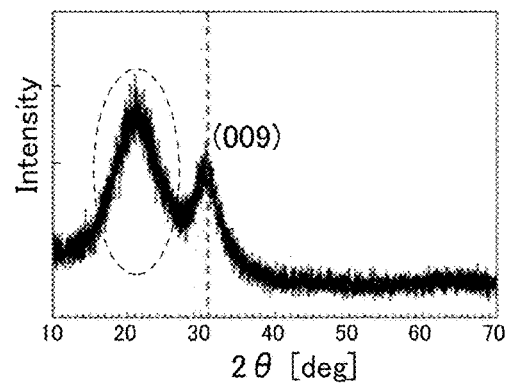
FIGS. 48A to 48E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 48A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 48B:
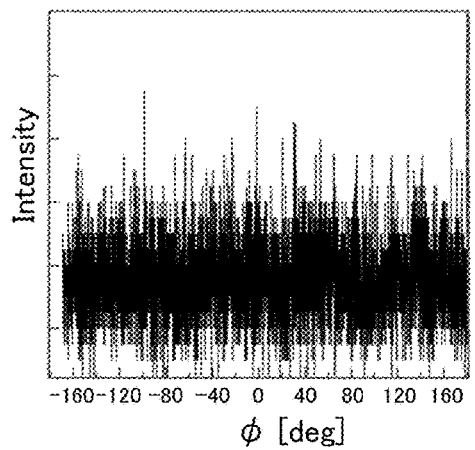
Figure 48C:
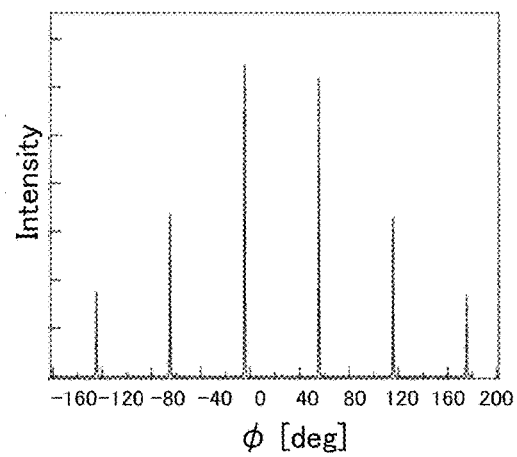

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the $InGaZnO_4$ crystal. When analysis (φ scan) is performed with 2θ fixed at around 56° and with the sample rotated using a normal vector to the sample surface as an axis (φ axis), as shown in FIG. 48B, a peak is not clearly observed. In contrast, in the case where single crystal $InGaZnO_4$ is subjected to φ scan with 2θ fixed at around 56°, as shown in FIG. 48C, six peaks which are derived from crystal planes equivalent to the (110) plane are observed. Accordingly, the structural analysis using XRD shows that the directions of a-axes and b-axes are irregularly oriented in the CAAC-OS.

Figure 48D:
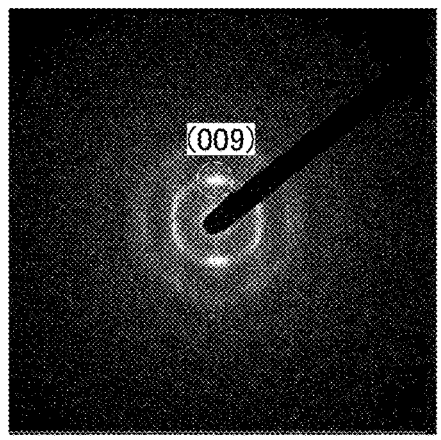
Figure 48E:
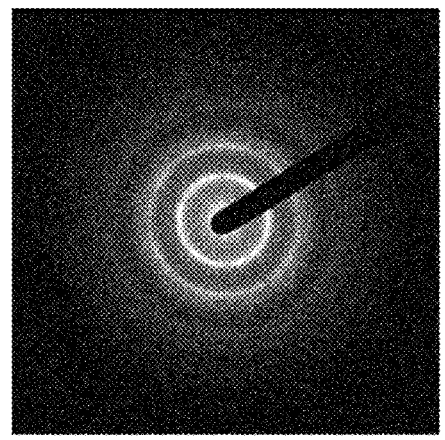

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 48D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 48E shows a diffraction pattern obtained in such a manner that an electron beam with a probe diameter of 300 nm is incident on the same sample in a direction perpendicular to the sample surface. As shown in FIG. 48E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 48E is considered to be derived from the (010) plane, the (100) plane, and the like of the $InGaZnO_4$ crystal. The second ring in FIG. 48E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed in some cases. Thus, in the CAAC-OS, a reduction in electron mobility due to the grain boundary is less likely to occur.

Figure 49A:
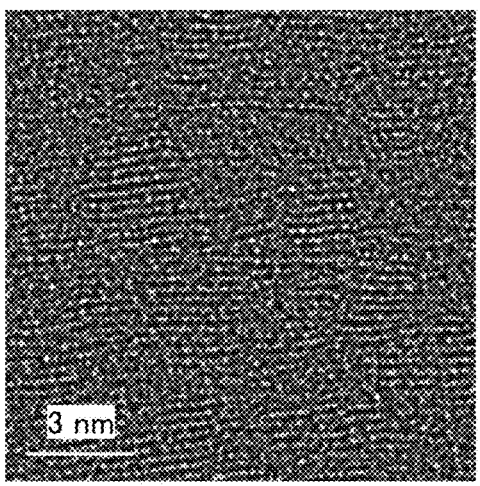
FIGS. 49A to 49E show a cross-sectional TEM image and plan-view TEM images of a CAAC-OS and images obtained through analysis thereof.

FIG. 49A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 49A shows pellets in which metal atoms are arranged in a layered manner. FIG. 49A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 49B:
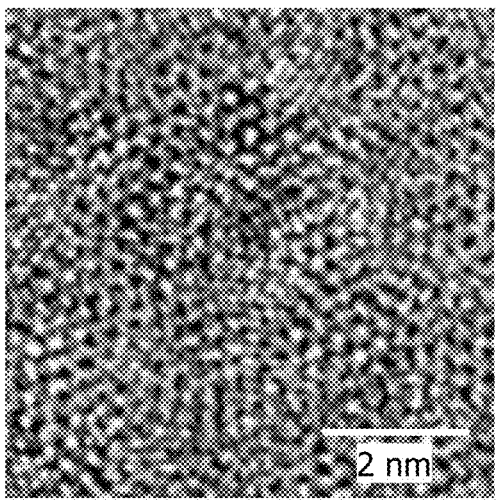
Figure 49C:
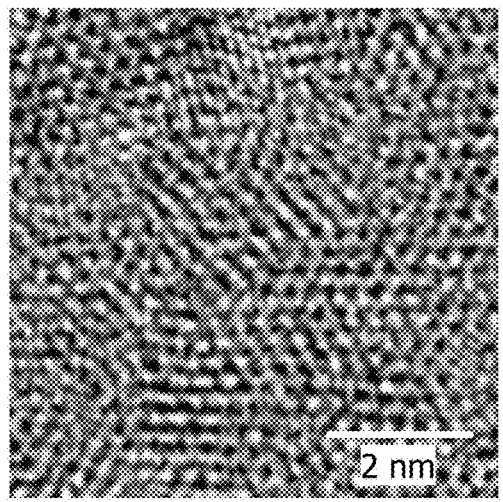
Figure 49D:
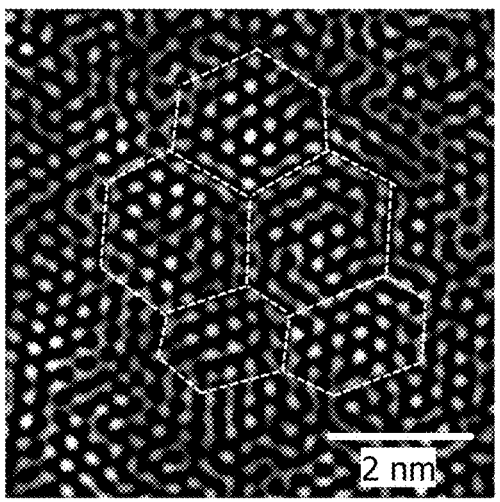
Figure 49E:
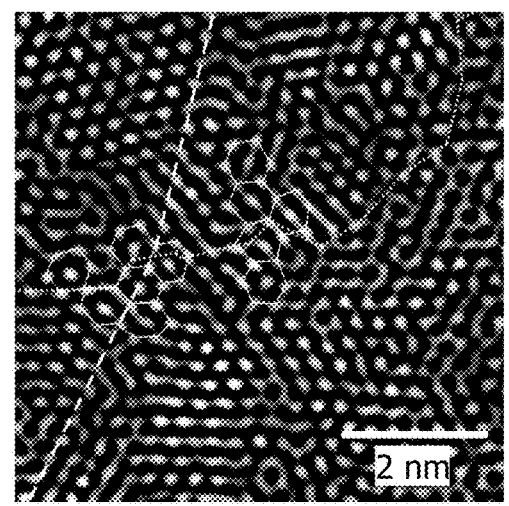

FIGS. 49B and 49C show Cs-corrected high-resolution TEM images of a plane of the CAAC-OS observed from a direction substantially perpendicular to the sample surface. FIGS. 49D and 49E are images obtained through image processing of FIGS. 49B and 49C. The method of image processing is as follows. The image in FIG. 49B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 49D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 49E, a dotted line denotes a portion between a region where a lattice arrangement is well aligned and another region where a lattice arrangement is well aligned, and a dashed line denotes the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon can be formed. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in an oxide semiconductor might serve as carrier traps or carrier generation sources, for example. For example, oxygen vacancies in an oxide semiconductor might serve as carrier traps or serve as carrier generation sources when hydrogen is captured therein.

A CAAC-OS having small amounts of impurities and oxygen vacancies is an oxide semiconductor with a low carrier density (specifically, lower than $8\times10^{11}/cm^3$, preferably lower than $1\times10^{11}/cm^3$, more preferably lower than $1\times10^{10}/cm^3$, and higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, a CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 50A:
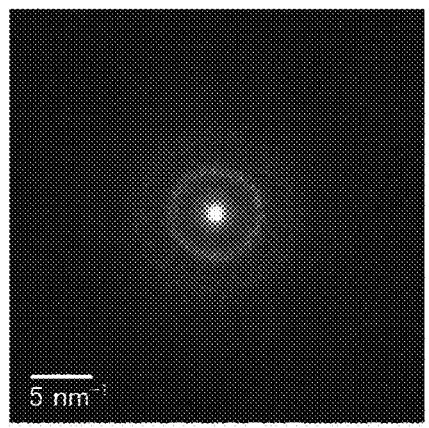
FIGS. 50A to 50D show electron diffraction patterns and a cross-sectional TEM image of an nc-OS.
Figure 50B:
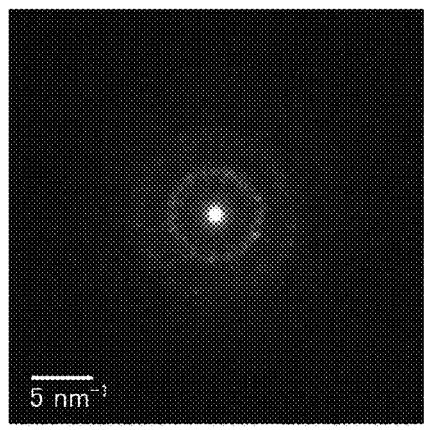

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 50A is observed. FIG. 50B shows a diffraction pattern obtained when an electron beam with a probe diameter of 1 nm is incident on the same sample. As shown in FIG. 50B, a plurality of spots are observed in a ring-like region. In other words, ordering in an nc-OS is not observed with an electron beam with a probe diameter of 50 nm but is observed with an electron beam with a probe diameter of 1 nm.

Figure 50C:
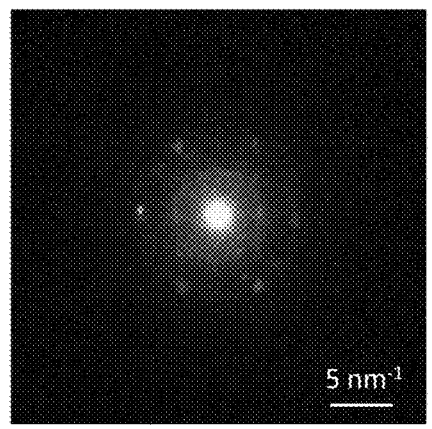

Furthermore, an electron diffraction pattern in which spots are arranged in an approximately hexagonal shape is observed in some cases as shown in FIG. 50C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 50D:
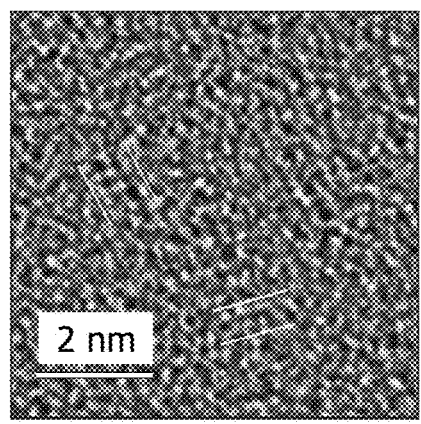

FIG. 50D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 50D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS has a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure intermediate between those of the nc-OS and the amorphous oxide semiconductor.

Figure 51A:
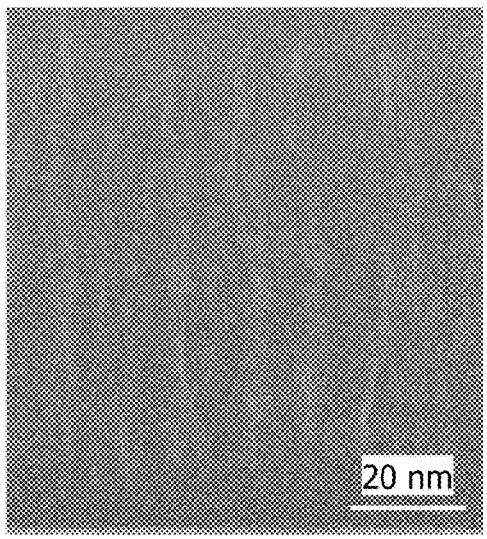
FIGS. 51A and 51B are cross-sectional TEM images of an a-like OS.
Figure 51B:
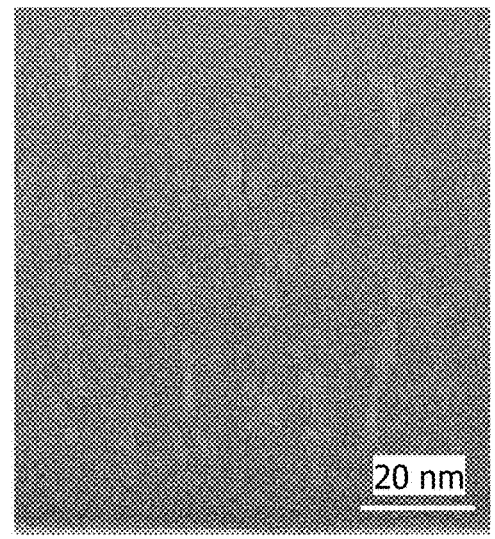

FIGS. 51A and 51B are high-resolution cross-sectional TEM images of an a-like OS. FIG. 51A is the high-resolution cross-sectional TEM image of the a-like OS at the start of the electron irradiation. FIG. 51B is the high-resolution cross-sectional TEM image of the a-like OS after the electron (e$^-$) irradiation at $4.3\times10^8$ e$^-$/nm$^2$. FIGS. 51A and 51B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 52:
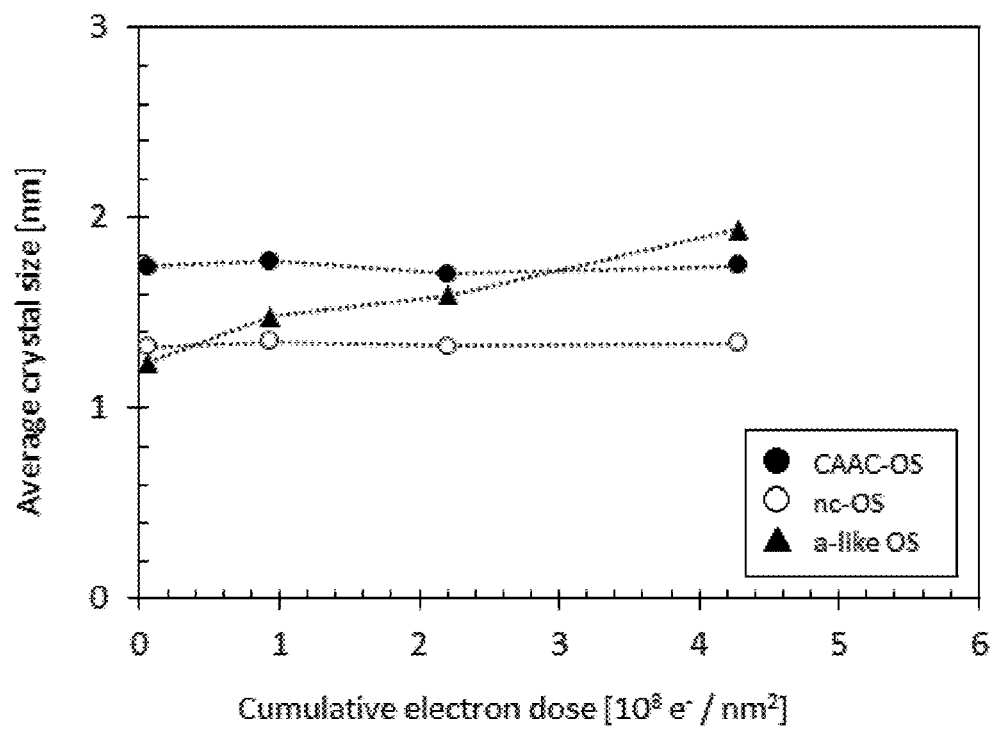
FIG. 52 shows a change of crystal parts of an In—Ga—Zn oxide due to electron irradiation.

FIG. 52 shows change in the average size of crystal parts (at 22 points to 30 points) in each sample. Note that the crystal part size corresponds to the length of a lattice fringe. FIG. 52 indicates that the crystal part size in the a-like OS increases with an increase in the cumulative electron dose in obtaining TEM images, for example. As shown in FIG. 52, a crystal part of approximately 1.2 nm (also referred to as an initial nucleus) at the start of TEM observation grows to a size of approximately 1.9 nm at a cumulative electron ($e^-$) dose of $4.2\times10^8$ $e^-/nm^2$. In contrast, the crystal part size in the nc-OS and the CAAC-OS shows little change from the start of electron irradiation to a cumulative electron dose of $4.2\times10^8$ $e^-/nm^2$. As shown in FIG. 52, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7\times10^5$ $e^-/(nm^2 \cdot s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

The structures described in this embodiment can be used in appropriate combination with any of the structures described in the other embodiments.

Embodiment 5

In this embodiment, examples of a package and a module each including an image sensor chip will be described. For the image sensor chip, the structure of an imaging device of one embodiment of the present invention can be used.

Figure 53A:
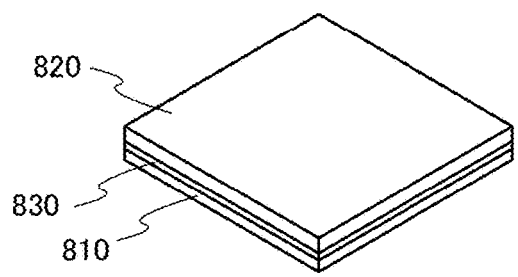
FIGS. 53A to 53D are perspective views and a cross-sectional view of a package including an imaging device.

FIG. 53A is an external perspective view showing the top surface side of a package including an image sensor chip. The package includes a package substrate 810 to which an image sensor chip 850 is fixed, a cover glass 820, an adhesive 830 for bonding the package substrate 810 and the cover glass 820 to each other, and the like.

Figure 53B:
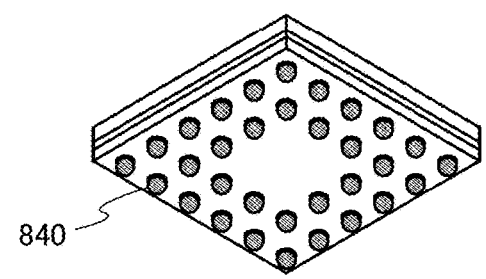

FIG. 53B is an external perspective view showing the bottom surface side of the package. On the bottom surface of the package, ball grid array (BGA) including solder balls as bumps 840 is formed. Although BGA is employed here, land grid array (LGA), pin grid array (PGA), or the like may be alternatively employed.

Figure 53C:
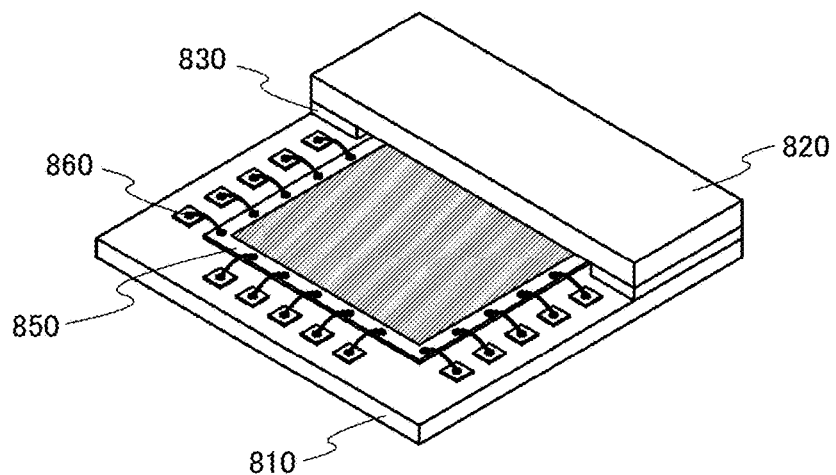
Figure 53D:
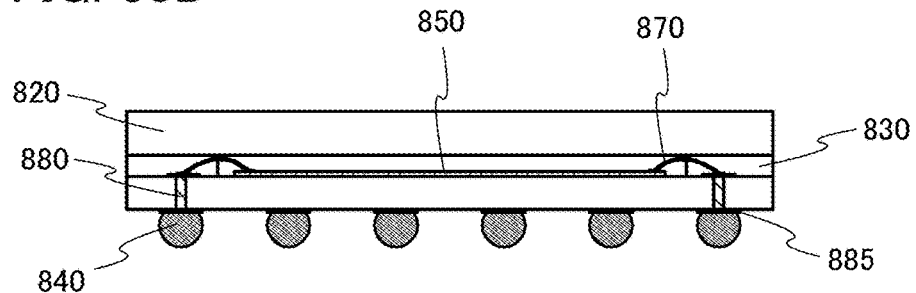

FIG. 53C is a perspective view of the package, in which the cover glass 820 and the adhesive 830 are partly illustrated. FIG. 53D is a cross-sectional view of the package. Electrode pads 860 are formed over the package substrate 810, and electrically connected to the bumps 840 through through-holes 880 and lands 885. The electrode pads 860 are electrically connected to electrodes of the image sensor chip 850 through wires 870.

Figure 54A:
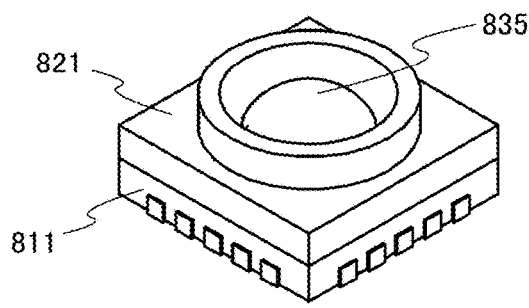
FIGS. 54A to 54D are perspective views and a cross-sectional view of a package including an imaging device.

FIG. 54A is an external perspective view showing the top surface side of a camera module in which an image sensor chip is mounted on a package with a built-in lens. The camera module includes a package substrate 811 to which an image sensor chip 851 is fixed, a lens cover 821, a lens 835, and the like. Furthermore, an IC chip 890 having functions of a driver circuit, a signal conversion circuit, and the like of an imaging device is provided between the package substrate 811 and the image sensor chip 851. Thus, the camera module is built as a system in package (SiP).

Figure 54B:
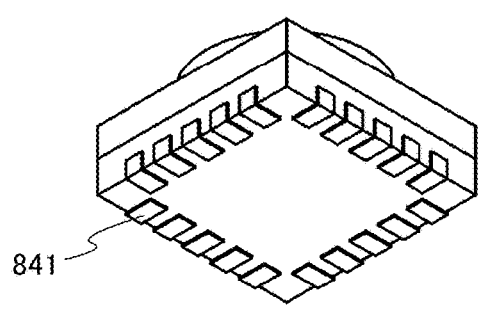

FIG. 54B is an external perspective view showing the bottom surface side of the camera module. On the bottom surface and four side surfaces of the package substrate 811, mounting lands 841 are provided; this structure can be called a quad flat no-lead package (QFN). Although QFN is employed here, quad flat package (QFP), the above BGA, or the like may be alternatively employed.

Figure 54C:
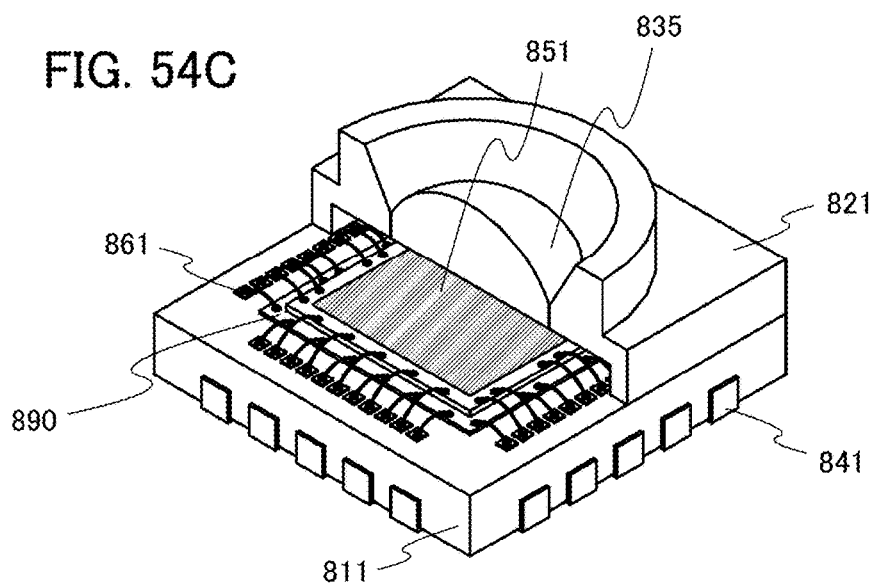
Figure 54D:
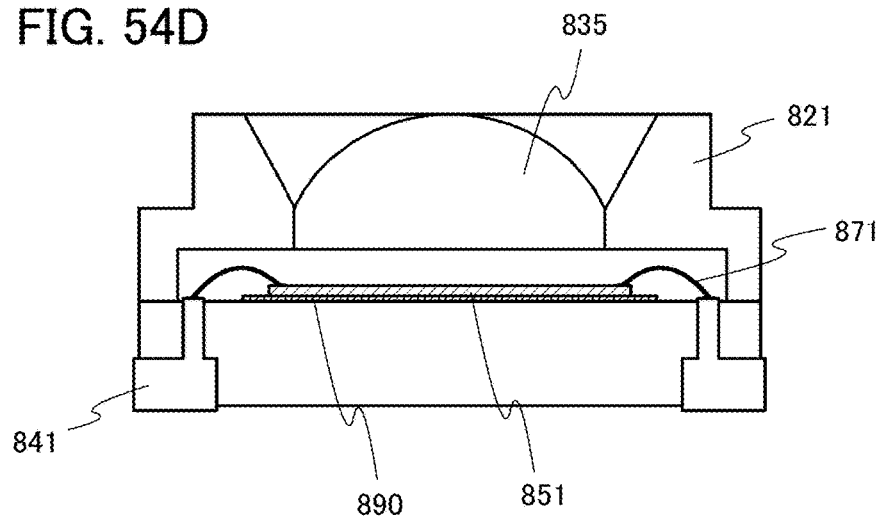

FIG. 54C is a perspective view of the module, in which the lens cover 821 and the lens 835 are partly illustrated. FIG. 54D is a cross-sectional view of the camera module. The lands 841 are partly used as the electrode pads 861. The electrode pads 861 are electrically connected to electrodes of the image sensor chip 851 and the IC chip 890 through wires 871.

The image sensor chip can be easily mounted on the package having the above structure, and can be incorporated into a variety of electronic devices.

The structures described in this embodiment can be used in appropriate combination with any of the structures described in the other embodiments.

Embodiment 6

An imaging device of one embodiment of the present invention can be used for display devices, personal computers, or image reproducing devices provided with recording media (typically, devices that reproduce the content of recording media such as digital versatile discs (DVDs) and have displays for displaying the reproduced images). Furthermore, as electronic devices that can include the imaging device of one embodiment of the present invention, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 55A to 55F illustrate specific examples of these electronic devices.

Figure 55A:
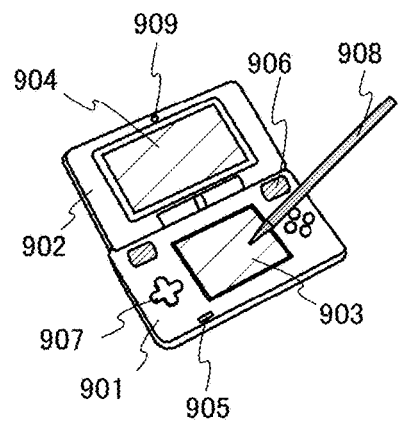
FIGS. 55A to 55F illustrate electronic devices.

FIG. 55A illustrates a portable game machine, which includes housings 901 and 902, display portions 903 and 904, a microphone 905, speakers 906, an operation key 907, a stylus 908, a camera 909, and the like. Although the portable game machine in FIG. 55A has the two display portions 903 and 904, the number of display portions included in the portable game machine is not limited to two. The imaging device of one embodiment of the present invention can be used for the camera 909.

Figure 55B:
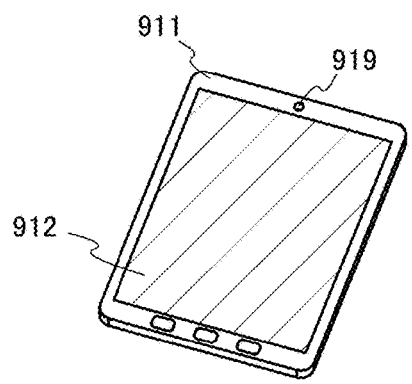

FIG. 55B illustrates a portable information terminal, which includes a first housing 911, a display portion 912, a camera 919, and the like. The touch panel function of the display portion 912 enables input and output of information. The imaging device of one embodiment of the present invention can be used for the camera 919.

Figure 55C:
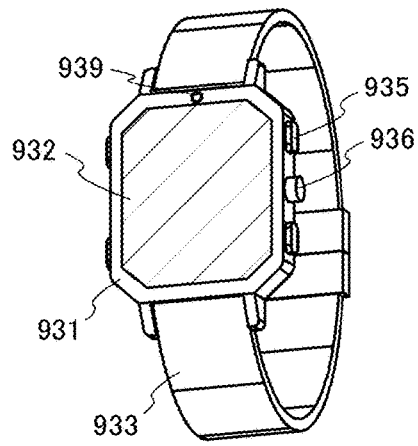

FIG. 55C illustrates a wrist-watch-type information terminal, which includes a housing 931, a display portion 932, a wristband 933, operation buttons 935, a winder 936, a camera 939, and the like. The display portion 932 may be a touch panel. The imaging device of one embodiment of the present invention can be used for the camera 939.

Figure 55D:
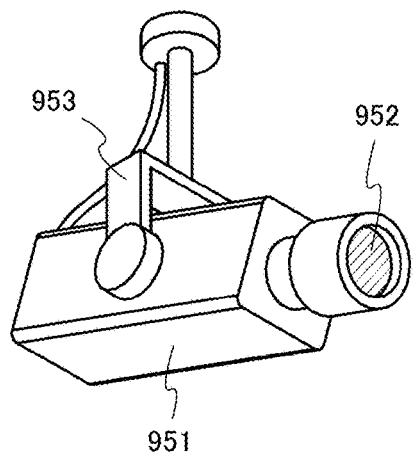

FIG. 55D illustrates a monitoring camera, which includes a housing 951, a lens 952, a support portion 953, and the like. The imaging device of one embodiment of the present invention can be provided in a focus position of the lens 952.

Figure 55E:
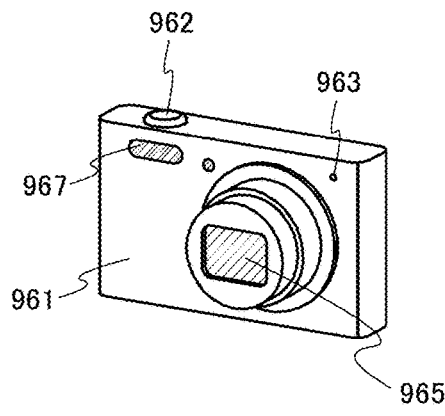

FIG. 55E illustrates a digital camera, which includes a housing 961, a shutter button 962, a microphone 963, a light-emitting portion 967, a lens 965, and the like. The imaging device of one embodiment of the present invention can be provided in a focus position of the lens 965.

Figure 55F:
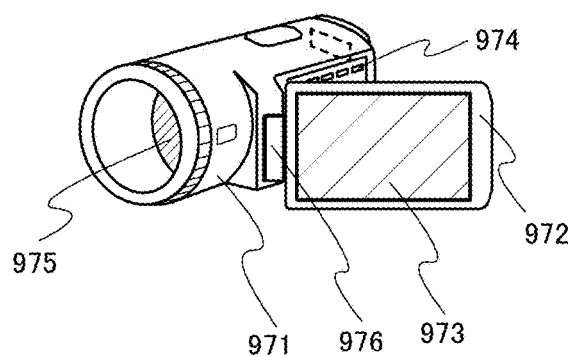

FIG. 55F illustrates a video camera, which includes a first housing 971, a second housing 972, a display portion 973, operation keys 974, a lens 975, a joint 976, and the like. The operation keys 974 and the lens 975 are provided for the first housing 971, and the display portion 973 is provided for the second housing 972. The first housing 971 and the second housing 972 are connected to each other with the joint 976, and an angle between the first housing 971 and the second housing 972 can be changed with the joint 976. Images displayed on the display portion 973 may be switched in accordance with the angle between the first housing 971 and the second housing 972 at the joint 976. The imaging device of one embodiment of the present invention can be provided in a focus position of the lens 975.

This embodiment can be combined with any of the other embodiments in this specification as appropriate.

This application is based on Japanese Patent Application serial no. 2015-096202 filed with Japan Patent Office on May 11, 2015, the entire contents of which are hereby incorporated by reference.

What is claimed is:

1. An imaging device comprising: a plurality of pixels arranged in a matrix; an A/D (Analog to Digital) converter circuit; and a selector circuit, wherein the selector circuit is configured to select one of a first signal of a first input terminal of the selector circuit and a second signal of a second input terminal of the selector circuit, wherein the pixels are electrically connected to an input terminal of the A/D converter circuit, wherein an output terminal of the A/D converter circuit is electrically connected to one of a source electrode and a drain electrode of a transistor, wherein the other of the source electrode and the drain electrode of the transistor is electrically connected to the first input terminal of the selector circuit, and wherein the transistor includes an oxide semiconductor in an active layer.

2. The imaging device according to claim 1, further comprising a buffer circuit,
wherein the output terminal of the A/D converter circuit is electrically connected to an input terminal of the buffer circuit, and
wherein an output terminal of the buffer circuit is electrically connected to the one of the source electrode and the drain electrode of the transistor.

3. The imaging device according to claim 1,
wherein the oxide semiconductor contains In, Zn, and M, and
wherein M is Al, Ti, Ga, Sn, Y, Zr, La, Ce, Nd, or Hf.

4. An imaging device comprising: a plurality of pixels arranged in a matrix; a first A/D (Analog to Digital) converter circuit; a second A/D converter circuit; and a selector circuit, wherein the selector circuit is configured to select one of a first signal of a first input terminal of the selector circuit and a second signal of a second input terminal of the selector circuit, wherein the pixels arranged in odd-numbered columns are electrically connected to an input terminal of the first A/D converter circuit, wherein the pixels arranged in even-numbered columns are electrically connected to an input terminal of the second A/D converter circuit, wherein an output terminal of the first A/D converter circuit is electrically connected to one of a source electrode and a drain electrode of a first transistor, wherein an output terminal of the second A/D converter circuit is electrically connected to one of a source electrode and a drain electrode of a second transistor, wherein the other of the source electrode and the drain electrode of the first transistor is electrically connected to the first input terminal of the selector circuit, wherein the other of the source electrode and the drain electrode of the second transistor is electrically connected to the second input terminal of the selector circuit, and wherein the first transistor and the second transistor each include an oxide semiconductor in an active layer.

5. The imaging device according to claim 1,
wherein the selector circuit is a multiplexer.

6. The imaging device according to claim 1,
wherein each of the plurality of pixels comprises:

a third transistor;
a fourth transistor;
a fifth transistor;
a sixth transistor;
a capacitor; and
a photoelectric conversion element,
wherein one of electrodes of the photoelectric conversion element is electrically connected to one of a source electrode and a drain electrode of the third transistor,
wherein the other of the source electrode and the drain electrode of the third transistor is electrically connected to one of a source electrode and a drain electrode of the fourth transistor,
wherein the other of the source electrode and the drain electrode of the third transistor is electrically connected to one of electrodes of the capacitor,
wherein the other of the source electrode and the drain electrode of the third transistor is electrically connected to a gate electrode of the fifth transistor, and
wherein one of a source electrode and a drain electrode of the fifth transistor is electrically connected to one of a source electrode and a drain electrode of the sixth transistor.

7. The imaging device according to claim 6,
wherein the third transistor, the fourth transistor, the fifth transistor, and the sixth transistor each include an oxide semiconductor in an active layer,
wherein the oxide semiconductor contains In, Zn, and M, and
wherein M is Al, Ti, Ga, Sn, Y, Zr, La, Ce, Nd, or Hf.

8. The imaging device according to claim 6,
wherein the photoelectric conversion element includes selenium or a compound containing selenium in a photoelectric conversion layer.

9. An electronic device comprising:
the imaging device according to claim 1; and
a display device.

10. The imaging device according to claim 1,
wherein the transistor is in an off-state when the first signal is selected at the selector circuit.

11. The imaging device according to claim 4,
wherein the oxide semiconductor contains In, Zn, and M, and
wherein M is Al, Ti, Ga, Sn, Y, Zr, La, Ce, Nd, or Hf.

12. The imaging device according to claim 4, further comprising:
a first buffer circuit; and
a second buffer circuit,
wherein the output terminal of the first A/D converter circuit is electrically connected to an input terminal of the first buffer circuit,
wherein an output terminal of the first buffer circuit is electrically connected to the one of the source electrode and the drain electrode of the first transistor,
wherein the output terminal of the second A/D converter circuit is electrically connected to an input terminal of the second buffer circuit, and
wherein an output terminal of the second buffer circuit is electrically connected to the one of the source electrode and the drain electrode of the second transistor.

13. The imaging device according to claim 4,
wherein the selector circuit alternately outputs the first signal and the second signal.

14. The imaging device according to claim 4,
wherein the selector circuit is a multiplexer.

15. The imaging device according to claim 4,
wherein each of the plurality of pixels comprises:
a third transistor;
a fourth transistor;
a fifth transistor;
a sixth transistor;
a capacitor; and
a photoelectric conversion element,
wherein one of electrodes of the photoelectric conversion element is electrically connected to one of a source electrode and a drain electrode of the third transistor,
wherein the other of the source electrode and the drain electrode of the third transistor is electrically connected to one of a source electrode and a drain electrode of the fourth transistor,
wherein the other of the source electrode and the drain electrode of the third transistor is electrically connected to one of electrodes of the capacitor,
wherein the other of the source electrode and the drain electrode of the third transistor is electrically connected to a gate electrode of the fifth transistor, and
wherein one of a source electrode and a drain electrode of the fifth transistor is electrically connected to one of a source electrode and a drain electrode of the sixth transistor.

16. The imaging device according to claim 15,
wherein the third transistor, the fourth transistor, the fifth transistor, and the sixth transistor each include an oxide semiconductor in an active layer,
wherein the oxide semiconductor contains In, Zn, and M, and
wherein M is Al, Ti, Ga, Sn, Y, Zr, La, Ce, Nd, or Hf.

17. The imaging device according to claim 15,
wherein the photoelectric conversion element includes selenium or a compound containing selenium in a photoelectric conversion layer.

18. An electronic device comprising:
the imaging device according to claim 4; and
a display device.

19. The imaging device according to claim 4,
wherein, when the first signal is selected at the selector circuit, the first transistor is in an off-state and the second transistor is in an on-state.

* * * * *